United States Patent
Miyata et al.

(10) Patent No.: US 11,513,439 B2
(45) Date of Patent: Nov. 29, 2022

(54) COMPOSITION, FILM, NEAR INFRARED CUT FILTER, SOLID-STATE IMAGING ELEMENT, IMAGE DISPLAY DEVICE, AND INFRARED SENSOR

(71) Applicant: FUJIFILM Corporation, Tokyo (JP)

(72) Inventors: Tetsushi Miyata, Haibara-gun (JP); Takuya Tsuruta, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 170 days.

(21) Appl. No.: 16/908,886

(22) Filed: Jun. 23, 2020

(65) Prior Publication Data
US 2020/0319548 A1 Oct. 8, 2020

Related U.S. Application Data

(63) Continuation of application No. PCT/JP2018/046943, filed on Dec. 20, 2018.

(30) Foreign Application Priority Data

Feb. 6, 2018 (JP) .............................. JP2018-019248
Sep. 14, 2018 (JP) .............................. JP2018-172356

(51) Int. Cl.
*G03F 7/00* (2006.01)
*C09B 57/00* (2006.01)
(Continued)

(52) U.S. Cl.
CPC ............ *G03F 7/0007* (2013.01); *C09B 57/00* (2013.01); *C09B 57/007* (2013.01); *G02B 5/208* (2013.01);
(Continued)

(58) Field of Classification Search
CPC ........ G03F 7/0007; G03F 7/031; G03F 7/033; C09B 57/00; C09B 57/007
See application file for complete search history.

(56) References Cited

U.S. PATENT DOCUMENTS

| | | | |
|---|---|---|---|
| 2017/0174869 A1* | 6/2017 | Arayama | ............... C09B 69/001 |
| 2017/0190923 A1* | 7/2017 | Tsuruta | ................. C09B 57/004 |
| 2018/0319989 A1* | 11/2018 | Haraguchi | ............ C09B 57/007 |
| 2019/0018174 A1 | 1/2019 | Ito et al. | |

FOREIGN PATENT DOCUMENTS

| | | | |
|---|---|---|---|
| JP | 2006-343631 A | 12/2006 | |
| JP | 2007-169315 A | 7/2007 | |

(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2018/046943, dated Aug. 20, 2020, with English translation of the Written Opinion.

(Continued)

*Primary Examiner* — Stewart A Fraser
(74) *Attorney, Agent, or Firm* — Birch, Stewart, Kolasch & Birch, LLP

(57) ABSTRACT

A composition includes a near infrared absorbing pigment and a solvent, in which the near infrared absorbing pigment is at least one selected from a colorant compound which has a cation and an anion in the same molecule, a colorant compound which is a salt of a cationic chromophore and a counter anion, and a colorant compound which is a salt of an anionic chromophore and a counter cation, a D50 particle size in which a cumulative volume in a particle size distribution of particle sizes of the near infrared absorbing pigment is 50% is 100 nm or lower, and d values of Hansen solubility parameters of the near infrared absorbing pigment and the solvent satisfy a predetermined expression.

19 Claims, 1 Drawing Sheet

(51) Int. Cl.
*G03F 7/031* (2006.01)
*G03F 7/033* (2006.01)
*G02B 5/20* (2006.01)
*H01L 27/146* (2006.01)

(52) U.S. Cl.
CPC .............. *G03F 7/031* (2013.01); *G03F 7/033* (2013.01); *H01L 27/14621* (2013.01)

(56) References Cited

FOREIGN PATENT DOCUMENTS

| | | |
|---|---|---|
| JP | 2017-198816 A | 11/2017 |
| JP | 2018-87939 A | 6/2018 |
| WO | WO 2017/159479 A1 | 9/2017 |

OTHER PUBLICATIONS

International Search Report (Form PCT/ISA/210) for International Application No. PCT/JP2018/046943, dated Mar. 12, 2019, with English translation.
Japanese Notice of Reasons for Refusal for corresponding Japanese Application No. 2019-570325, dated Jun. 15, 2021, with an English translation.
Taiwanese Office Action and Search Report for corresponding Taiwanese Application No. 107147606, dated Sep. 7, 2022, including an English translation of Taiwanese Office Action.

* cited by examiner

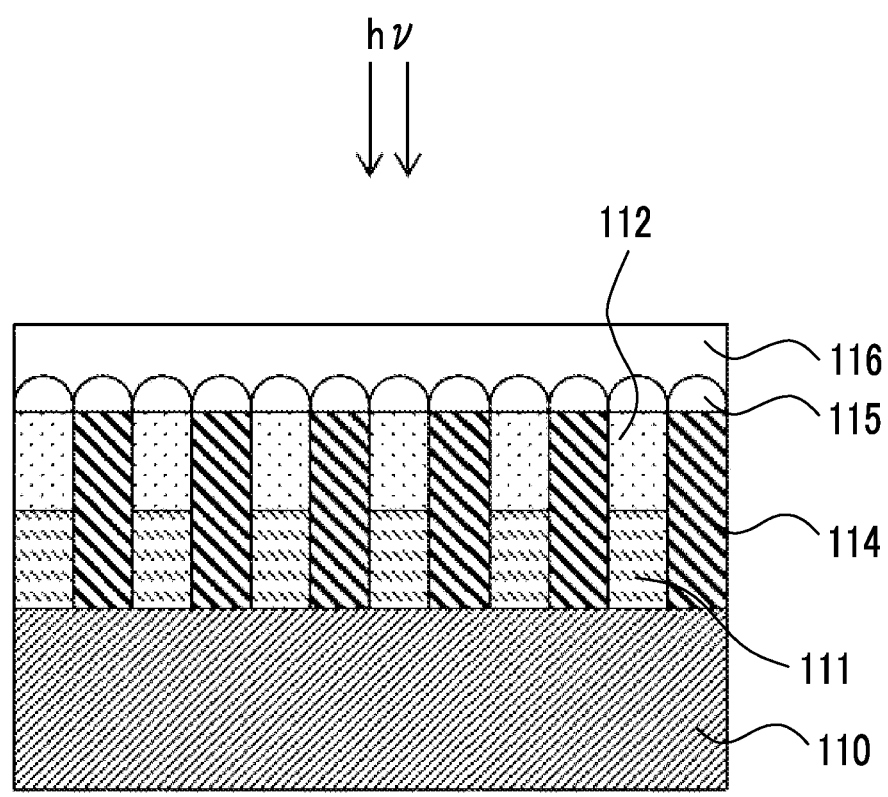

COMPOSITION, FILM, NEAR INFRARED CUT FILTER, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2018/046943 filed on Dec. 20, 2018, which claims priority under 35 U.S.C § 119(a) to Japanese Patent Application No. 2018-019248 filed on Feb. 6, 2018, and Japanese Patent Application No. 2018-172356 filed on Sep. 14, 2018. Each of the above application(s) is hereby expressly incorporated by reference, in its entirety, into the present application.

BACKGROUND OF THE INVENTION

1. Field of the Invention

The present invention relates to a composition including a near infrared absorbing pigment. The present invention also relates to a film formed of the composition including a near infrared absorbing pigment, a near infrared cut filter, a solid-state imaging element, an image display device, and an infrared sensor.

2. Description of the Related Art

It is considered to form a near infrared cut filter by using a composition including a near infrared absorbing pigment. For example, JP2006-343631A describes a near infrared cut filter formed by using a composition including a transparent resin and oxytitanyl phthalocyanine.

SUMMARY OF THE INVENTION

The near infrared cut filter is desired to have excellent visible transparency. Therefore, in order to improve visible transparency of the near infrared cut filter, the near infrared absorbing pigment may be used after being refined.

As a study of a near infrared absorbing pigment, the present inventor has found that, in a case where the near infrared absorbing pigment is refined, dispersion stability of the near infrared absorbing pigment in a composition is likely to decrease and the viscosity of the composition is likely to decrease over time. In addition, the present inventor has found that, in a case of storing the composition, foreign matters derived from the near infrared absorbing pigment is easily generated in the solution and foreign matter defects are generated in the obtained film.

Therefore, an object of the present invention is to provide a composition which has excellent dispersion stability of a near infrared absorbing pigment and is capable of forming a film in which foreign matter defects are suppressed. In addition, another object of the present invention is to provide a film formed of the above-described composition, a near infrared cut filter, a solid-state imaging element, an image display device, and an infrared sensor.

As a study of a composition including a near infrared absorbing pigment and a solvent by the present inventor, the reason that dispersion stability of the near infrared absorbing pigment in the composition is decreased and foreign matters derived from the near infrared absorbing pigment is generated is considered to be as follows. In order to improve visible transparency of a film formed using a composition including the near infrared absorbing pigment, the near infrared absorbing pigment is usually used after being refined. However, it is considered that the above-described problems caused by refining the near infrared absorbing pigment is derived from that the near infrared absorbing pigment is easily dissolved in a solvent, and as a result, in a case of storing the composition, the near infrared absorbing pigment barely dissolved in the solvent is reprecipitated and a crystal grows. Here, it is considered that, in a case where the dissolution of a near infrared absorbing pigment is suppressed, it is possible to provide a composition which has excellent dispersion stability of the near infrared absorbing pigment and is capable of forming a film in which foreign matter defects are suppressed. As a result of various studies, the present inventor has found that the above-described object can be achieved by selecting a combination of materials in which the difference between the d value of Hansen solubility parameter of a near infrared absorbing pigment and the d value of Hansen solubility parameter of a solvent is a predetermined value or more, so that the near infrared absorbing pigment is hardly dissolved in the solvent even in a case of being refined, and completed the present invention. Here, the Hansen solubility parameter is composed of three parameters: d value which is a dispersion element, p value which is a polarization element, and h value which is a hydrogen bond element, but among these, it is found that only the d value specifically affects the phase separation. The detailed reason why only the d value specifically affects the phase separation is unclear, but it is assumed that, in a film which cannot be ionized, the influence of the dispersion element (d value) is relatively maximum. The present invention provides the following.

<1> A composition comprising:
a near infrared absorbing pigment; and
a solvent,
in which the near infrared absorbing pigment is at least one selected from a colorant compound which has a cation and an anion in the same molecule, a colorant compound which is a salt of a cationic chromophore and a counter anion, and a colorant compound which is a salt of an anionic chromophore and a counter cation,
a D50 particle size in which a cumulative volume in a particle size distribution of particle sizes of the near infrared absorbing pigment is 50% is 100 nm or lower,
the near infrared absorbing pigment and the solvent satisfy the following expression (1), $$|d1-d2| \geq 0.3 \text{ MPa}^{0.5} \tag{1}$$

d1 is a d value of a Hansen solubility parameter of the near infrared absorbing pigment,
d2 is a d value of a Hansen solubility parameter of the solvent included in the composition, and
in a case where the composition includes two or more kinds of solvents, d2 is a mass-average value of d values of Hansen solubility parameters of the two or more kinds of solvents.

<2> The composition according to <1>,
in which the near infrared absorbing pigment is at least one selected from a squarylium compound, a cyanine compound, a croconium compound, and an iminium compound.

<3> The composition according to <1> or <2>,
in which the near infrared absorbing pigment satisfies the following expression (D1), $$D90 \text{ particle size}/D50 \text{ particle size} \leq 4.0 \tag{D1}$$

a D90 particle size is a particle size in which a cumulative volume in the particle size distribution of the particle sizes of the near infrared absorbing pigment is 90%, and the D50 particle size is a particle size in which a cumulative volume in the particle size distribution of the particle sizes of the near infrared absorbing pigment is 50%.

<4> The composition according to any one of <1> to <3>, in which the near infrared absorbing pigment has a maximum absorption wavelength in a range of 700 to 1800 nm.

<5> The composition according to any one of <1> to <4>, further comprising: a resin.

<6> The composition according to <5>, further comprising:
a dispersion aid.

<7> The composition according to <6>,
in which the near infrared absorbing pigment includes an aromatic ring, and
the dispersion aid has an aromatic ring of the same structure as the aromatic ring included in the near infrared absorbing pigment.

<8> The composition according to <6> or <7>,
in which an absolute value of a difference between a maximum absorption wavelength of the dispersion aid and a maximum absorption wavelength of the near infrared absorbing pigment is greater than 200 nm.

<9> The composition according to any one of <6> to <8>,
in which the near infrared absorbing pigment is a squarylium compound having a partial structure represented by Formula (S1), and the dispersion aid is a compound including a structural moiety which is included in a group bonding to *1 position of Formula (S1) or a group bonding to *2 position of Formula (S1) and which is conjugated with the partial structure represented by Formula (S1) of the squarylium compound as the near infrared absorbing pigment, or the near infrared absorbing pigment is a croconium compound having a partial structure represented by Formula (C1), and the dispersion aid is a compound including a structural moiety which is included in a group bonding to *3 position of Formula (C1) or a group bonding to *4 position of Formula (C1) and which is conjugated with the partial structure represented by Formula (C1) of the croconium compound as the near infrared absorbing pigment,

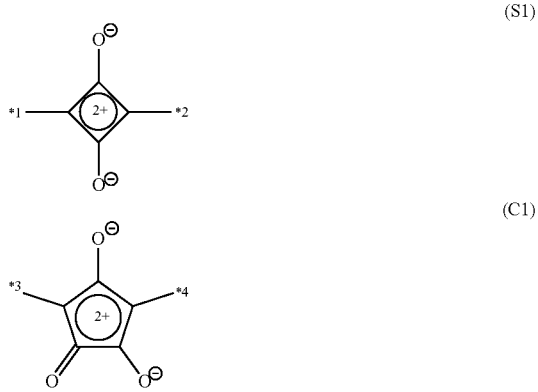

in the formulae, *1 to *4 respectively represent a direct bond.

<10> The composition according to <9>,
in which the near infrared absorbing pigment is the squarylium compound having the partial structure represented by Formula (S1), at least one of the group bonding to *1 position of Formula (S1) or the group bonding to *2 position of Formula (S1) includes a structure in which two or more rings are fused, and the dispersion aid is a compound including the structure of the near infrared absorbing pigment in which two or more rings are fused, or the near infrared absorbing pigment is the croconium compound having the partial structure represented by Formula (C1), at least one of the group bonding to *3 position of Formula (C1) or the group bonding to *4 position of Formula (C1) includes a structure in which two or more rings are fused, and the dispersion aid is a compound including the structure of the near infrared absorbing pigment in which two or more rings are fused.

<11> The composition according to <10>,
in which the structure in which two or more rings are fused is a fused ring including one or more of at least one ring selected from a benzene ring, an imidazole ring, an oxazole ring, a thiazole ring, a pyridine ring, and a pyrazine ring.

<12> The composition according to <10>,
in which the structure in which two or more rings are fused is a fused ring including an indolenine ring, a fluorene ring, or a carbazole ring.

<13> The composition according to any one of <1> to <12>, further comprising:
a polymerizable monomer.

<14> The composition according to <12>,
in which the polymerizable monomer includes a compound which has three or more groups having an ethylenically unsaturated bond.

<15> A film obtained from the composition according to any one of <1> to <14>.

<16> A near infrared cut filter comprising:
the film according to <15>.

<17> A solid-state imaging element comprising:
the film according to <15>.

<18> An image display device comprising:
the film according to <15>.

<19> An infrared sensor comprising:
the film according to <15>.

According to the present invention, it is possible to provide a composition which has excellent dispersion stability of a near infrared absorbing pigment and is capable of forming a film in which foreign matter defects are suppressed. In addition, according to the present invention, it is possible to provide a film formed of the above-described composition, a near infrared cut filter, a solid-state imaging element, an image display device, and an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, a weight-average molecular weight and a number-average molecular weight are defined as values in terms of polystyrene measured by gel permeation chromatography (GPC).

In the present specification, in a chemical formula, Me represents a methyl group, Et represents an ethyl group, Bu represents a butyl group, and Ph represents a phenyl group.

In the present specification, near infrared light denotes light (electromagnetic wave) having a wavelength in a range of 700 to 2500 nm.

In the present specification, a total solid content denotes the total mass of all the components of the composition excluding a solvent.

In the present specification, the term "step" denotes not only an individual step but also a step which is not clearly distinguishable from another step as long as an effect expected from the step can be achieved.

<Composition>

The composition according to the embodiment of the present invention has a feature of a composition including a near infrared absorbing pigment and a solvent, in which the near infrared absorbing pigment is at least one selected from a colorant compound which has a cation and an anion in the same molecule, a colorant compound which is a salt of a cationic chromophore and a counter anion, and a colorant compound which is a salt of an anionic chromophore and a counter cation, a D50 particle size in which a cumulative volume in a particle size distribution of particle sizes of the near infrared absorbing pigment is 50% is 100 nm or lower, the near infrared absorbing pigment and the solvent satisfy the following expression (1).

$$|d1-d2| \geq 0.3 \text{ MPa}^{0.5} \quad (1)$$

d1 is a d value of a Hansen solubility parameter of the near infrared absorbing pigment, d2 is a d value of a Hansen solubility parameter of the solvent included in the composition, and in a case where the composition includes two or more kinds of solvents, d2 is a mass-average value of d values of Hansen solubility parameters of the two or more kinds of solvents.

Since the composition according to the embodiment of the present invention includes a near infrared absorbing pigment having a D50 particle size of 100 nm or lower, the composition according to the embodiment of the present invention can form a film having excellent visible transparency and excellent near infrared shielding properties. In addition, compositions in the related art, which include a refined near infrared absorbing pigment, are insufficient in dispersion stability and foreign matter defects are likely to generate in the obtained film. However, in the composition according to the embodiment of the present invention, since the near infrared absorbing pigment is at least one selected from a colorant compound which has a cation and an anion in the same molecule, a colorant compound which is a salt of a cationic chromophore and a counter anion, and a colorant compound which is a salt of an anionic chromophore and a counter cation and the near infrared absorbing pigment and the solvent satisfy the above expression (1), it is assumed that the dissolution of the near infrared absorbing pigment in the solvent can be effectively suppressed and the crystal growth accompanying the reprecipitation of the near infrared absorbing pigment can be suppressed. As a result, dispersion stability of the near infrared absorbing pigment in the composition can be improved and a film in which foreign matter defects are suppressed can be formed.

In the composition according to the embodiment of the present invention, the value of $|d1-d2|$ in the expression (1) is preferably 0.3 MPa$^{0.5}$ or more, more preferably 1.0 MPa$^{0.5}$ or more, still more preferably 2.0 MPa$^{0.5}$ or more, and particularly preferably 3.0 MPa$^{0.5}$ or more. In addition, from the viewpoint of compatibility between other components included in the composition and the solvent, the value of $|d1-d2|$ in the expression (1) is preferably 10 MPa$^{0.5}$ or less, more preferably 8 MPa$^{0.5}$ or less, and still more preferably 6 MPa$^{0.5}$ or less.

Here, d1 in the expression (1) represents the d value of the Hansen solubility parameter of the near infrared absorbing pigment. In a case where the composition according to the embodiment of the present invention includes two or more kinds of the near infrared absorbing pigments, d1 in (1) is the d value of the Hansen solubility parameter of each near infrared absorbing pigment. Therefore, in a case where the composition according to the embodiment of the present invention includes two or more kinds of the near infrared absorbing pigments, it is required that the d value of the Hansen solubility parameter of each near infrared absorbing pigment and the d value (in a case where the composition includes two or more kinds of solvents, a mass-average value of d values of Hansen solubility parameters of the two or more kinds of solvents) of the Hansen solubility parameter of the solvent included in the composition satisfy the above expression (1).

In addition, d2 in the expression (1) is the d value of the Hansen solubility parameter of the solvent included in the composition, and in a case where the composition includes two or more kinds of solvents, d2 is the mass-average value of d values of Hansen solubility parameters of the two or more kinds of solvents. Here, the mass-average value of d values of Hansen solubility parameters of the two or more kinds of solvents means the following.

$$d_{ave} = \sum_{i=1}^{n} (Mi \times di)$$

$d_{ave}$ is the mass-average value of d values of Hansen solubility parameters of the two or more kinds of solvents, n is an integer of 2 or more, Mi is a mass ratio (mass of solvent i/total mass of solvents) of a solvent i in the total amount of solvents included in the composition, and di is a d value of a Hansen solubility parameter of the solvent i.

In the present specification, d values, p values, and h values of Hansen solubility parameter are values calculated by a software of Hansen Solubility Parameter in Practice (HSPiP) ver. 4.1.0.7. Here, in a case where the calculation is not possible due to the software, values calculated based on Table 2 in paper "Hansen Solubility Parameters 50th anniversary conference, preprint PP. 1 to 13, (2017), Hiroshi Yamamoto, Steven Abbott, Charles M. Hansen" published in yamamoto preprint Part 1 of a homepage "https://pirika.com/index-j.html" (https://pirika.com/HSP/HSP-J/HSPSO/Preprint-Part1%20Yamamoto.pdf) can be used. Table 2 described in the above-mentioned paper is as follows.

TABLE 1

Table 2 The coefficient list of standard Functional Groups

| Label | dD | dDfg | dP | dH | CosVol | MW |
|---|---|---|---|---|---|---|
| CH3 | 12.9 | 7.5 | 0.7 | 0.1 | 28.85 | 15.034 |
| CH2 | 16.4 | 14.3 | 1.5 | 0.9 | 22.05 | 14.026 |
| CH2_R | 17.0 | 13.7 | 1.7 | 1.9 | 21.65 | 14.026 |
| CH2 | 11.0 | 0.0 | 3.2 | 4.2 | 26.50 | 14.026 |
| CH | 21.2 | 21.6 | 0.1 | 0.0 | 14.67 | 13.018 |
| CH_R | 19.1 | 18.0 | 0.0 | 0.0 | 14.57 | 13.018 |
| CH | 19.0 | 16.8 | 0.1 | 0.1 | 18.26 | 13.018 |
| CH:_R | 17.3 | 14.0 | 2.3 | 5.3 | 17.95 | 13.018 |
| CH:_reso | 18.3 | 14.9 | 0.1 | 4.8 | 17.84 | 13.018 |
| #CH | 14.2 | 9.2 | 3.6 | 4.1 | 24.50 | 13.018 |
| C | 33.3 | 37.2 | 0.1 | 5.3 | 5.48 | 12.01 |
| C_R | 31.7 | 32.5 | 0.1 | 0.0 | 6.58 | 12.01 |
| C | 26.0 | 26.6 | 0.0 | 0.0 | 10.42 | 12.01 |
| C:_R | 25.4 | 25.3 | 0.1 | 4.7 | 10.64 | 12.01 |
| C: reso | 24.5 | 24.0 | 1.0 | 0.1 | 10.12 | 12.01 |
| C:_rrr | 25.3 | 24.1 | 0.1 | 1.1 | 10.92 | 12.01 |
| #C | 19.6 | 16.7 | 7.7 | 6.6 | 14.87 | 12.01 |
| OH | 18.4 | 11.3 | 16.6 | 36.6 | 18.05 | 17.008 |
| 2_OH | 18.6 | 12.6 | 15.0 | 32.2 | 18.29 | 17.008 |
| 3_OH | 19.8 | 15.7 | 12.4 | 25.3 | 18.58 | 17.008 |
| OH#Ar | 17.3 | 10.7 | 13.5 | 28.8 | 18.84 | 17.008 |
| O | 17.8 | 12.1 | 12.2 | 10.9 | 11.97 | 16 |
| O_R | 18.0 | 11.7 | 13.1 | 12.4 | 12.06 | 16 |
| O#Ar | 22.0 | 18.0 | 16.1 | 16.7 | 11.30 | 16 |
| C:O | 20.6 | 17.4 | 14.0 | 9.6 | 25.69 | 28.01 |
| C:O_R | 22.4 | 18.9 | 15.1 | 8.9 | 26.16 | 28.01 |
| C:O#Ar | 23.3 | 19.9 | 16.8 | 7.7 | 25.54 | 28.01 |
| HCO | 17.1 | 12.4 | 14.5 | 10.4 | 34.57 | 29.018 |
| CHO#Ar | 18.2 | 14.0 | 18.4 | 12.4 | 33.72 | 29.018 |
| COOH | 17.9 | 13.2 | 11.8 | 22.1 | 44.37 | 45.018 |
| COOH#A | 19.4 | 15.1 | 11.4 | 19.4 | 43.99 | 45.018 |
| COO | 19.0 | 15.2 | 8.1 | 10.8 | 37.02 | 44.01 |
| COO_R | 19.3 | 14.2 | 25.9 | 11.6 | 38.47 | 44.01 |
| COO#Ar | 17.6 | 14.3 | 13.6 | 6.3 | 37.69 | 44.01 |
| NH2 | 17.7 | 12.1 | 10.2 | 17.1 | 22.95 | 16.026 |
| NH2#A | 20.6 | 16.2 | 13.7 | 24.2 | 22.30 | 16.026 |
| NH | 20.7 | 17.8 | 9.7 | 14.9 | 16.53 | 15.018 |
| NH_R | 19.0 | 15.5 | 14.1 | 18.3 | 16.41 | 15.018 |
| NH#Ar | 30.7 | 28.7 | 16.6 | 23.6 | 15.08 | 15.018 |
| N | 25.2 | 24.7 | 9.3 | 11.9 | 10.27 | 14.01 |
| N_R | 25.0 | 22.2 | 7.5 | 19.5 | 9.26 | 14.01 |
| N#Ar | 30.3 | 31.3 | 0.0 | 16.4 | 12.07 | 14.01 |
| C#N | 17.0 | 12.5 | 21.8 | 9.6 | 34.12 | 26.02 |
| C#N#Ar | 18.9 | 14.8 | 20.8 | 4.4 | 34.00 | 26.02 |
| NO2 | 17.9 | 12.4 | 20.6 | 6.9 | 40.26 | 46.01 |
| NO2#Ar | 19.3 | 14.0 | 15.7 | 7.6 | 38.78 | 46.01 |
| SH | 19.1 | 15.0 | 9.0 | 9.7 | 36.40 | 33.078 |
| SH#Ar | 22.6 | 19.0 | 3.1 | 9.1 | 37.17 | 33.078 |
| S | 23.4 | 20.6 | 7.0 | 6.9 | 28.33 | 32.07 |
| S:R | 23.1 | 19.2 | 11.4 | 11.6 | 28.15 | 32.07 |
| S#Ar | 27.2 | 24.9 | 9.7 | 0.0 | 28.20 | 32.07 |
| S:O | 23.8 | 20.5 | 21.0 | 9.4 | 38.82 | 48.07 |
| NHCO | 21.3 | 17.2 | 23.1 | 17.5 | 42.13 | 43.028 |
| NHCO_R | 23.7 | 20.6 | 24.0 | 13.1 | 42.67 | 43.028 |
| NCO | 24.4 | 21.8 | 22.3 | 13.6 | 34.89 | 42.02 |
| NCO_R | 22.6 | 19.7 | 19.2 | 12.5 | 36.30 | 42.02 |
| OCOO | 17.6 | 13.5 | 10.9 | 9.6 | 47.85 | 60.01 |
| OCOO_R | 19.5 | 14.5 | 29.0 | 10.3 | 50.20 | 60.01 |
| CF3 | 10.7 | 0.0 | 1.8 | 0.0 | 52.73 | 89.01 |
| CCl3 | 17.9 | 13.2 | 0.0 | 0.0 | 94.36 | 118.36 |
| CF2 | 13.6 | 3.5 | 0.0 | 1.1 | 36.24 | 50.01 |
| CCl2 | 18.8 | 13.6 | 6.6 | 4.3 | 62.76 | 82.91 |
| CF | 15.9 | 7.8 | 0.0 | 0.0 | 21.27 | 31.01 |
| CCl | 20.6 | 18.2 | 6.7 | 3.9 | 36.98 | 47.46 |
| F | 0.1 | 0.1 | 0.0 | 4.6 | 14.84 | 19 |
| Cl | 16.4 | 8.7 | 0.0 | 0.0 | 27.46 | 35.45 |

TABLE 1-continued

Table 2 The coefficient list of standard Functional Groups

| Label | dD | dDfg | dP | dH | CosVol | MW |
|---|---|---|---|---|---|---|
| Br | 19.8 | 10.2 | 7.1 | 6.3 | 36.43 | 79.9 |
| I | 21.0 | 11.4 | 5.6 | 5.2 | 47.22 | 126.9 |
| Si | 10.7 | 11.3 | 0.0 | 0.0 | 29.98 | 28.09 |
| P | 17.7 | 13.7 | 6.5 | 0.0 | 30.30 | 30.97 |
| B | 20.5 | 18.8 | 0.1 | 0.0 | 13.34 | 10.81 |

The composition according to the embodiment of the present invention preferably has the maximum absorption wavelength in a range of 700 to 1800 nm, more preferably has the maximum absorption wavelength in a range of 700 to 1300 nm, and still more preferably has the maximum absorption wavelength in a range of 700 to 1000 nm. In addition, in the composition according to the embodiment of the present invention, a ratio $A_1/A_2$ of a maximum value $A_1$ of an absorbance in a wavelength range of 400 to 600 nm to an absorbance $A_2$ at the maximum absorption wavelength is preferably 0.30 or lower, more preferably 0.20 or lower, still more preferably 0.15 or lower, and particularly preferably 0.10 or lower. The condition of the absorbance may be achieved by any method, but can be suitably achieved by adjusting the type and the content of the near infrared absorbing pigment.

An absorbance $A\lambda$ at a wavelength $\lambda$ is defined by the following equation.

$$A\lambda = -\log(T\lambda/100)$$

$A\lambda$ is an absorbance at the wavelength $\lambda$ and $T\lambda$ is a transmittance (%) at the wavelength $\lambda$.

In the present invention, the value of the absorbance may be a value measured in the form of a solution, or may be a value measured in the form of a film formed using a composition. In a case of measuring the absorbance in the form of a film, it is preferable that the value is measured by using a film formed using a method including: applying the composition to a glass substrate using a method such as spin coating such that a thickness of the film after drying is a predetermined thickness; and drying the composition using a hot plate at 100° C. for 120 seconds.

Hereinafter, each of the components of the composition according to the embodiment of the present invention will be described.

<<Near Infrared Absorbing Pigment>>

The composition according to the embodiment of the present invention contains a near infrared absorbing pigment. In the composition according to the embodiment of the present invention, a material which satisfies the above-described expression (1) with the solvent described later is selected and used.

The near infrared absorbing pigment used in the composition according to the embodiment of the present invention is at least one selected from a colorant compound which has a cation and an anion in the same molecule, a colorant compound which is a salt of a cationic chromophore and a counter anion, and a colorant compound which is a salt of an anionic chromophore and a counter cation. Here, the case in which the colorant compound has a cation and an anion in the same molecule means that the cation and the anion are present in the same molecule through a covalent bond to form a betaine structure (intramolecular salt structure). For example, a compound having the following structure is a colorant compound having a cation and an anion in the same molecule.

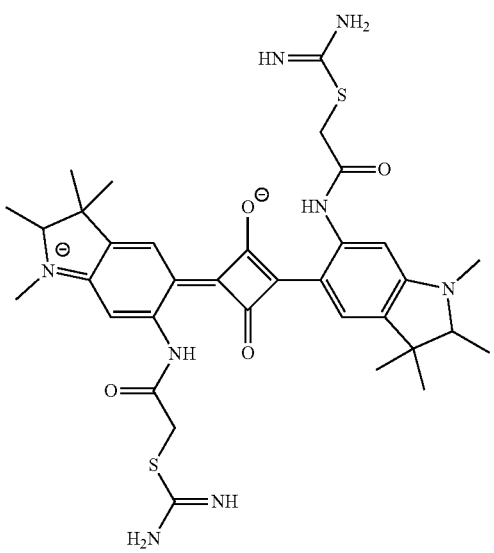

The near infrared absorbing pigment is preferably a compound having a π-conjugated plane including a monocyclic or fused aromatic ring. The number of atoms constituting the π-conjugated plane included in the near infrared absorbing pigment other than hydrogen is preferably 14 or more, more preferably 20 or more, still more preferably 25 or more, and still more preferably 30 or more. For example, the upper limit is preferably 80 or less and more preferably 50 or less.

The number of monocyclic or fused aromatic rings in the π-conjugated plane included in the near infrared absorbing pigment is preferably 2 or more, more preferably 3 or more, and still more preferably 4 or more. The upper limit is preferably 100 or less, more preferably 50 or less, and still more preferably 30 or less. Examples of the aromatic ring include a benzene ring, a naphthalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, a pyran ring, a thiopyran ring, and a fused ring having the above-described ring.

In the near infrared absorbing pigment used in the composition according to the embodiment of the present invention, the D50 particle size in which a cumulative volume in a particle size distribution of particle sizes of the near infrared absorbing pigment measured by dynamic light scattering is 50% is 100 nm or lower, preferably 60 nm or lower, and more preferably 40 nm or lower. In a case where the D50 particle size is 100 nm or lower, dispersion stability of the near infrared absorbing pigment in the composition is good. Furthermore, a film having excellent visible transparency can be formed. The lower limit of the D50 particle size is preferably 0.5 nm or higher, more preferably 1 nm or higher, and still more preferably 2 nm or higher. In a case where the D50 particle size is 0.5 nm or higher, in a case of storing the composition, the generation of foreign matters derived from the near infrared absorbing pigment can be effectively suppressed, and a film with less foreign matter is easily formed.

In addition, the near infrared absorbing pigment used in the composition according to the embodiment of the present invention preferably satisfies the following expression (D1), more preferably satisfies the following expression (D2), still more preferably satisfies the following expression (D3), and particularly preferably satisfies the following expression (D4). According to the aspects, in a case of storing the composition, the generation of foreign matters derived from the near infrared absorbing pigment can be effectively suppressed, and a film with less foreign matter is easily formed.

$D90$ particle size/$D50$ particle size ≤ 4.0 (D1)

$2.0 ≤ D90$ particle size/$D50$ particle size ≤ 3.5 (D2)

$2.0 ≤ D90$ particle size/$D50$ particle size ≤ 3.0 (D3)

$2.0 ≤ D90$ particle size/$D50$ particle size ≤ 2.8 (D4)

The D90 particle size is a particle size in which a cumulative volume in the particle size distribution of the particle sizes of the near infrared absorbing pigment is 90%, and the D50 particle size is a particle size in which a cumulative volume in the particle size distribution of the particle sizes of the near infrared absorbing pigment is 50%.

In the present invention, the particle size distribution of the particle sizes of the near infrared absorbing pigment is a value measured by a dynamic light scattering method. Examples of a measuring device include MICROTRAC UPA-150 manufactured by Nikkiso Co., Ltd.

In the present invention, the near infrared absorbing pigment is preferably a compound having the maximum absorption wavelength in a range of 700 to 1800 nm, more preferably a compound having the maximum absorption wavelength in a range of 700 to 1300 nm, and still more preferably a compound having the maximum absorption wavelength in a range of 700 to 1000 nm. Since a near infrared absorbing pigment having a maximum absorption wavelength on the long-wave side tends to be brittle in physical strength, such a near infrared absorbing pigment is easily refined. As a result, it is assumed that the near infrared absorbing pigment is easily dissolved in a solvent and tends to be easily reprecipitated in the composition. However, according to the present invention, by selecting and using a material which satisfies the above-described expression (1) with the solvent described later even in a case where such a near infrared absorbing pigment is used, dispersion stability of the near infrared absorbing pigment is good and the generation of foreign matters derived from the near infrared absorbing pigment is effectively suppressed, so that the effects of the present invention are remarkably exhibited. In addition, in the near infrared absorbing pigment, Amax/A550 which is a ratio of an absorbance Amax at the maximum absorption wavelength to an absorbance A550 in a wavelength of 550 nm is preferably 50 to 500 and more preferably 100 to 400. According to this aspect, a film having excellent visible transparency and near infrared shielding properties can be easily formed.

In the present invention, the near infrared absorbing pigment is preferably at least one selected from a squarylium compound, a cyanine compound, a croconium compound, and an iminium compound, more preferably at least one selected from a squarylium compound, a cyanine compound, and a croconium compound, and still more preferably a squarylium compound or a croconium compound.

As the squarylium compound, a compound represented by Formula (SQ1) is preferable.

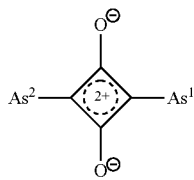
(SQ1)

In the formula, $As^1$ and $As^2$ each independently represent an aryl group, a heterocyclic group, or a group represented by Formula (As-1).

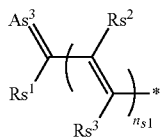
(As-1)

In the formula, * represents a direct bond;

$Rs^1$ to $Rs^3$ each independently represent a hydrogen atom or an alkyl group;

$As^3$ represents a heterocyclic group;

$n_{s1}$ represents an integer of 0 or more;

$Rs^1$ and $Rs^2$ may be bonded to each other to form a ring;

$Rs^1$ and $As^3$ may be bonded to each other to form a ring;

$Rs^2$ and $Rs^3$ may be bonded to each other to form a ring; and in a case where $n_{s1}$ is 2 or more, a plurality of $Rs^2$ and $Rs^3$ may be respectively the same as or different from each other.

The number of carbon atoms in the aryl group represented by $As^1$ and $As^2$ is preferably 6 to 48, more preferably 6 to 22, and particularly preferably 6 to 12.

The heterocyclic group represented by $As^1$, $As^2$, and $As^3$ is preferably a heterocyclic group of a 5-membered or 6-membered ring. In addition, as the heterocyclic group, a heterocyclic group of a monocyclic ring or a fused ring composed of 2 to 8 rings is preferable, a heterocyclic group of a monocyclic ring or a fused ring composed of 2 to 4 rings is more preferable, a heterocyclic group of a monocyclic ring or a fused ring composed of 2 or 3 rings is still more preferable, and a heterocyclic group of a monocyclic ring or a fused ring composed of 2 rings is particularly preferable. In addition, examples of a heteroatom constituting the ring of the heterocyclic group include a nitrogen atom, an oxygen atom, and a sulfur atom, and a nitrogen atom or a sulfur atom is preferable. The number of heteroatoms constituting the ring of the heterocyclic group is preferably 1 to 3 and more preferably 1 or 2.

$Rs^1$ to $Rs^3$ in Formula (As-1) each independently represent a hydrogen atom or an alkyl group. The number of carbon atoms in the alkyl group represented by $Rs^1$ to $Rs^3$ is preferably 1 to 20, more preferably 1 to 15, and still more preferably 1 to 8. The alkyl group may be linear, branched, or cyclic, and is preferably linear or branched. $Rs^1$ to $Rs^3$ are preferably a hydrogen atom.

$n_{s1}$ in Formula (As-1) represents an integer of 0 or more. $n_{s1}$ is preferably an integer of 0 to 2, more preferably 0 or 1, and still more preferably 0.

In Formula (As-1), $Rs^1$ and $Rs^2$ may be bonded to each other to form a ring, $Rs^1$ and $As^3$ may be bonded to each other to form a ring, and $Rs^2$ and $Rs^3$ may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the substituent T described later and a group represented by Formula (R-SQ). In Formula (R-SQ), $R_{sq}^1$ represents an organic group. Examples of the organic group represented by $R_{sq}^1$ include an aryl group, a heterocyclic group, a group represented by Formula (As-1), a group represented by Formula (As-10) described later, a group represented by Formula (As-11) described later, a group represented by Formula (As-12) described later, a group represented by Formula (As-20) described later, a group represented by Formula (As-30) described later, a group represented by Formula (As-40) described later, and a group represented by Formula (As-41) described later.

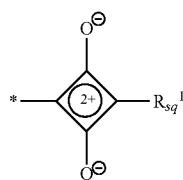
(R-SQ)

In Formula (SQ1), it is preferable that the groups represented by $As^1$ and $As^2$ have a substituent. Examples of the substituent include the substituent T described later.

In Formula (SQ1), it is preferable that $As^1$ and $As^2$ are each independently an aryl group or a heterocyclic group or $As^1$ and $As^2$ are each independently the group represented by Formula (As-1).

(Substituent T)

Examples of a substituent T include a halogen atom, a cyano group, a nitro group, an alkyl group, an alkenyl group, an alkynyl group, an aryl group, a heteroaryl group, —$ORt^1$, —$CORt^1$, —$COORt^1$, —$OCORt^1$, —$NRt^1Rt^2$, —$NHCORt^1$, —$CONRt^1Rt^2$, —$NHCONRt^1Rt^2$, —$NHCOORt^1$, —$SRt^1$, —$SO_2Rt^1$, —$SO_2ORt^1$, —$NHSO_2Rt^1$, and —$SO_2NRt^1Rt^2$. $Rt^1$ and $Rt^2$ each independently represent a hydrogen atom, an alkyl group, an alkenyl group, an alkynyl group, an aryl group, or a heteroaryl group. $Rt^1$ and $Rt^2$ may be bonded to each other to form a ring. In a case where $Rt^1$ in —$COORt^1$ is hydrogen atom, the hydrogen atom may be dissociated or in a form of salt. In addition, in a case where $Rt^1$ in —$SO_2ORt^1$ is a hydrogen atom, the hydrogen atom may be dissociated or in a form of salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic, and is preferably linear or branched.

The number of carbon atoms in the alkenyl group is preferably 2 to 20, more preferably 2 to 12, and particularly preferably 2 to 8. The alkenyl group may be linear, branched, or cyclic, and is preferably linear or branched.

The number of carbon atoms in the alkynyl group is preferably 2 to 40, more preferably 2 to 30, and particularly preferably 2 to 25. The alkynyl group may be linear, branched, or cyclic, and is preferably linear or branched.

The number of carbon atoms in the aryl group is preferably 6 to 30, more preferably 6 to 20, and still more preferably 6 to 12.

As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting the ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and more preferably 3 to 12.

The alkyl group, the alkenyl group, the alkynyl group, the aryl group, and the heteroaryl group may have a substituent or may be unsubstituted. Examples of the substituent include the substituents described in the substituent T.

At least one of $As^1$ or $As^2$ in Formula (SQ1) is also preferably a group represented by Formula (As-10). According to this aspect, a film having excellent moisture resistance is easily obtained.

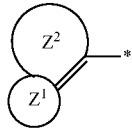

(As-10)

In Formula (As-10), a ring $Z^1$ represents an aromatic heterocyclic ring or a fused ring including an aromatic heterocyclic ring, which may have one or a plurality of substituents, a ring $Z^2$ represents a 4-membered to 9-membered hydrocarbon ring or a heterocyclic ring, which may have one or a plurality of substituents, in a case where the ring $Z^1$ and the ring $Z^2$ have a plurality of substituents, the plurality of substituents may be the same as or different from each other, and * represents a direct bond.

In Formula (As-10), the ring $Z^1$ represents an aromatic heterocyclic ring or a fused ring including an aromatic heterocyclic ring, which may have one or a plurality of substituents. Examples of the aromatic heterocyclic ring include an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring, and an imidazole ring, an oxazole ring, a thiazole ring, a pyridine ring, a pyrazine ring, or a pyrrole ring is preferable. Examples of the fused ring including an aromatic heterocyclic ring include a fused ring of one or more rings (in a case of two or more rings, the two or more rings may be the same as or different from each other) selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring, and a ring (preferably a benzene ring or a naphthalene ring) selected from a benzene ring, a naphthalene ring, an anthracene ring, a tetracene ring, a phenanthrene, a triphenylene, a tetraphene ring, and a pyrene ring; and a fused ring of two or more rings (in a case of two or more rings, the two or more rings may be the same as or different from each other) selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring. From the reason that more excellent spectral characteristics are easily obtained, the fused number of the fused ring is preferably 2 to 6 and more preferably 2 to 4.

In Formula (As-10), the ring $Z^2$ represents a 4-membered to 9-membered hydrocarbon ring or a heterocyclic ring, which may have one or a plurality of substituents. The hydrocarbon ring and the heterocyclic ring represented by the ring $Z^2$ is preferably a 5-membered to 7-membered ring and more preferably a 5-membered or 6-membered ring. Specific examples of the hydrocarbon ring includes cycloalkene rings such as a cyclobutene ring, a cyclopentene ring, a cyclopentadiene ring, a cyclohexene ring, a cyclohexadiene ring, a cycloheptene ring, a cycloheptadiene ring, a cycloheptatriene ring, a cyclooctene ring, a cyclooctadiene ring, a cyclooctatriene ring, a cyclononene ring, a cyclononadiene ring, a cyclononatriene ring, and a cyclononatetraene ring, and a cyclopentene ring, a cyclohexene ring, a cycloheptene ring, or a cyclooctene ring is preferable and a cyclopentene ring or a cyclohexene ring is more preferable. The heterocyclic ring represented by the ring $Z^2$ is preferably a nitrogen-containing heterocyclic ring.

Examples of the substituent which may be included in the ring $Z^1$ and the ring $Z^2$ include the above-described substituent T. In addition, it is also preferable that the substituent which may be included in the ring $Z^1$ is an electron-withdrawing group. A substituent having a positive Hammett's substituent constant σ value (sigma value) acts as an electron-withdrawing group. Here, the substituent constant obtained by Hammett's rule includes a σp value and a σm value. The values can be found in many common books. In the present invention, a substituent having the Hammett's substituent constant σ value of 0.1 or more can be exemplified as the electron-withdrawing group. σ value is preferably 0.15 or more, more preferably 0.2 or more, and still more preferably 0.3 or more. The upper limit is not particularly limited, but is preferably 1.0 or less. Specific examples of the electron-withdrawing group include a halogen atom, an alkyl group in which at least a part of a hydrogen atom is replaced by a hydrogen atom, an aryl group in which at least a part of the hydrogen atom is replaced by a hydrogen atom, a nitro group, a cyano group, a cyanomethyl group, —CH=C(CN)$_2$, —C(CN)=C(CN)$_2$, —P(CN)$_2$, —N=NCN, —COR$_{EWG}$, —COOR$_{EWG}$, —OCOR$_{EWG}$, —NHCOR$_{EWG}$, —CONHR$_{EWG}$, —SOR$_{EWG}$, —SO$_2$R$_{EWG}$, —SO$_2$OR$_{EWG}$, —NHSO$_2$R$_{EWG}$, and —SO$_2$NHR$_{EWG}$. R$_{EWG}$ represents an alkyl group in which at least a part of a hydrogen atom is replaced by a fluorine atom, an aryl group in which at least a part of the hydrogen atom is replaced by a fluorine atom, an amino group, a halogen atom, a cyano group, or a cyanomethyl group. Here, the cyanomethyl group includes a monocyanomethyl group (—CH$_2$CN), a dicyanomethyl group (—CH(CN)$_2$), and a tricyanomethyl group (—C(CN)$_3$). The alkyl group in which at least a part of a hydrogen atom is replaced by a fluorine atom preferably has 1 to 6 carbon atoms, more preferably has 1 to 5 carbon atoms, and still more preferably has 1 to 4 carbon atoms. The aryl group in which at least a part of the hydrogen atom is replaced by a fluorine atom preferably has 6 to 14 carbon atoms and more preferably has 6 to 10 carbon atoms. In these alkyl groups and aryl groups, all of the hydrogen atoms may be replaced by fluorine atoms, a part of the hydrogen atom may be replaced by a fluorine atom, or these alkyl groups and aryl groups may not be replaced by a fluorine atom.

The group represented by Formula (As-10) is preferably a group represented by Formula (As-11) or Formula (As-12).

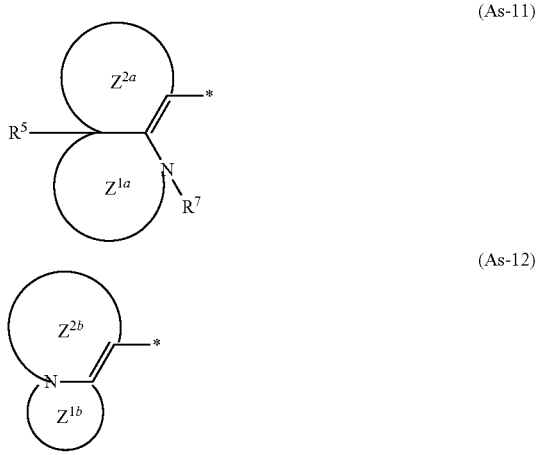

In Formula (As-11), a ring $Z^{1a}$ is a polycyclic aromatic ring having a 5-membered or 6-membered nitrogen-containing heterocyclic ring, which may have one or a plurality of substituents, and a ring $Z^{2a}$ is a 4-membered to 9-membered hydrocarbon ring or a heterocyclic ring, which may have one or a plurality of substituents. In a case where the ring $Z^{1a}$ and the ring $Z^{2a}$ have a plurality of substituents, the plurality of substituents may be the same as or different from each other. $R^5$ and $R^7$ each independently represent a hydrogen atom or a substituent.

In Formula (As-11), examples of the polycyclic aromatic ring represented by the ring $Z^{1a}$ include a fused ring including a 5-membered or 6-membered nitrogen-containing heterocyclic ring selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring. In addition, examples of the polycyclic aromatic ring include a fused ring of one or more rings (in a case of two or more nitrogen-containing heterocyclic rings, the two or more nitrogen-containing heterocyclic rings may be the same as or different from each other) selected from the above-described nitrogen-containing heterocyclic ring, and a benzene ring or a naphthalene ring; and a fused ring of two or more rings (in a case of two or more nitrogen-containing heterocyclic rings, the two or more nitrogen-containing heterocyclic rings may be the same as or different from each other) selected from the above-described nitrogen-containing heterocyclic ring.

From the reason that more excellent spectral characteristics are easily obtained, the number of rings included in the polycyclic aromatic ring (fused number of the fused ring) is preferably 2 to 6 and more preferably 2 to 4.

In Formula (As-11), examples of the 4-membered to 9-membered hydrocarbon ring and the heterocyclic ring represented by the ring $Z^{2a}$ include those described in the section of the ring $Z^2$ of Formula (1).

In Formula (As-11), examples of the substituent which may be included in the ring $Z^{1a}$ and the ring $Z^{2a}$ and the substituent represented by $R^5$ and $R^7$ include the above-described substituent T. In addition, it is also preferable that the substituent which may be included in the ring $Z^{1a}$ is an electron-withdrawing group. Examples of the electron-withdrawing group include the above-described groups.

In Formula (As-12), a ring $Z^{1b}$ represents a polycyclic aromatic ring having a 5-membered or 6-membered nitrogen-containing heterocyclic ring, which may have one or a plurality of substituents, a ring $Z^{2b}$ represents a 4-membered to 9-membered nitrogen-containing heterocyclic ring which may have one or a plurality of substituents, and in a case where the ring $Z^{1a}$ and the ring $Z^{2a}$ have a plurality of substituents, the plurality of substituents may be the same as or different from each other.

In Formula (As-12), examples of the polycyclic aromatic ring represented by the ring $Z^{1b}$ include a fused ring including a 5-membered or 6-membered nitrogen-containing heterocyclic ring selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring. In addition, examples of the polycyclic aromatic ring include a fused ring of one or more rings (in a case of two or more nitrogen-containing heterocyclic rings, the two or more nitrogen-containing heterocyclic rings may be the same as or different from each other) selected from the above-described nitrogen-containing heterocyclic ring, and a benzene ring or a naphthalene ring; and a fused ring of two or more rings (in a case of two or more nitrogen-containing heterocyclic rings, the two or more nitrogen-containing heterocyclic rings may be the same as or different from each other) selected from the above-described nitrogen-containing heterocyclic ring.

From the reason that more excellent spectral characteristics are easily obtained, the number of rings included in the polycyclic aromatic ring (fused number of the fused ring) is preferably 2 to 6 and more preferably 2 to 4.

In Formula (As-12), the nitrogen-containing heterocyclic ring represented by the ring $Z^{2b}$ is preferably a 5-membered to 7-membered ring and more preferably a 5-membered or 6-membered ring.

In Formula (As-12), examples of the substituent which may be included in the ring $Z^{1b}$ and the ring $Z^{2b}$ include the above-described substituent T. In addition, it is also preferable that the substituent which may be included in the ring $Z^{1b}$ is an electron-withdrawing group. Examples of the electron-withdrawing group include the above-described groups.

At least one of $As^1$ or $As^2$ in Formula (SQ1) is also preferably a group represented by Formula (As-20). According to this aspect, a film having excellent light resistance is easily obtained.

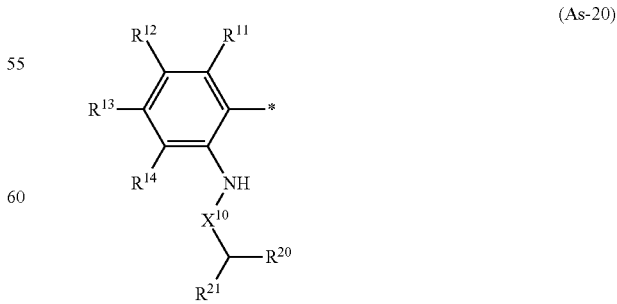

In Formula (As-20), $R^{11}$ to $R^{14}$ each independently represent a hydrogen atom or a substituent, two adjacent groups among $R^{11}$ to $R^{14}$ may be bonded to each other to form a ring, $R^{20}$ represents an aryl group or a heteroaryl group, $R^{21}$ represents a substituent, and $X^{10}$ represents CO or $SO_2$.

In Formula (As-20), $R^{11}$ to $R^{14}$ each independently represent a hydrogen atom or a substituent, and two adjacent groups among $R^{11}$ to $R^{14}$ may be bonded to each other to form a ring. Examples of the substituent represented by $R^{11}$ to $R^{14}$ include the above-described substituent T.

In Formula (As-20), $R^{20}$ represents an aryl group or a heteroaryl group, and an aryl group is preferable. The number of carbon atoms in the aryl group is preferably 6 to 48, more preferably 6 to 22, and still more preferably 6 to 12. The number of carbon atoms constituting the ring of the heteroaryl group is preferably 1 to 30 and more preferably 1 or 12. Examples of the type of the heteroatom constituting the ring of the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic or a fused ring, more preferably a monocycle or a fused ring composed of 2 to 8 rings, and still more preferably a monocycle or a fused ring composed of 2 to 4 rings. The aryl group and the heteroaryl group may have a substituent. Examples of the substituent include the above-described substituent T and the solubilizing group described later. It is preferable that the aryl group and the heteroaryl group do not have a substituent.

In Formula (As-20), $R^{21}$ represents a substituent. Examples of the substituent represented by $R^{21}$ include the above-described substituent T, and an alkyl group, an aryl group, a heteroaryl group, —$OCORt^1$, or —$NHCORt^1$ is preferable. $Rt^1$ is preferably an alkyl group, an aryl group, or a heteroaryl group and more preferably an alkyl group.

In Formula (As-20), $X^{10}$ represents CO or $SO_2$. In a case where $X^{10}$ is CO, more excellent heat resistance is easily obtained. In a case where $X^{10}$ is $SO_2$, more excellent visible transparency is easily obtained.

At least one of $As^1$ or $As^2$ in Formula (SQ1) is also preferably a group represented by Formula (As-30). According to this aspect, an effect of improving heat resistance can be expected.

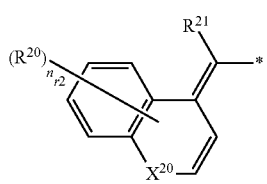

(As-30)

In Formula (As-30), $R^{20}$ and $R^{21}$ each independently represent a hydrogen atom or a substituent, $R^{20}$ and $R^{21}$ may be bonded to each other to form a ring, $X^{20}$ represents an oxygen atom, a sulfur atom, $NR^{22}$, a selenium atom, or a tellurium atom, $R^{22}$ represents a hydrogen atom or a substituent, in a case where $X^{20}$ is $NR^{22}$, $R^{22}$ and $R^{20}$ may be bonded to each other to form a ring, $n_{r2}$ represents an integer of 0 to 5, in a case where $n_{r2}$ is 2 or more, a plurality of $R^{20}$'s may be the same as or different from each other, two $R^{20}$'s among a plurality of $R^{20}$'s may be bonded to each other to form a ring, and * represents a direct bond.

In Formula (As-30), examples of the substituent represented by $R^{20}$ and $R^{21}$ include the above-described substituent T.

$R^{20}$ is preferably an alkyl group, a halogenated alkyl group (preferably a fluorinated alkyl group), an aryl group or a halogen atom, more preferably an alkyl group or a halogenated alkyl group, and still more preferably a halogenated alkyl group. $R^{21}$ is preferably a hydrogen atom or an alkyl group and more preferably a hydrogen atom.

In Formula (As-30), $X^{20}$ is preferably an oxygen atom, a sulfur atom, or $NR^{22}$ and more preferably $NR^{22}$. $R^{22}$ represents a hydrogen atom or a substituent. Examples of the substituent include the above-described substituent T, and an alkyl group is preferable. In a case where $X^{20}$ is $NR^{22}$, $R^{22}$ and $R^{20}$ may be bonded to each other to form a ring. Examples of the ring formed by bonding $R^{22}$ and $R^{20}$ to each other include a 4-membered to 9-membered hydrocarbon ring or heterocyclic ring, and a 5-membered to 7-membered hydrocarbon ring or heterocyclic ring is preferable, a 5-membered or 6-membered hydrocarbon ring or heterocyclic ring is more preferable, a 5-membered or 6-membered hydrocarbon ring is still more preferable, and a 6-membered hydrocarbon ring is particularly preferable.

In Formula (As-30), $n_{r2}$ represents an integer of 0 to 5, and is preferably an integer of 0 to 3, more preferably an integer of 0 to 2, and still more preferably an integer of 1 or 2. In a case where $n_{r2}$ is 2 or more, a plurality of $R^{20}$'s may be the same as or different from each other, and two $R^{20}$'s among a plurality of $R^{20}$'s may be bonded to each other to form a ring. The ring formed by bonding $R^{20}$'s to each other may be a hydrocarbon ring or a heterocyclic ring. In addition, the ring formed by bonding these groups to each other may be a monocyclic ring or a fused ring.

At least one of $As^1$ or $As^2$ in Formula (SQ1) is also preferably a group represented by Formula (As-40) or Formula (41). According to this aspect, an effect of improving light resistance can be expected.

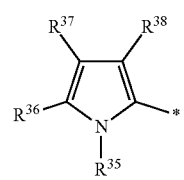

(As-40)

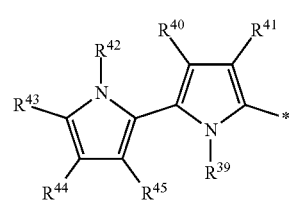

(As-41)

In Formula (As-40), $R^{35}$ to $R^{38}$ each independently represent a hydrogen atom or a substituent, each of $R^{35}$ and $R^{36}$, $R^{36}$ and $R^{37}$, and $R^{37}$ and $R^{38}$ may be bonded to each other to form a ring, and * represents a direct bond; and in Formula (As-41), $R^{39}$ to $R^{45}$ each independently represent a hydrogen atom or a substituent, each of $R^{39}$ and $R^{45}$, $R^{40}$ and $R^{41}$, $R^{40}$ and $R^{42}$, $R^{42}$ and $R^{43}$, $R^{43}$ and $R^{44}$, and $R^{44}$ and $R^{45}$ may be bonded to each other to form a ring, and * represents a direct bond.

Examples of the substituent represented by $R^{35}$ to $R^{38}$ in Formula (As-40) and the substituent represented by $R^{39}$ to $R^{45}$ in Formula (As-41) include the above-described substituent T, and an alkyl group or an aryl group is preferable and an alkyl group is more preferable.

In Formula (As-40), each of $R^{35}$ and $R^{36}$, $R^{36}$ and $R^{37}$, and $R^{37}$ and $R^{38}$ may be bonded to each other to form a ring. In addition, in Formula (As-41), each of $R^{39}$ and $R^{45}$, $R^{40}$ and $R^{41}$, $R^{40}$ and $R^{42}$, $R^{42}$ and $R^{43}$, $R^{43}$ and $R^{44}$, and $R^{44}$ and $R^{45}$ may be bonded to each other to form a ring.

Examples of the ring formed by bonding these groups to each other include a hydrocarbon ring and a heterocyclic ring, and a hydrocarbon ring is preferable. In addition, the

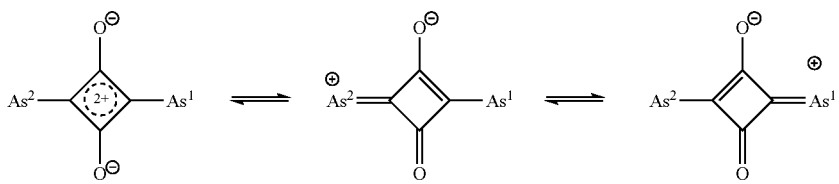

ring formed by bonding these groups to each other may be a monocyclic ring or a fused ring, but a fused ring is preferable.

In Formula (As-40), it is preferable that $R^{35}$ and $R^{36}$ is bonded to each other to form a ring. In addition, in Formula (As-41), it is preferable that each of $R^{40}$ and $R^{41}$, and $R^{44}$ and $R^{45}$ is bonded to each other to form a ring.

The group represented by Formula (As-40) is preferably a group represented by Formula (As-40a). In addition, the group represented by Formula (As-41) is preferably a group represented by Formula (As-41a).

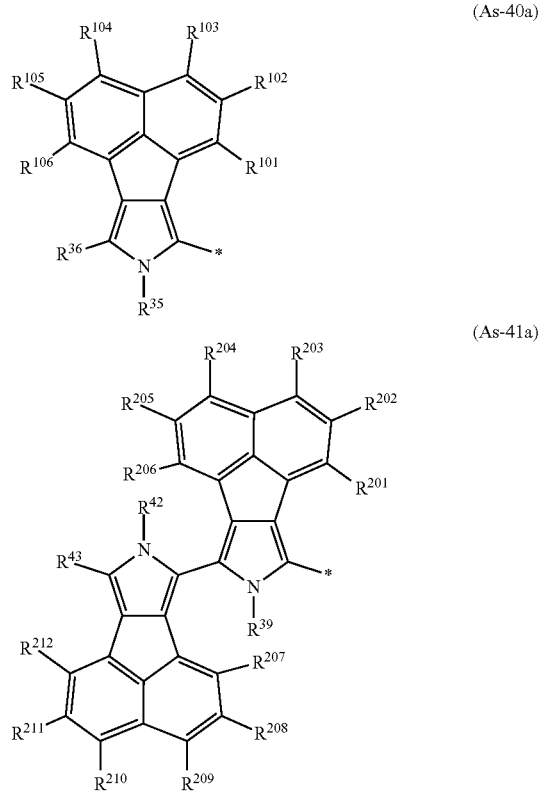

In Formula (As-40a), $R^{35}$, $R^{36}$, and $R^{101}$ to $R^{106}$ each independently represent a hydrogen atom or a substituent, and * represents a direct bond. In Formula (As-41a), $R^{39}$, $R^{42}$, $R^{43}$, and $R^{201}$ to $R^{212}$ each independently represent a hydrogen atom or a substituent, and * represents a direct bond. Examples of the substituent represented by $R^{35}$, $R^{36}$, and $R^{101}$ to $R^{106}$ and the substituent represented by $R^{39}$, $R^{42}$, $R^{43}$, and $R^{201}$ to $R^{212}$ include the above-described substituent T, and an alkyl group or an aryl group is preferable and an alkyl group is more preferable.

As shown below, cations in Formula (SQ1) are present without being localized.

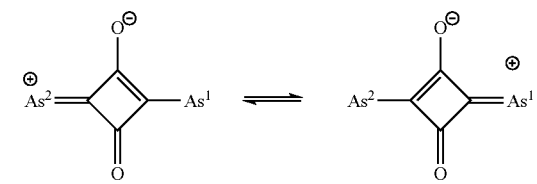

As the squarylium compound, a compound represented by Formula (SQ2) or a compound represented by Formula (SQ3) is preferable.

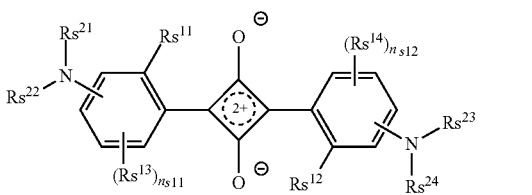

$Rs^{11}$ and $Rs^{12}$ each independently represent a hydrogen atom or a substituent;

$Rs^{13}$ and $Rs^{14}$ each independently represent a substituent;

$n_{s11}$ and $n_{s12}$ each independently represent an integer of 0 to 3;

in a case where $n_{s11}$ is 2 or more, two $Rs^{13}$'s may be bonded to each other to form a ring;

in a case where $n_{s12}$ is 2 or more, two $Rs^{14}$'s may be bonded to each other to form a ring;

$Rs^{21}$ to $Rs^{24}$ each independently represent an alkyl group, an aryl group, or a heteroaryl group; and A ring formed by bonding $Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, $Rs^{24}$ and $Rs^{14}$, $Rs^{21}$ and two $Rs^{13}$'s, and a ring formed by bonding $Rs^{23}$ and two $Rs^{14}$'s may be further bonded to each other to form a ring.

In Formula (SQ2), as the substituent represented by $R^{s11}$ and $Rs^{12}$, a group having an active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable. $R^{X1}$ and $R^{X2}$ each independently represent a hydrogen atom or a substituent. Examples of the substituent represented by $R^{X1}$ and $R^{X2}$ include an alkyl group, an aryl group, and a heteroaryl group. Among these, an alkyl group is preferable.

In Formula (SQ2), examples of the substituent represented by $Rs^{13}$ and $Rs^{14}$ include the above-described substituent T.

In Formula (SQ2), $Rs^{21}$ to $Rs^{24}$ each independently represent an alkyl group, an aryl group, or a heteroaryl group.

The number of carbon atoms in the alkyl group is preferably 1 to 20, more preferably 1 to 15, and still more preferably 1 to 8. The alkyl group may be linear, branched, or cyclic, and is preferably linear or branched. The number of carbon atoms in the aryl group is preferably 6 to 30, more preferably 6 to 20, and still more preferably 6 to 12. As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting the ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and more preferably 3 to 12. The alkyl group, the aryl group, and the heteroaryl group may have a substituent or may be unsubstituted. Examples of the substituent include the substituents described in the substituent T.

In Formula (SQ2), $n_{s11}$ and $n_{s12}$ each independently represent an integer of 0 to 3, and preferably represent an integer of 0 to 2.

In Formula (SQ2), in a case where $n_{s11}$ is 2 or more, two $Rs^{13}$'s may be bonded to each other to form a ring, and in a case where $n_{s12}$ is 2 or more, two $Rs^{14}$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T.

In Formula (SQ2), each of $Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, and $Rs^{24}$ and $Rs^{14}$ may be bonded to each other to form a ring. In addition, in a case where two $Rs^{13}$'s are bonded to each other to form a ring, $Rs^{21}$ and the ring formed by bonding two $Rs^{13}$'s may be bonded to each other to further form a ring. In addition, in a case where two $Rs^{14}$'s are bonded to each other to form a ring, $Rs^{23}$ and the ring formed by bonding two $Rs^{14}$'s may be bonded to each other to further form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T. The case in which $Rs^{21}$ and the ring formed by bonding two $Rs^{13}$'s are bonded to each other to further form a ring is, for example, the following structure. In the following structure, A1 is a ring formed by bonding two $Rs^{13}$'s, A2 is a ring formed by bonding the ring A1 and $Rs^{22}$, $Rs^{22}$ is an alkyl group, an aryl group, or a heteroaryl group, $Rs^{11}$ and $Rs^{13}$ is a hydrogen atom or a substituent, and * is a direct bond.

The same applies to the case in which $Rs^{23}$ and the ring formed by bonding two $Rs^{14}$'s are bonded to each other to further form a ring.

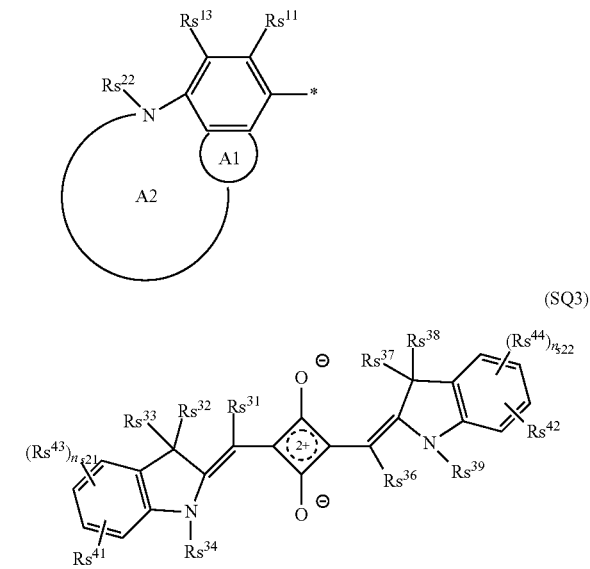

$Rs^{31}$ to $Rs^{34}$ and $Rs^{36}$ to $Rs^{39}$ each independently represent a hydrogen atom or an alkyl group;

each of $Rs^{31}$ and $Rs^{32}$, $Rs^{31}$ and $Rs^{34}$, $Rs^{32}$ and $Rs^{33}$, $Rs^{36}$ and $Rs^{37}$, $Rs^{36}$ and $Rs^{39}$, and $Rs^{37}$ and $Rs^{38}$ may be bonded to each other to form a ring;

$Rs^{41}$ and $Rs^{42}$ each independently represent a hydrogen atom or a substituent;

$Rs^{43}$ and $Rs^{44}$ each independently represent a substituent;

$n_{s21}$ and $n_{s22}$ each independently represent an integer of 0 to 3;

in a case where $n_{s21}$ is 2 or more, two $Rs^{43}$'s may be bonded to each other to form a ring; and in a case where $n_{s22}$ is 2 or more, two $Rs^{44}$'s may be bonded to each other to form a ring.

In Formula (SQ3), the number of carbon atoms in the alkyl group represented by $Rs^{31}$ to $Rs^{34}$, and $Rs^{36}$ to $Rs^{39}$ is preferably 1 to 20, more preferably 1 to 15, and still more preferably 1 to 8. The alkyl group may be linear, branched, or cyclic, and is preferably linear or branched. The alkyl group may have a substituent or may be unsubstituted. Examples of the substituent include the substituents described in the substituent T.

In Formula (SQ3), each of $Rs^{31}$ and $Rs^{32}$, $Rs^{31}$ and $Rs^{34}$, $Rs^{32}$ and $Rs^{33}$, $Rs^{36}$ and $Rs^{37}$, $Rs^{36}$ and $Rs^{39}$, and $Rs^{37}$ and $Rs^{38}$ may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T.

In Formula (SQ3), the substituent represented by $Rs^{41}$ and $Rs^{42}$ and the substituent represented by $Rs^{43}$ and $Rs^{44}$ include the above-described substituent T.

In Formula (SQ3), $n_{s21}$ and $n_{s22}$ each independently represent an integer of 0 to 3, and preferably represent an integer of 0 to 2.

In Formula (SQ3), in a case where $n_{s21}$ is 2 or more, two $Rs^{43}$'s may be bonded to each other to form a ring, and in a case where $n_{s22}$ is 2 or more, two $Rs^{44}$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T.

As the squarylium compound, a compound represented by Formula (SQ10), Formula (SQ11), or Formula (SQ12) is also preferable.

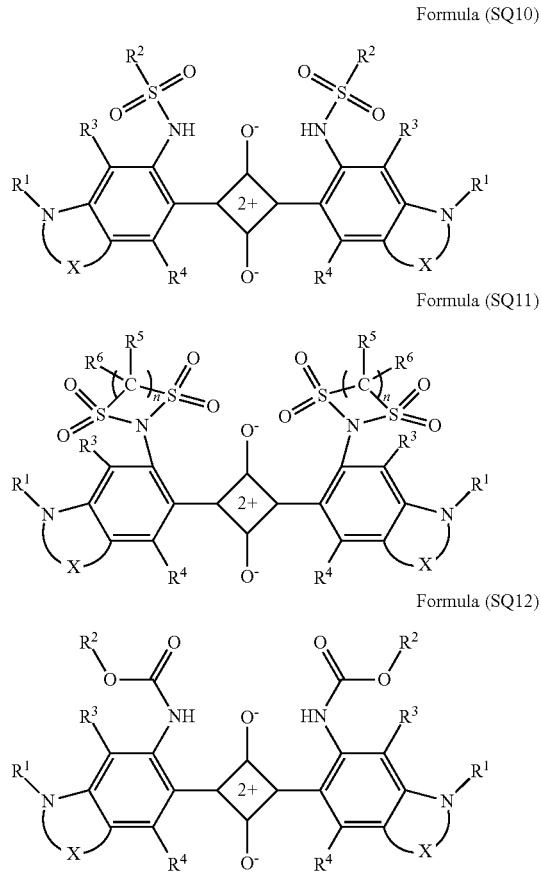

Formula (SQ10)

Formula (SQ11)

Formula (SQ12)

In Formulae (SQ10) to (SQ12), X's each independently represent a divalent organic group represented by Formula (S1) or Formula (S2) in which one or more hydrogen atoms may be substituted with a halogen atom or an alkyl group or an alkoxy group having 1 to 12 carbon atoms.

  (S1)

In Formula (S1), n1 represents 2 or 3.

  (S2)

In Formula (S2), n2 and n3 each independently represent an integer of 0 to 2, and n2+n3 is 1 or 2.

$R^1$ and $R^2$ each independently represent an alkyl group or an aryl group. The alkyl group and the aryl group may have a substituent or may be unsubstituted. Examples of the substituent include the above-described substituent T.

$R^3$ to $R^6$ each independently represent a hydrogen atom, a halogen atom, an alkyl group, or an alkoxy group.

n is 2 or 3.

As the squarylium compound used in the present invention, a compound represented by Formula (SQ21) or Formula (SQ22) is also preferable. According to this aspect, an effect of improving moisture resistance can be expected.

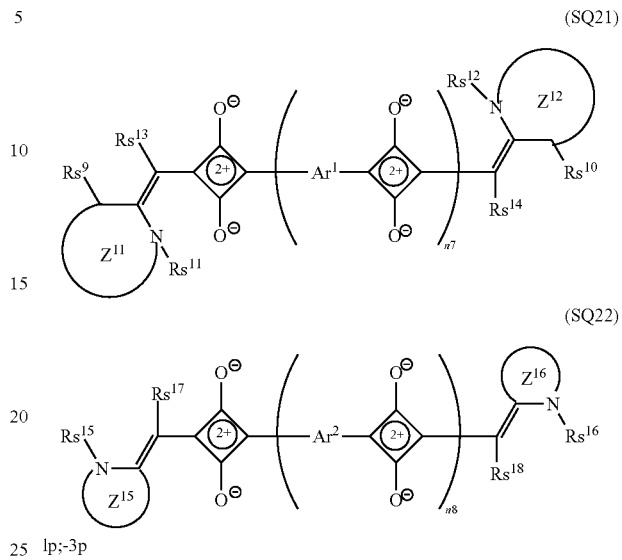

(SQ21)

(SQ22)

lp;-3p

In Formula (SQ21), a ring $Z^{11}$ and a ring $Z^{12}$ each independently represent a polycyclic aromatic ring having a nitrogen-containing heterocyclic ring, which may have one or a plurality of substituents, in a case where the ring $Z^{11}$ and the ring $Z^{12}$ have a plurality of substituents, the plurality of substituents may be the same as or different from each other, $Rs^9$ to $Rs^{14}$ each independently represent a hydrogen atom or a substituent, $Ar^1$ represents a group represented by any one of Formulae (Ar-1) to (Ar-4), n7 represents an integer of 0 to 2, and each of $Rs^9$ and $Rs^{13}$, and $Rs^{10}$ and $Rs^{14}$ may be bonded to each other to form a ring; and in Formula (SQ22), a ring $Z^{15}$ and a ring $Z^{16}$ each independently represent a polycyclic aromatic ring having a nitrogen-containing heterocyclic ring, which may have one or a plurality of substituents, in a case where the ring $Z^{11}$ and the ring $Z^{12}$ have a plurality of substituents, the plurality of substituents may be the same as or different from each other, $Rs^9$ to $Rs^{14}$ each independently represent a hydrogen atom or a substituent, $Ar^2$ represents a group represented by any one of Formulae (Ar-1) to (Ar-4), n8 represents an integer of 0 to 2, and each of $Rs^{15}$ and $Rs^{17}$, and $Rs^{16}$ and $Rs^{18}$ may be bonded to each other to form a ring.

In Formula (SQ21), the ring $Z^{11}$ and the ring $Z^{12}$ each independently represent a polycyclic aromatic ring having a nitrogen-containing heterocyclic ring, which may have one or a plurality of substituents. The ring $Z^{11}$ and ring $Z^{12}$ in Formula (SQ21) are the same as the ring $Z^{1a}$ in Formula (As-11), and the preferred range is also the same.

In Formula (SQ21), examples of the substituent which may be included in the ring $Z^{11}$ and the ring $Z^{12}$ and the substituent represented by $Rs^9$ to $Rs^{14}$ include the above-described substituent T.

In Formula (SQ21), each of $Rs^9$ and $Rs^{13}$, and $Rs^{10}$ and $Rs^{14}$ may be bonded to each other to form a ring. Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring. Specific examples of the hydrocarbon ring includes cycloalkene rings such as a cyclobutene ring, a cyclopentene ring, a cyclopentadiene ring, a cyclohexene ring, a cyclohexadiene ring, a cycloheptene ring, a cycloheptadiene ring, a cycloheptatriene ring, a cyclooctene ring, a cyclooctadiene ring, a cyclooctatriene ring, a cyclononene ring, a cyclononadiene ring, a cyclononatriene ring, and a cyclononatetraene ring, and a cyclopentene ring, a cyclohexene ring, a cycloheptene ring, or a cyclooctene ring is preferable and a cyclopentene ring or a cyclohexene ring is more preferable. The heterocyclic ring is preferably a nitrogen-containing heterocyclic ring.

In Formula (SQ21), from the reason that it is easy to shift the maximum absorption wavelength of a compound to a longer wavelength side and to improve visible transparency and near infrared shielding properties, $Ar^1$ is preferably a group represented by any one of Formulae (Ar-2) to (Ar-4).

In Formula (SQ21), n7 represents an integer of 0 to 2, and is preferably 0 or 1.

In Formula (SQ22), the ring $Z^{15}$ and the ring $Z^{16}$ each independently represent a polycyclic aromatic ring having a nitrogen-containing heterocyclic ring, which may have one or a plurality of substituents. The ring $Z^{15}$ and ring $Z^{16}$ in Formula (SQ22) are the same as the ring $Z^{1b}$ in Formula (As-12), and the preferred range is also the same.

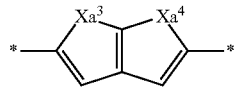

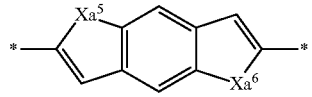

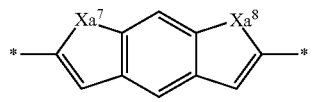

In the formulae, $Xa^1$ to $Xa^8$ each independently a sulfur atom, an oxygen atom, or $NRx^a$, $Rx^a$ represents a hydrogen atom or a substituent, and * represents a direct bond. Examples of the substituent represented by $Rx^a$ include the above-described substituent T, and an alkyl group is preferable. It is preferable that at least one of $Xa^1$ or $Xa^2$, at least one of $Xa^3$ or $Xa^4$, at least one of $Xa^5$ or $Xa^6$, and at least one of $Xa^7$ or $Xa^8$ each independently represent an oxygen atom or $NRx^a$.

As the squarylium compound, a compound represented by Formula (SQ23) is also preferable. According to this aspect, heat resistance and light resistance can be further improved.

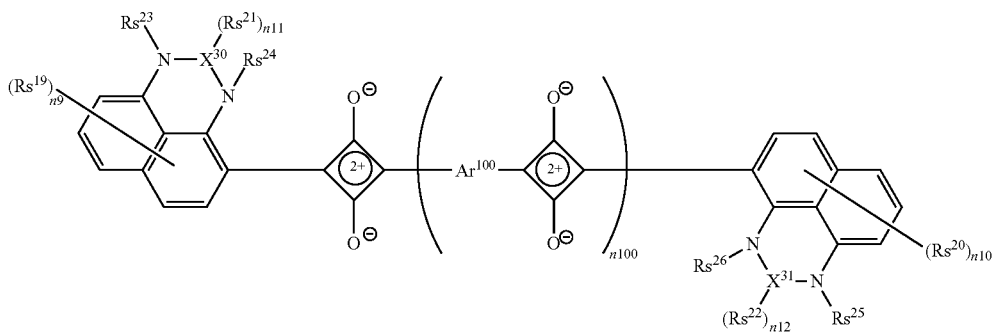

In Formula (SQ22), examples of the substituent which may be included in the ring $Z^{15}$ and the ring $Z^{16}$ and the substituent represented by $Rs^{15}$ to $Rs^{18}$ include the above-described substituent T.

In Formula (SQ22), each of $Rs^{15}$ and $Rs^{17}$, and $Rs^{16}$ and $Rs^{18}$ may be bonded to each other to form a ring. The ring formed by bonding these groups to each other is preferably a 4-membered to 9-membered nitrogen-containing heterocyclic ring, more preferably a 5-membered to 7-membered nitrogen-containing heterocyclic ring, and still more preferably a 5-membered or 6-membered nitrogen-containing heterocyclic ring.

In Formula (SQ22), from the reason that it is easy to shift the maximum absorption wavelength of a compound to a longer wavelength side and to improve visible transparency and near infrared shielding properties, $Ar^2$ is preferably a group represented by any one of Formulae (Ar-2) to (Ar-4).

In Formula (SQ22), n8 represents an integer of 0 to 2, and is preferably 0 or 1.

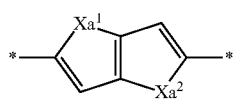

In Formula (SQ23), $Rs^{19}$ and $Rs^{20}$ each independently represent a substituent, $Rs^{21}$ to $Rs^{26}$ each independently represent a hydrogen atom or a substituent, $X^{30}$ and $X^{31}$ each independently represent a carbon atom or a boron atom, in a case where $X^{30}$ is a carbon atom, n11 is 2, in a case where $X^{30}$ is a boron atom, n11 is 1, in a case where $X^{31}$ is a carbon atom, n12 is 2, in a case where $X^{31}$ is a boron atom, n12 is 1, n9 and n10 each independently represent an integer of 0 to 5, in a case where n9 is 2 or more, a plurality of $Rs^{19}$'s may be the same as or different from each other and two $Rs^{19}$'s among the plurality of $Rs^{19}$'s may be bonded to each other to form a ring, in a case where n10 is 2 or more, a plurality of $Rs^{20}$'s may be the same as or different from each other and two $Rs^{20}$'s among the plurality of $Rs^{20}$'s may be bonded to each other to form a ring, in a case where n11 is 2 or more, two $Rs^{21}$'s may be the same as or different from each other and two $Rs^{21}$'s may be bonded to each other to form a ring, in a case where n12 is 2 or more, two $Rs^{22}$'s may be the same as or different from each other and two $Rs^{22}$'s may be bonded to each other to form a ring, $Ar^{100}$ represents a group represented by any one of Formulae (Ar-1) to (Ar-4), and n100 represents an integer of 0 to 2.

In Formula (SQ23), examples of the substituent represented by $Rs^{19}$ to $Rs^{26}$ include the above-described substituent T. Among these, a halogen atom, an alkyl group, or an aryl group is preferable.

In Formula (SQ23), $Rs^{21}$ to $Rs^{26}$ are preferably a hydrogen atom.

In Formula (SQ23), in a case where n9 is 2 or more, a plurality of $Rs^{19}$'s may be the same as or different from each other, and two $Rs^{19}$'s among the plurality of $Rs^{19}$'s may be bonded to each other to form a ring. In addition, in a case where n10 is 2 or more, a plurality of $Rs^{20}$'s may be the same as or different from each other, and two $Rs^{20}$'s among the plurality of $Rs^{20}$'s may be bonded to each other to form a ring. In addition, in a case where n11 is 2 or more, two $Rs^{21}$'s may be the same as or different from each other, and two $Rs^{21}$'s may be bonded to each other to form a ring. In addition, in a case where n12 is 2 or more, two $Rs^{22}$'s may be the same as or different from each other and two $Rs^{22}$'s may be bonded to each other to form a ring. Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring.

In Formula (SQ23), $Ar^{100}$ is preferably a group represented by any one of Formulae (Ar-2) to (Ar-4).

In Formula (SQ23), n100 represents an integer of 0 to 2, and is preferably 0 or 1.

As the squarylium compound used in the present invention, a compound represented by Formula (SQ24) is also preferable. According to this aspect, heat resistance and light resistance can be further improved.

$Rs^{47}$'s among the plurality of $Rs^{47}$'s may be bonded to each other to form a ring, in a case where n18 is 2 or more, a plurality of $Rs^{48}$'s may be the same as or different from each other and two $Rs^{48}$'s among the plurality of $Rs^{48}$'s may be bonded to each other to form a ring, in a case where n19 is 2 or more, a plurality of $Rs^{49}$'s may be the same as or different from each other and two $Rs^{49}$'s among the plurality of $Rs^{49}$'s may be bonded to each other to form a ring, $Ar^{200}$ represents a group represented by any one of Formulae (Ar-1) to (Ar-4), and n200 represents an integer of 0 to 2.

In Formula (SQ24), examples of the substituent represented by $Rs^{46}$ to $Rs^{53}$ include the above-described substituent T. As the substituent represented by $Rs^{46}$ and $Rs^{47}$, an electron-withdrawing group is also preferable. Examples of the electron-withdrawing group include the above-described groups.

In Formula (SQ24), $Rs^{50}$ to $Rs^{53}$ are preferably a hydrogen atom.

In Formula (SQ24), n16 and n17 each independently represent an integer of 0 to 5, and is preferably 0 to 4, more preferably 0 to 3, and still more preferably 0 to 2.

In Formula (SQ24), n18 and n19 each independently represent an integer of 0 to 6, and is preferably 1 to 4, more preferably 1 to 3, and still more preferably 1 or 2.

In Formula (SQ24), in a case where n16 is 2 or more, a plurality of $Rs^{46}$'s may be the same as or different from each other, and two $Rs^{46}$'s among the plurality of $Rs^{46}$'s may be bonded to each other to form a ring. In addition, in a case where n17 is 2 or more, a plurality of $Rs^{47}$'s may be the same as or different from each other, and two $Rs^{47}$'s among the plurality of $Rs^{47}$'s may be bonded to each other to form a ring. In addition, in a case where n18 is 2 or more, a plurality of $Rs^{48}$'s may be the same as or different from each other,

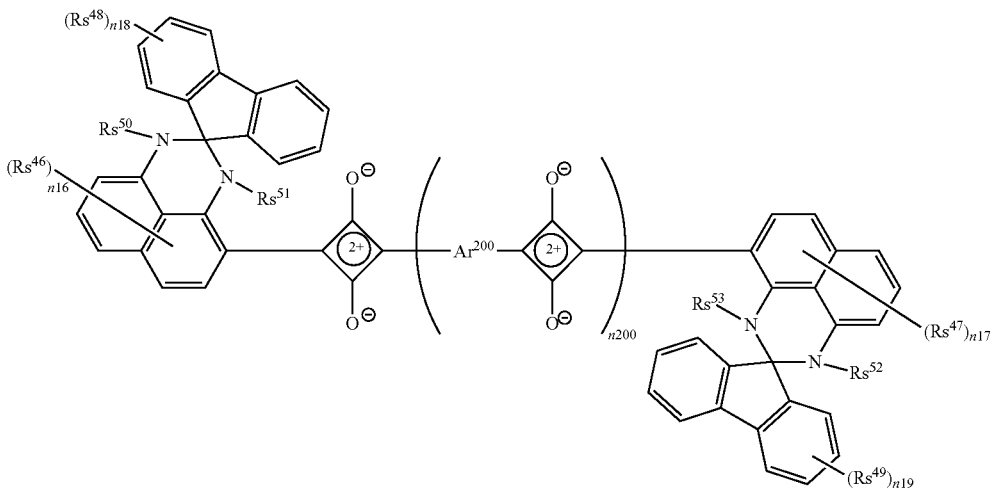

(SQ24)

In Formula (SQ24), $Rs^{46}$ to $Rs^{49}$ each independently represent a substituent, $Rs^{50}$ to $Rs^{53}$ each independently represent a hydrogen atom or a substituent, n16 and n17 each independently represent an integer of 0 to 5, n18 and n19 each independently represent an integer of 0 to 6, in a case where n16 is 2 or more, a plurality of $Rs^{46}$'s may be the same as or different from each other and two $Rs^{46}$'s among the plurality of $Rs^{46}$'s may be bonded to each other to form a ring, in a case where n17 is 2 or more, a plurality of $Rs^{47}$'s may be the same as or different from each other and two and two $Rs^{48}$'s among the plurality of $Rs^{48}$'s may be bonded to each other to form a ring. In addition, in a case where n19 is 2 or more, a plurality of $Rs^{49}$'s may be the same as or different from each other, and two $Rs^{49}$'s among the plurality of $Rs^{49}$'s may be bonded to each other to form a ring. Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring.

In Formula (SQ24), $Ar^{200}$ is preferably a group represented by any one of Formulae (Ar-2) to (Ar-4).

In Formula (SQ24), n200 represents an integer of 0 to 2, and is preferably 0 or 1.

As the near infrared absorbing pigment used in the present invention, a compound represented by Formula (SQ30) is also preferable. According to this aspect, light resistance can be further improved.

other, and two $Rs^{31}$'s among the plurality of $Rs^{31}$'s may be bonded to each other to form a ring. In addition, in a case where n14 is 2 or more, a plurality of $Rs^{32}$'s may be the same as or different from each other, and two $Rs^{32}$'s among the plurality of $Rs^{32}$'s may be bonded to each other to form a ring. Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring.

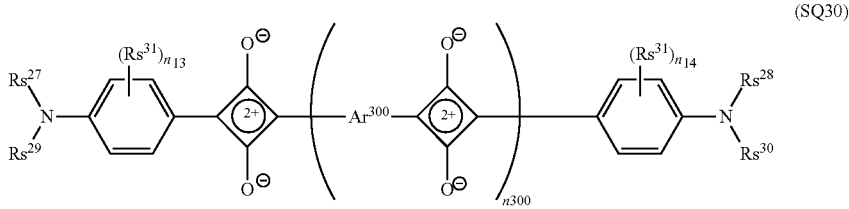

(SQ30)

In Formula (SQ30), $Rs^{27}$ to $Rs^{30}$ each independently represent a hydrogen atom or a substituent, $Rs^{31}$ and $Rs^{32}$ each independently represent a substituent or a group represented by Formula (100), each of $Rs^{27}$ and $Rs^{29}$, $Rs^{27}$ and $Rs^{31}$, $Rs^{29}$ and $Rs^{31}$, $Rs^{28}$ and $Rs^{30}$, $Rs^{28}$ and $Rs^{32}$, and $Rs^{30}$ and $Rs^{32}$ may be bonded to each other to form a ring, $Rs^{31}$ and $Rs^{32}$ may be linked through a single bond or a linking group, n13 and n14 each independently represent an integer of 0 to 4, in a case where n13 is 2 or more, a plurality of $Rs^{31}$'s may be the same as or different from each other and two $Rs^{31}$'s among the plurality of $Rs^{31}$'s may be bonded to each other to form a ring, in a case where n14 is 2 or more, a plurality of $Rs^{32}$'s may be the same as or different from each other and two $Rs^{32}$'s among the plurality of $Rs^{32}$'s may be bonded to each other to form a ring, $Ar^{300}$ represents a group represented by any one of Formulae (Ar-1) to (Ar-4), and n300 represents an integer of 0 to 2.

In Formula (SQ30), examples of the substituent represented by $Rs^{27}$ to $Rs^{32}$ include the above-described substituent T. As the substituent represented by $Rs^{27}$ to $Rs^{30}$, an alkyl group or an aryl group is preferable.

In Formula (SQ30), it is preferable that $Rs^{31}$ and $Rs^{32}$ are each independently a group represented by Formula (100).

In Formula (SQ30), each of $Rs^{27}$ and $Rs^{29}$, $Rs^{27}$ and $Rs^{31}$, $Rs^{29}$ and $Rs^{31}$, $Rs^{28}$ and $Rs^{30}$, $Rs^{28}$ and $Rs^{32}$, and $Rs^{30}$ and $Rs^{32}$ may be bonded to each other to form a ring.

Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring.

In Formula (SQ30), $Rs^{31}$ and $Rs^{32}$ may be linked through a single bond or a linking group. Examples of the linking group include —$CH_2$—, —CO—, —O—, —NH—, and a group selected from the group consisting of a combination thereof.

In Formula (SQ30), n13 and n14 each independently represent an integer of 0 to 4, and is preferably 1 to 4, more preferably 1 to 3, and still more preferably 1 or 2.

In Formula (SQ30), in a case where n13 is 2 or more, a plurality of $Rs^{31}$'s may be the same as or different from each erably a 5-membered to 7-membered ring, and still more preferably a 5-membered or 6-membered ring.

In Formula (SQ30), $Ar^{300}$ is preferably a group represented by any one of Formulae (Ar-2) to (Ar-4).

In Formula (SQ30), n300 represents an integer of 0 to 2, and is preferably 0 or 1.

(100)

In Formula (100), $R^{33}$ represents an aryl group or a heteroaryl group, and an aryl group is preferable. The number of carbon atoms in the aryl group is preferably 6 to 30, more preferably 6 to 20, and still more preferably 6 to 12. As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting the ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and still more preferably 3 to 12. The aryl group and the heteroaryl group may have a substituent. Examples of the substituent include the above-described substituent T.

In Formula (100), $R^{34}$ represents a hydrogen atom or a substituent. Examples of the substituent include the above-described substituent T, and an alkyl group, an aryl group, a heteroaryl group, —$OCORt^1$, or —$NHCORt^1$ is preferable. $Rt^1$ is preferably an alkyl group, an aryl group, or a heteroaryl group and more preferably an alkyl group.

In Formula (100), $X^{11}$ represents CO or $SO_2$.

The compound represented by Formula (SQ30) is preferably a compound represented by Formula (SQ30-1). According to this aspect, an effect of improving visible transparency can be expected.

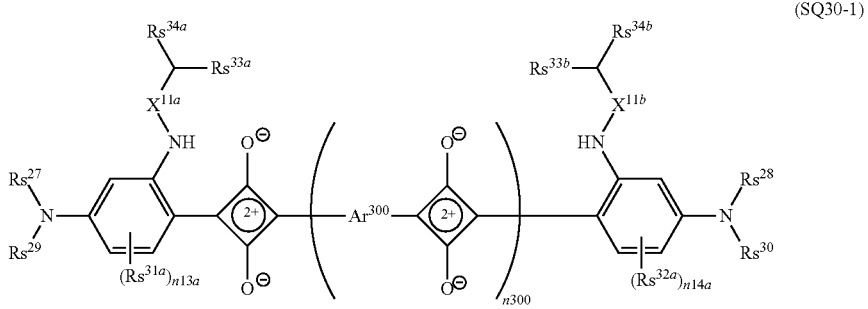

(SQ30-1)

In Formula (SQ30-1), $Rs^{27}$ to $Rs^{30}$ each independently represent a hydrogen atom or a substituent, $Rs^{31a}$ and $Rs^{32a}$ each independently represent a substituent, $Rs^{33a}$ and $Rs^{33b}$ each independently represent an aryl group or a heteroaryl group, $Rs^{34a}$ and $Rs^{34b}$ each independently represent a hydrogen atom or a substituent, each of $Rs^{27}$ and $Rs^{29}$, $Rs^{27}$ and $Rs^{31a}$, $Rs^{29}$ and $Rs^{31a}$, $Rs^{27}$ and $Rs^{34a}$, $Rs^{29}$ and $Rs^{34a}$, $Rs^{28}$ and $Rs^{30}$, $Rs^{28}$ and $Rs^{32a}$, $Rs^{30}$ and $Rs^{32a}$, $Rs^{27}$ and $Rs^{34b}$, and $Rs^{30}$ and $Rs^{34b}$ may be bonded to each other to form a ring, $Rs^{34a}$ and $Rs^{34b}$ may be linked through a single bond or a linking group, $X^{11a}$ and $X^{11b}$ each independently represent CO or $SO_2$, n13 and n14a each independently represent an integer of 0 to 3, in a case where n13a is 2 or more, a plurality of $Rs^{31a}$'s may be the same as or different from each other and two $Rs^{31a}$'s among the plurality of $Rs^{31a}$'s may be bonded to each other to form a ring, in a case where n14a is 2 or more, a plurality of $Rs^{32}$'s may be the same as or different from each other and two $Rs^{32}$'s among the plurality of $Rs^{2t}$'s may be bonded to each other to form a ring, $Ar^{300}$ represents a group represented by any one of Formulae (Ar-1) to (Ar-4), and n300 represents an integer of 0 to 2.

$Rs^{27}$ to $Rs^{30}$, $Ar^{300}$, and n300 in Formula (SQ30-1) are the same as $Rs^{27}$ to $Rs^{30}$, $Ar^{300}$, and n300 in Formula (SQ30), and the preferred range is also the same.

$Rs^{31a}$ and $Rs^{32a}$ in Formula (SQ30-1) are the same as $Rs^{31}$ and $Rs^{32}$ in Formula (SQ30), and the preferred range is also the same.

$Rs^{33a}$ and $Rs^{33b}$ in Formula (SQ30-1) are the same as $Rs^{33}$ in Formula (100), and the preferred range is also the same.

$Rs^{34a}$ and $Rs^{34b}$ in Formula (SQ30-1) are the same as $Rs^{33}$ in Formula (100), and the preferred range is also the same.

$X^{11a}$ and $X^{11b}$ in Formula (SQ30-1) are the same as $X^{11}$ in Formula (100), and the preferred range is also the same.

In Formula (SQ30-1), each of $Rs^{27}$ and $Rs^{29}$, $Rs^{27}$ and $Rs^{31a}$, $Rs^{29}$ and $Rs^{31a}$, $Rs^{27}$ and $Rs^{34a}$, $Rs^{29}$ and $Rs^{34a}$, $Rs^{28}$ and $Rs^{30}$, $Rs^{28}$ and $Rs^{32a}$, $Rs^{30}$ and $Rs^{32a}$, $Rs^{28}$ and $Rs^{34b}$, and $Rs^{30}$ and $Rs^{34b}$ may be bonded to each other to form a ring. Examples of the ring formed by bonding these groups to each other include a hydrocarbon ring and a heterocyclic ring, and a hydrocarbon ring is preferable. In addition, the ring formed by bonding these groups to each other is preferably a 4-membered to 9-membered ring, more preferably a 5-membered to 7-membered ring, and still more preferably a 5-membered or 6-membered ring.

In Formula (SQ30-1), $Rs^{34a}$ and $Rs^{34b}$ may be linked through a single bond or a linking group, and from the reason that more excellent light resistance is easily obtained, it is preferable that $Rs^{34a}$ and $Rs^{34b}$ are linked. Examples of the linking group include —$CH_2$—, —CO—, —O—, —NH—, and a group selected from the group consisting of a combination thereof.

In Formula (SQ30-1), n13a and n14a each independently represent an integer of 0 to 3, and is preferably 0 to 2, more preferably 0 or 1, and particularly preferably 1.

As the cyanine compound, a compound represented by Formula (Cy1) is preferable.

Formula (Cy1)

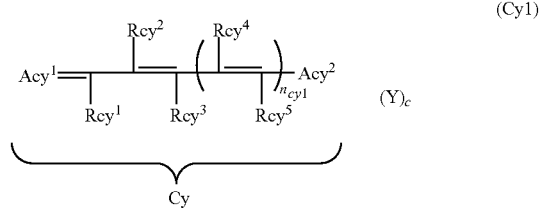

(Cy1)

$Rcy^1$ to $Rcy^5$ each independently represent a hydrogen atom or a substituent, and two of $Rcy^1$ to $Rcy^5$ may be bonded to each other to form a ring. $n_{cy1}$ represents an integer of 0 to 2, and in a case where $n_{cy1}$ is 2, a plurality of $Rcy^4$ and $Rcy^5$ may be the same as or different from each other. $Acy^1$ and $Acy^2$ each independently represent an aryl group or a heterocyclic group. In a case where a site represented by Cy in the formula is a cation site, Y represents a counter anion, and c represents the number of Y's for balancing charge. In a case where a site represented by Cy in the formula is an anion site, Y represents a counter cation, and c represents the number of Y's for balancing charge. In a case where charge of a site represented by Cy in the formula is neutralized in a molecule, c represents 0.

$Rcy^1$ to $Rcy^5$ each independently represent a hydrogen atom or a substituent. Examples of the substituent include the above-described substituent T. In Formula (Cy1), two of $Rcy^1$ to $Rcy^5$ may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T.

$n_{cy1}$ represents an integer of 0 to 2, and is preferably 0 or 1. In a case where $n_{cy1}$ is 2, a plurality of $Rcy^4$ and $Rcy^5$ may be the same as or different from each other.

The number of carbon atoms in the aryl group represented by $Acy^1$ and $Acy^2$ is preferably 6 to 48, more preferably 6 to 22, and particularly preferably 6 to 12. The heterocyclic group represented by $Acy^1$ and $Acy^2$ is preferably a heterocyclic group of a 5-membered or 6-membered ring. In addition, as the heterocyclic group, a heterocyclic group of a monocyclic ring or a fused ring composed of 2 to 8 rings is preferable, a heterocyclic group of a monocyclic ring or a fused ring composed of 2 to 4 rings is more preferable, a heterocyclic group of a monocyclic ring or a fused ring composed of 2 or 3 rings is still more preferable, and a heterocyclic group of a monocyclic ring or a fused ring composed of 2 rings is particularly preferable. In addition, examples of a heteroatom constituting the ring of the heterocyclic group include a nitrogen atom, an oxygen atom, and a sulfur atom, and an oxygen atom or a sulfur atom is preferable. The number of heteroatoms constituting the ring of the heterocyclic group is preferably 1 to 3 and more preferably 1 or 2. The group represented by $Acy^1$ and $Acy^2$ may have a substituent. Examples of the substituent include the above-described substituent T.

In Formula (Cy1), in a case where a site represented by Cy in the formula is a cation site, Y represents a counter anion, and c represents the number of Y's for balancing charge. Examples of the counter anion include a halide ion (Cl—, Br—, and I—), a p-toluenesulfonic acid ion, an ethyl sulfate ion, $PF_6^-$, $BF_4^-$ or $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyanoborate anion.

In Formula (Cy1), in a case where a site represented by Cy in the formula is an anion site, Y represents a counter cation, and c represents the number of Y's for balancing charge. Examples of the counter cation include an alkali metal ion ($Li^+$, $Na^+$, $K^+$, and the like), an alkaline earth metal ion ($Mg^{2+}$, $Ca^{2+}$, $Ba^{2+}$, $Sr^{2+}$, and the like), a transition metal ion ($Ag^+$, $Fe^{2+}$, $Co^{2+}$, $Ni^{2+}$, $Cu^{2+}$, $Zn^{2+}$, and the like), other metal ions ($Al^{3+}$ and the like), an ammonium ion, a triethylammonium ion, a tributylammonium ion, a pyridinium ion, a tetrabutylammonium ion, a guanidinium ion, a tetramethylguanidinium ion, and diazabicycloundecenium.

In Formula (Cy1), in a case where charge of a site represented by Cy in the formula is neutralized in a molecule, Y does not exist. That is, c is 0.

(Croconium Compound)

As the croconium compound, a compound represented by Formula (Cr1) is preferable.

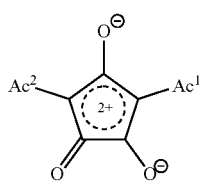

(Cr1)

In the formula, $Ac^1$ and $Ac^2$ each independently represent an aryl group, a heterocyclic group, or a group represented by Formula (Ac-1).

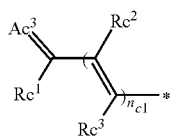

(Ac-1)

In the formula, * represents a direct bond;
$Rc^1$ to $Rc^3$ each independently represent a hydrogen atom or an alkyl group;
$Ac^3$ represents a heterocyclic group;
$n_{c1}$ represents an integer of 0 or more;
$Rc^1$ and $Rc^2$ may be bonded to each other to form a ring;
$Rc^1$ and $Ac^3$ may be bonded to each other to form a ring;
$Rc^2$ and $Rc^3$ may be bonded to each other to form a ring; and
in a case where $n_{c1}$ is 2 or more, a plurality of $Rc^2$ and $Rc^3$ may be respectively the same as or different from each other.

The number of carbon atoms in the aryl group represented by $Ac^1$ and $Ac^2$ is preferably 6 to 48, more preferably 6 to 22, and particularly preferably 6 to 12.

The heterocyclic group represented by $Ac^1$, $Ac^2$, and $Ac^3$ is preferably a heterocyclic group of a 5-membered or 6-membered ring. In addition, as the heterocyclic group, a heterocyclic group of a monocyclic ring or a fused ring composed of 2 to 8 rings is preferable, a heterocyclic group of a monocyclic ring or a fused ring composed of 2 to 4 rings is more preferable, a heterocyclic group of a monocyclic ring or a fused ring composed of 2 or 3 rings is still more preferable, and a heterocyclic group of a monocyclic ring or a fused ring composed of 2 rings is particularly preferable. In addition, examples of a heteroatom constituting the ring of the heterocyclic group include a nitrogen atom, an oxygen atom, and a sulfur atom, and a nitrogen atom or a sulfur atom is preferable. The number of heteroatoms constituting the ring of the heterocyclic group is preferably 1 to 3 and more preferably 1 or 2.

$Rc^1$ to $Rc^3$ in Formula (Ac-1) each independently represent a hydrogen atom or an alkyl group. The number of carbon atoms in the alkyl group represented by $Rc^1$ to $Rc^3$ is preferably 1 to 20, more preferably 1 to 15, and still more preferably 1 to 8. The alkyl group may be linear, branched, or cyclic, and is preferably linear or branched. $Rc^1$ to $Rc^3$ are preferably a hydrogen atom.

$n_{c1}$ in Formula (Ac-1) represents an integer of 0 or more. $n_{c1}$ is preferably an integer of 0 to 2, more preferably 0 or 1, and still more preferably 1.

In Formula (Ac-1), $Rc^1$ and $Rc^2$ may be bonded to each other to form a ring, $Rc^1$ and $Ac^3$ may be bonded to each other to form a ring, and $Rc^2$ and $Rc^3$ may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the above-described substituent T.

In Formula (Cr1), it is preferable that the groups represented by $Ac^1$ and $Ac^2$ have a substituent. Examples of the substituent include the above-described substituent T.

In Formula (Cr1), it is preferable that $Ac^1$ and $Ac^2$ are each independently an aryl group or a heterocyclic group or $Ac^1$ and $Ac^2$ are each independently the group represented by Formula (Ac-1). In addition, in Formula (CR1), it is also preferable that at least one of $Ac^1$ or $Ac^2$ is any one of the group represented by Formula (As-10), the group represented by Formula (As-20), the group represented by Formula (As-30), the group represented by Formula (As-40), or the group represented by Formula (As-41), which is described in the section of the squarylium compound.

As shown below, cations in Formula (Cr1) are present without being localized.

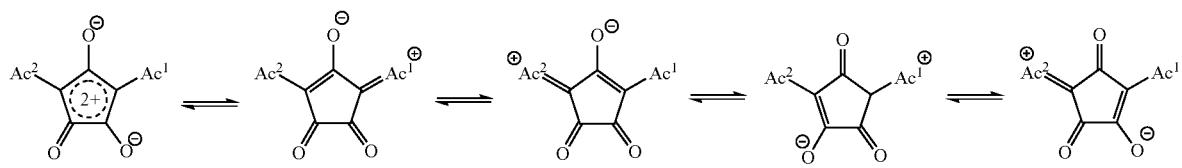

As the iminium compound, a compound represented by Formula (Im) is preferable.

Formula (Im)

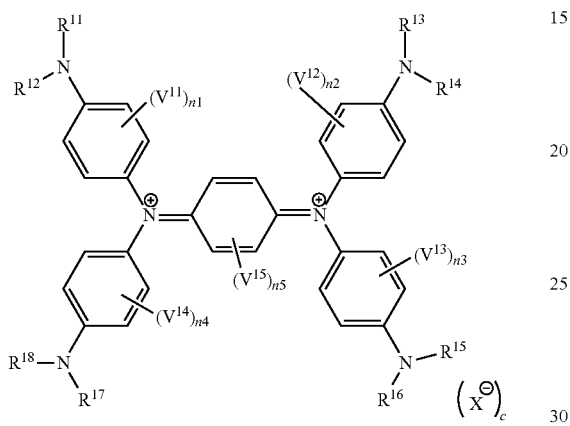

In the formula, $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, X represents a counter anion, c represents the number of X's for balancing charge, and n1 to n5 are each independently 0 to 4.

$R^{11}$ to $R^{18}$ each independently represent an alkyl group or an aryl group. The number of carbon atoms in the alkyl group is preferably 1 to 20, more preferably 1 to 12, and particularly preferably 1 to 8. The alkyl group may be linear, branched, or cyclic, and is preferably linear or branched. The number of carbon atoms in the aryl group is preferably 6 to 25, more preferably 6 to 15, and still more preferably 6 to 12.

The alkyl group and the aryl group may have a substituent or may be unsubstituted. Examples of the substituent include the groups described regarding the substituent T.

$V^{11}$ to $V^{15}$ each independently represent an alkyl group, an aryl group, a halogen atom, an alkoxy group, or a cyano group. Examples of the halogen atom include a fluorine atom, a chlorine atom, a bromine atom, and an iodine atom. The number of carbon atoms in the alkyl group is preferably 1 to 20, more preferably 1 to 12, and particularly preferably 1 to 8. The alkyl group may be linear, branched, or cyclic, and is preferably linear or branched and particularly preferably linear. The number of carbon atoms in the aryl group is preferably 6 to 25, more preferably 6 to 15, and still more preferably 6 to 12. The number of carbon atoms in the alkoxy group is preferably 1 to 20, more preferably 1 to 12, and particularly preferably 1 to 8. The alkoxy group may be linear, branched, or cyclic, and is preferably linear or branched and particularly preferably linear.

n1 to n5 are each independently 0 to 4. n1 to n4 are preferably 0 to 2 and more preferably 0 or 1. n5 is preferably 0 to 3 and more preferably 0 to 2.

X represents a counter anion. Examples of the counter anion include a halide ion (Cl—, Br—, and I—), a p-toluenesulfonic acid ion, an ethyl sulfate ion, $SbF_6^-$, $PF_6^-$, $BF_4^-$, $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyanoborate anion.

c represents the number of X's for balancing charge, and is preferably, for example, 2.

Specific examples of the near infrared absorbing pigment include a compound having the following structure.

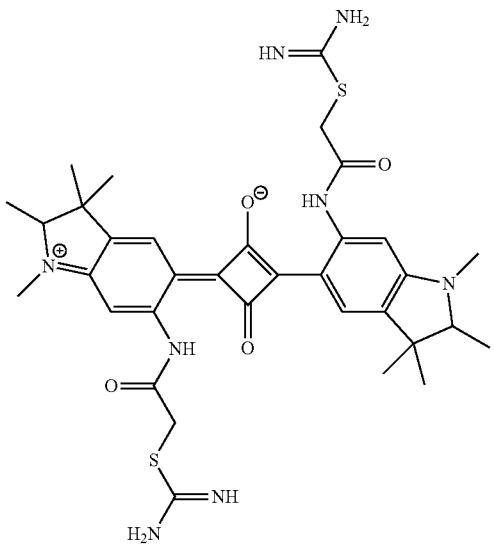

A-23

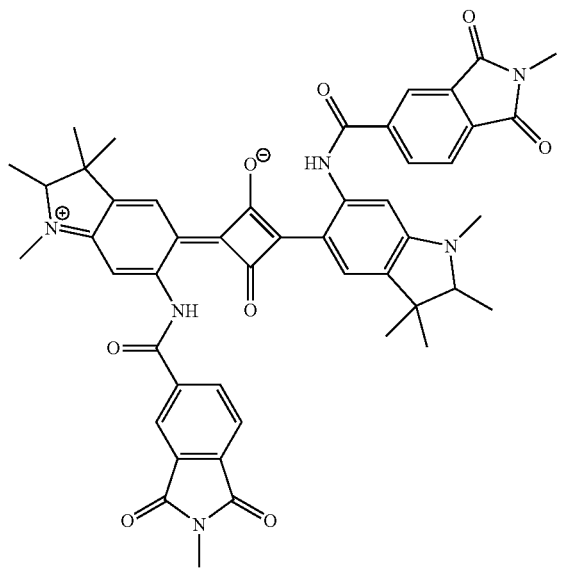

A-24

A-25
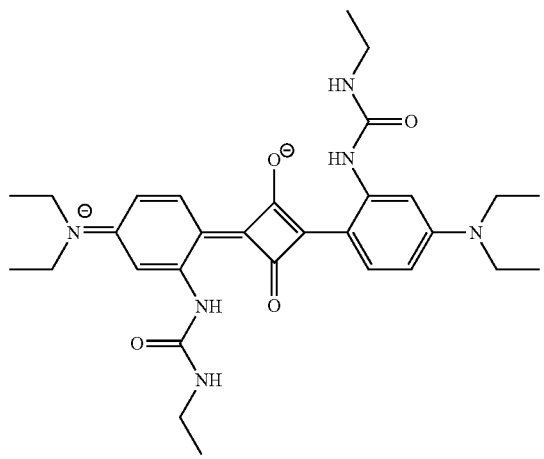
A-26
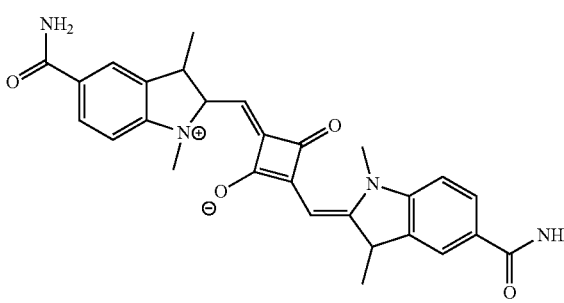
A-27
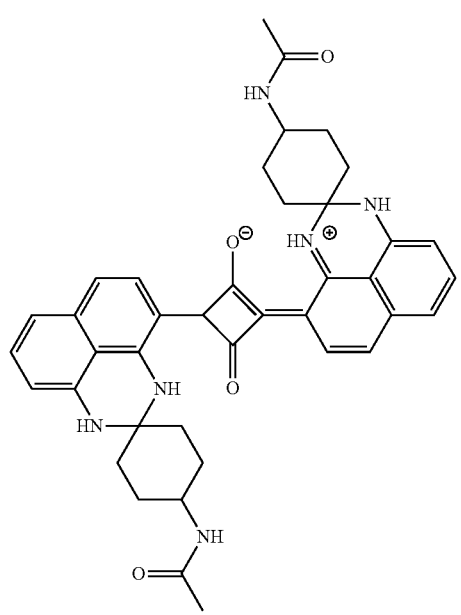
A-28
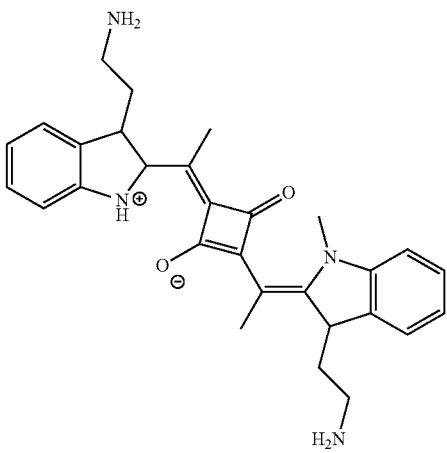
A-29
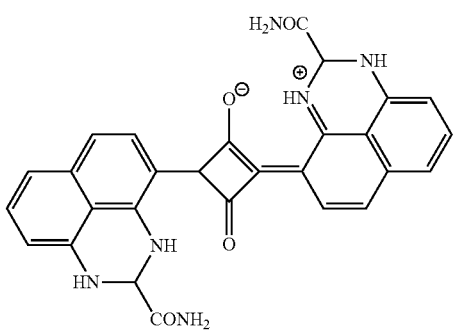
A-30
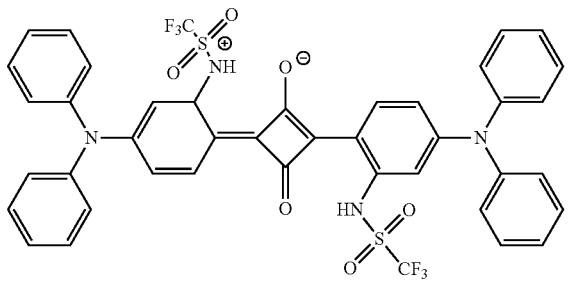
A-31
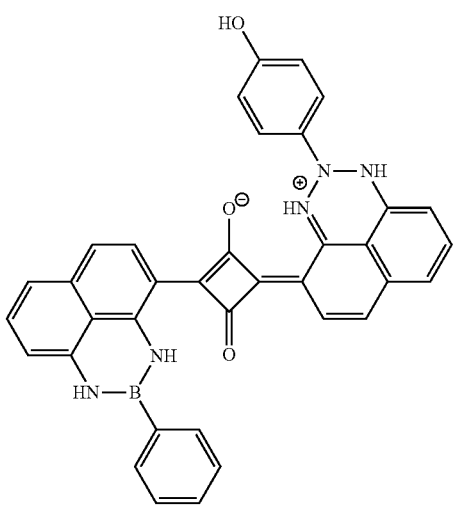

A-32 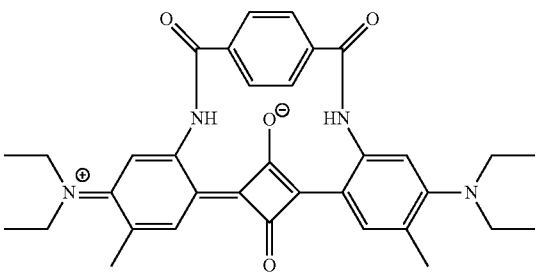
A-36 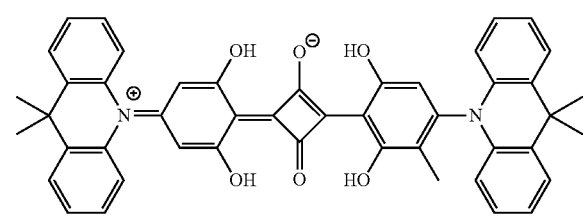
A-37 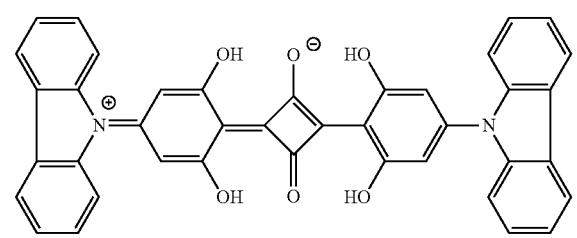
A-33 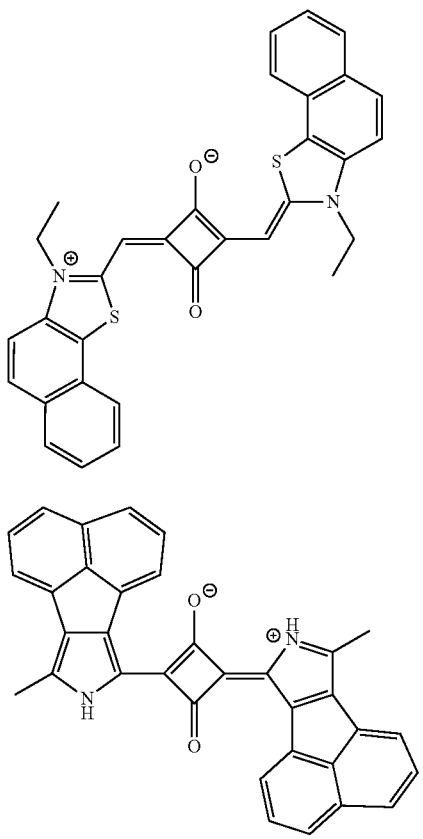
A-38 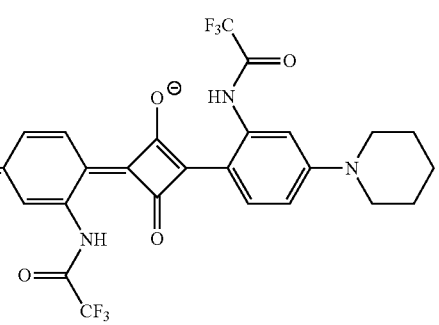
A-34 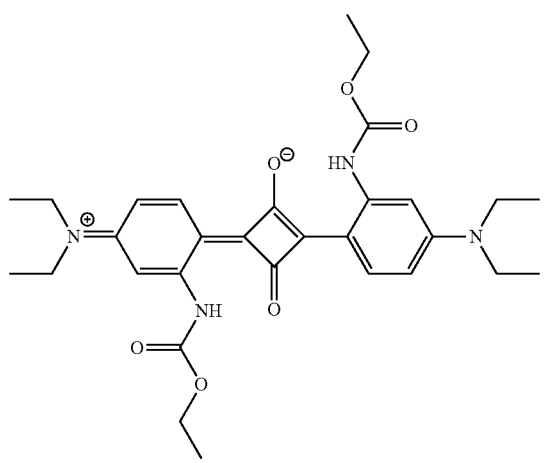
A-39 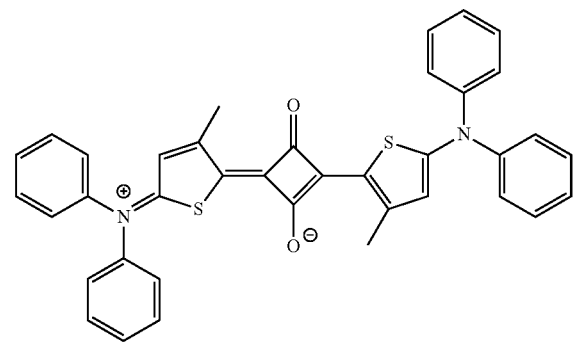
A-35 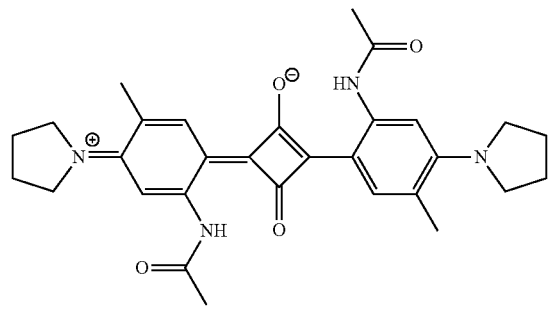
A-40

-continued
A-41
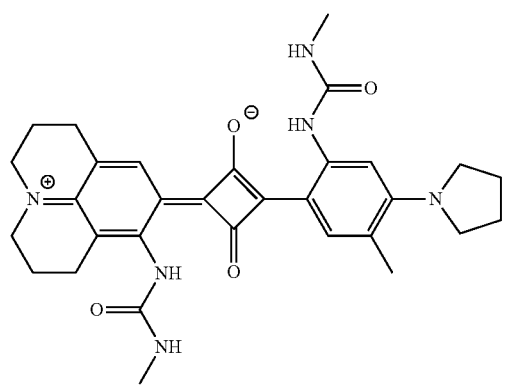
A-42
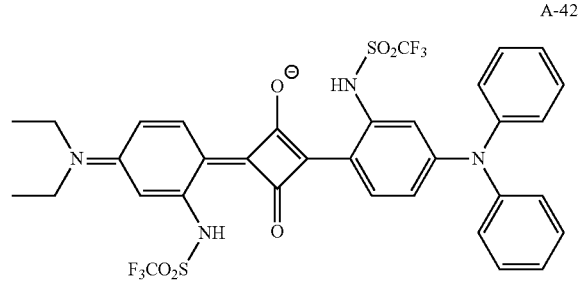
A-43
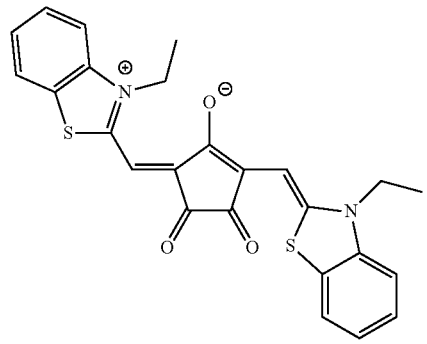
A-44
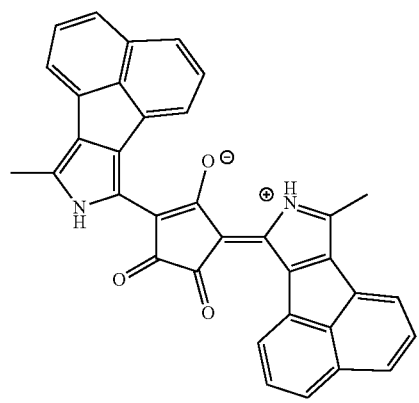
-continued
A-50
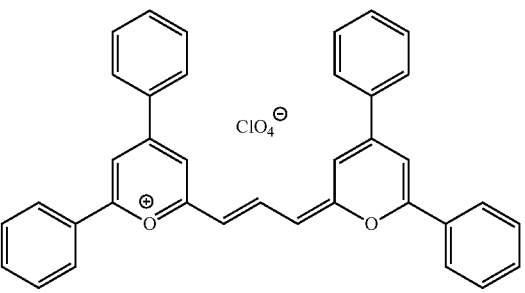
A-51
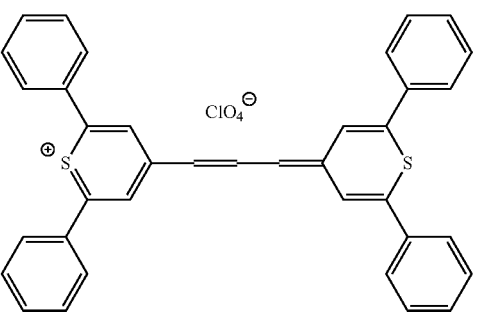
A-52
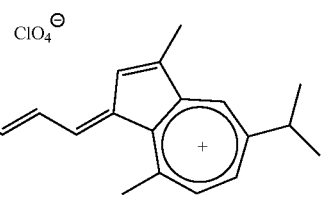
A-53
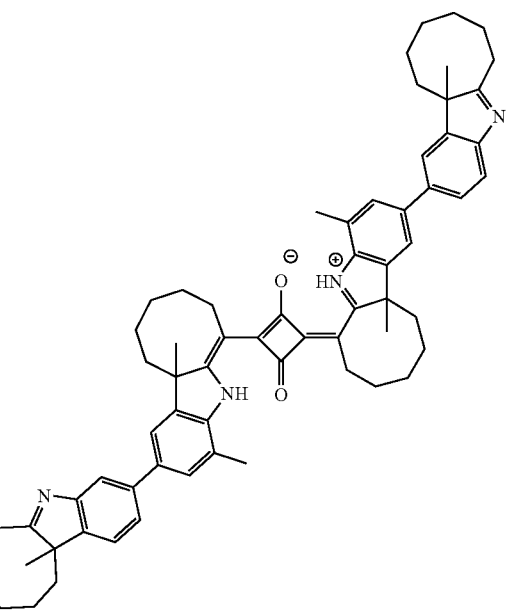

-continued
A-54
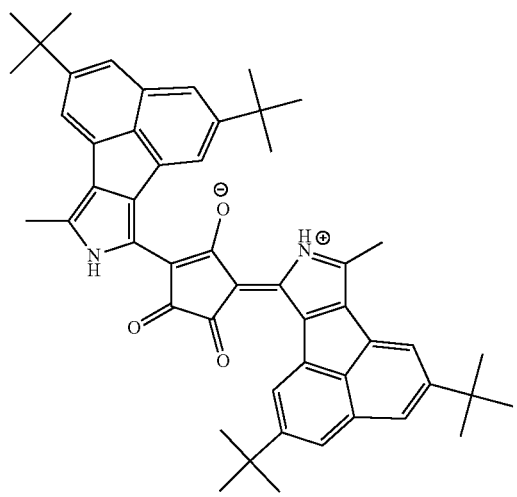
Aa-1
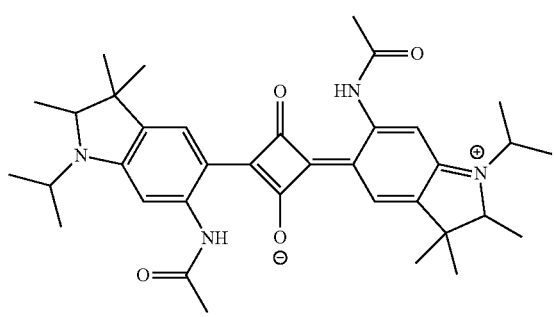
Aa-2
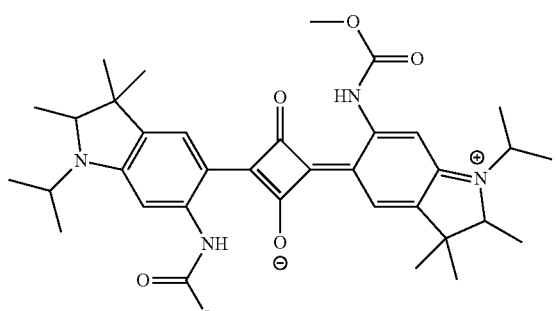
Ab-1
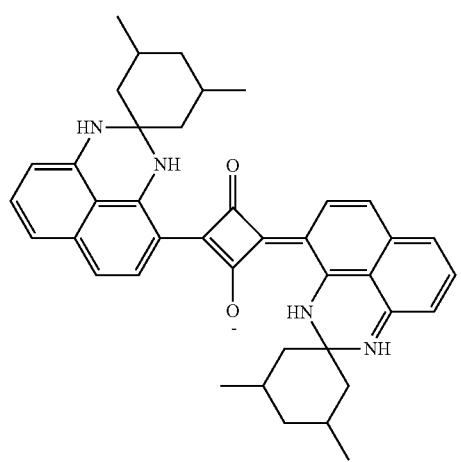
Ab-2
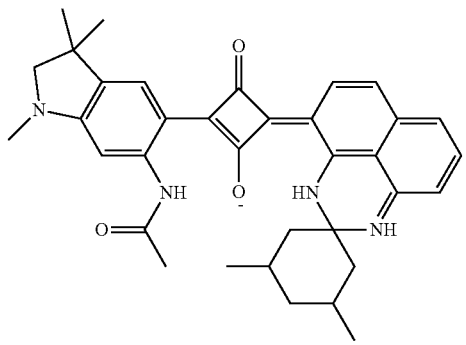
Ab-3
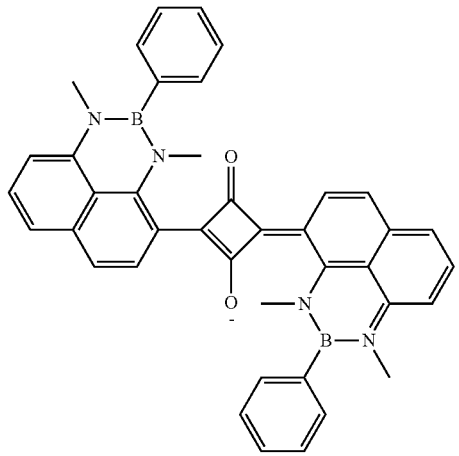
Ab-4
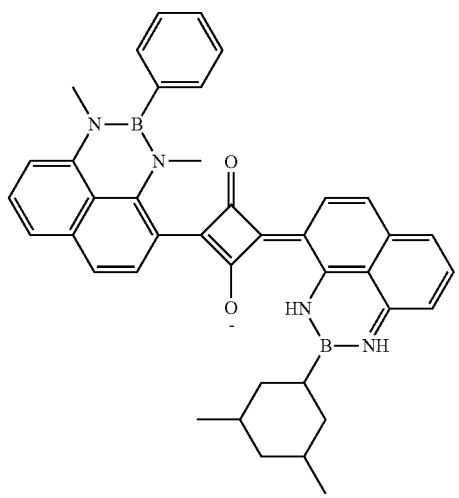

-continued
Ab-5
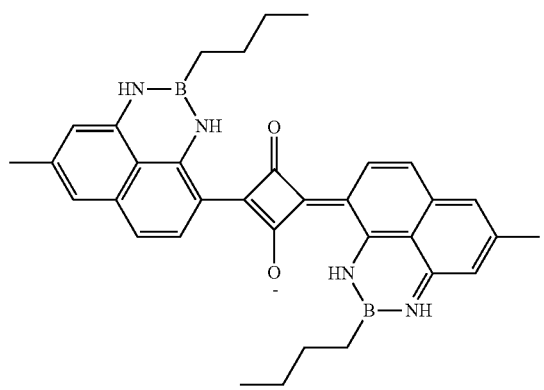
Ab-6
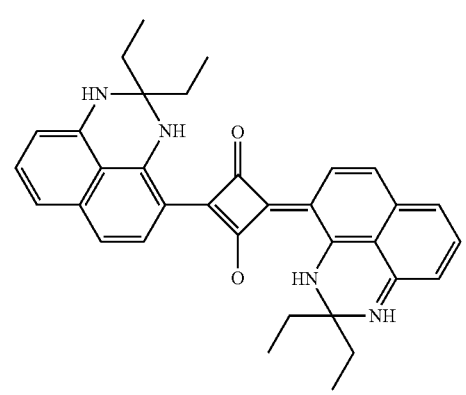
Ab-7
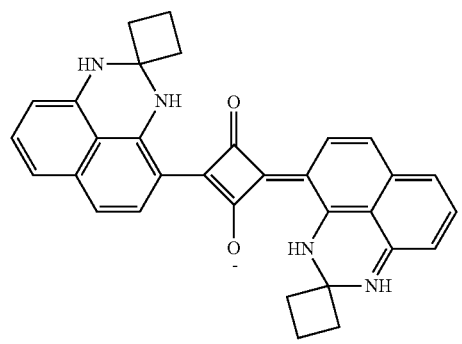
Ab-8
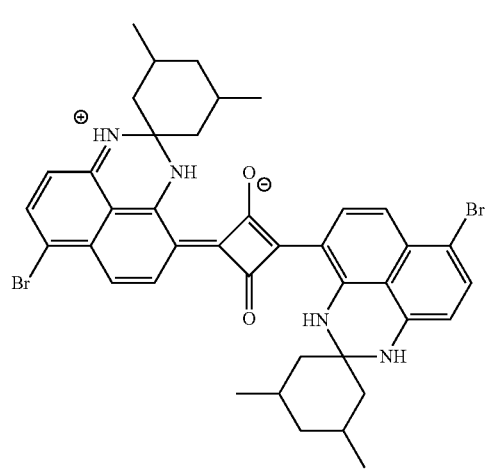
Ab-9
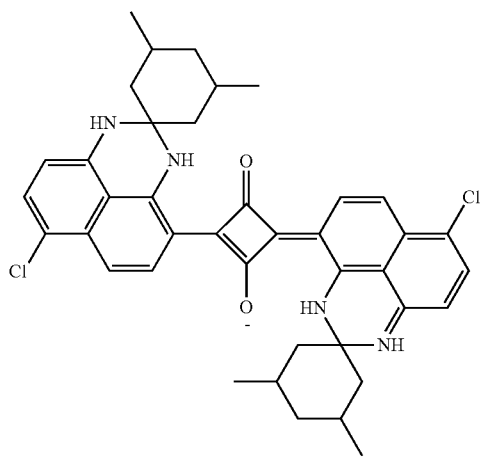
Ab-10
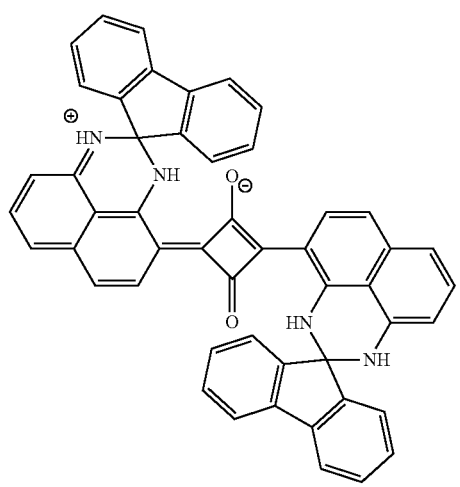
Ab-11
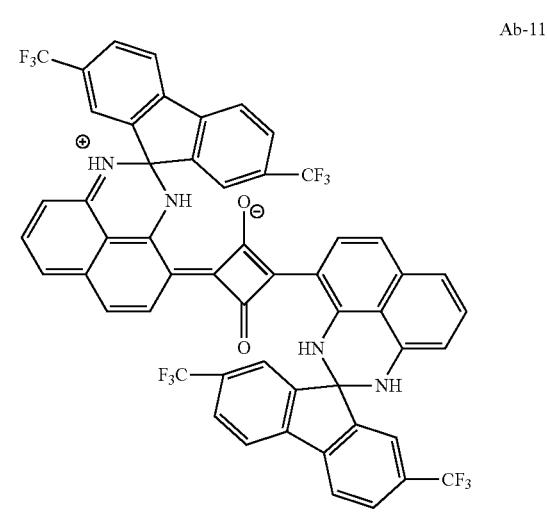

-continued
Ab-12
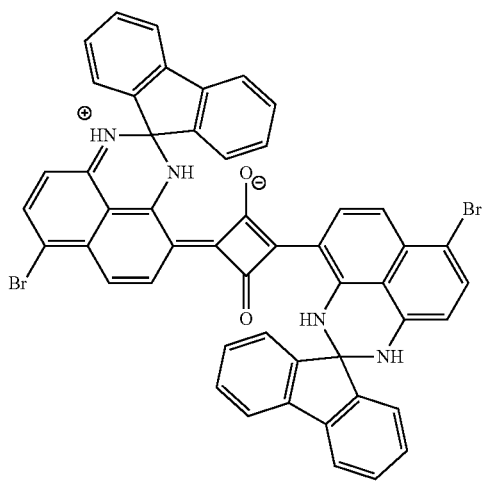
Ab-13
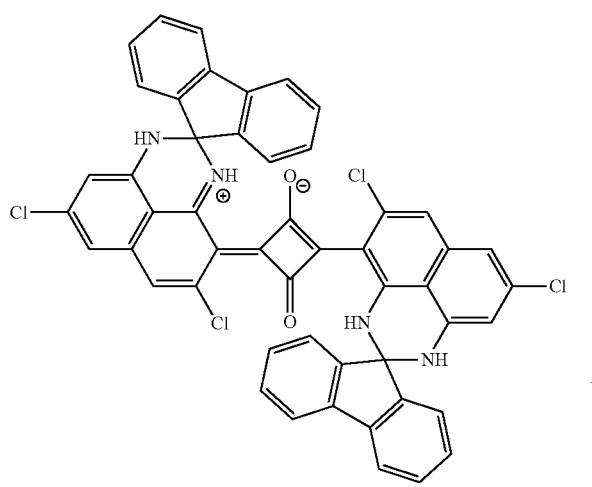
Ab-14
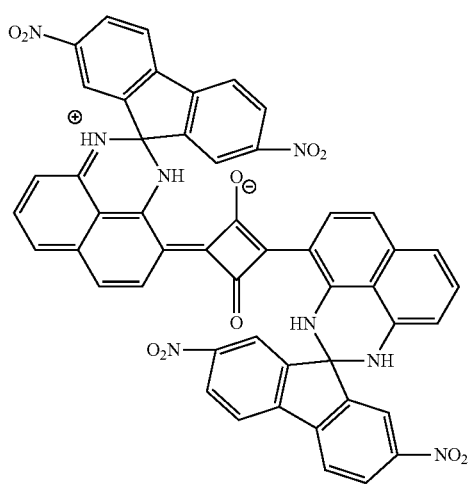
-continued
Ab-15
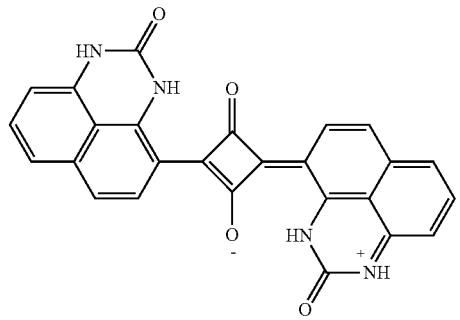
Ac-1
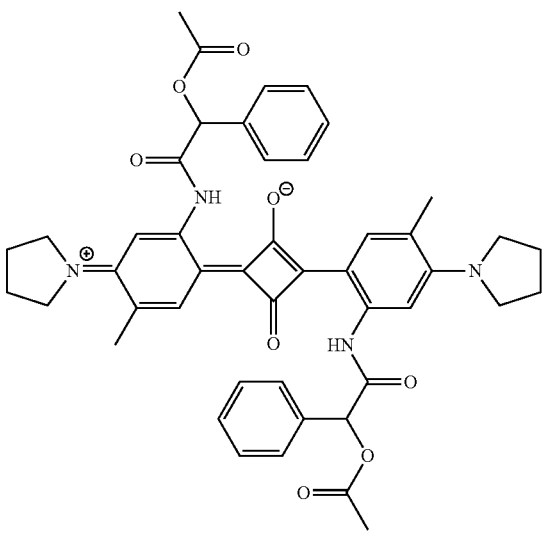
Ac-2
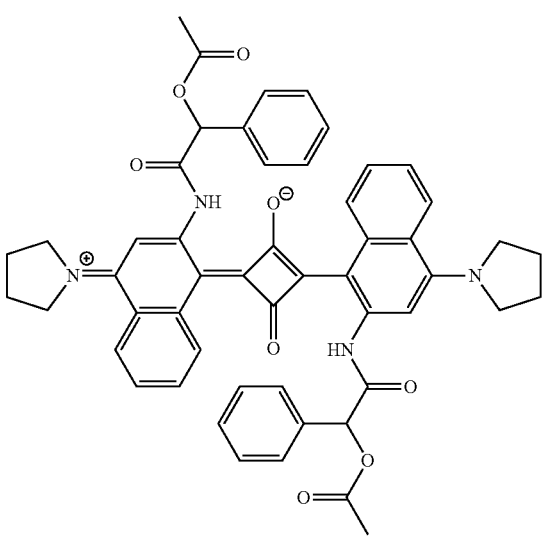

49
-continued
Ac-3
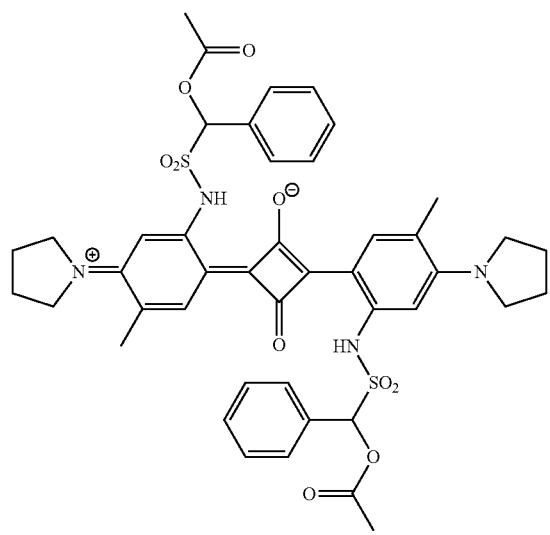
Ac-4
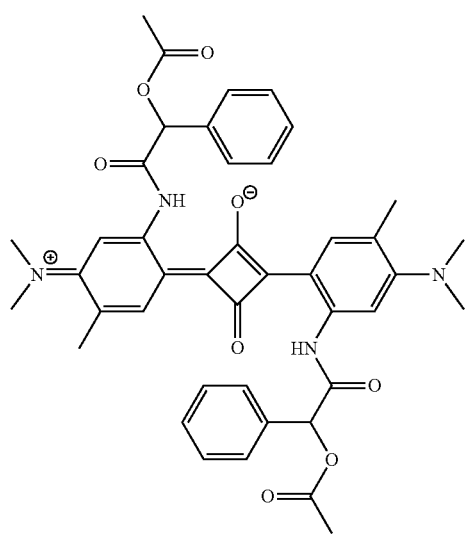
Ac-5
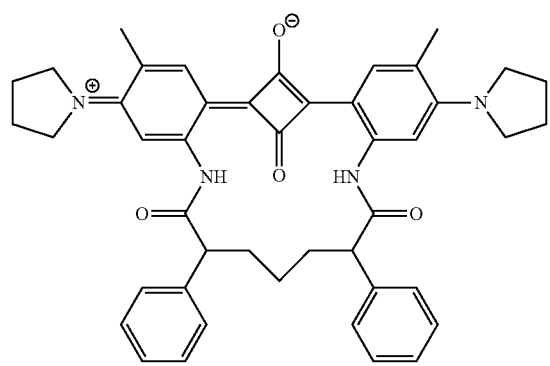
50
-continued
Ac-6
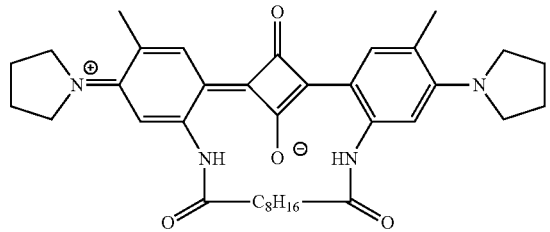
Ad-1
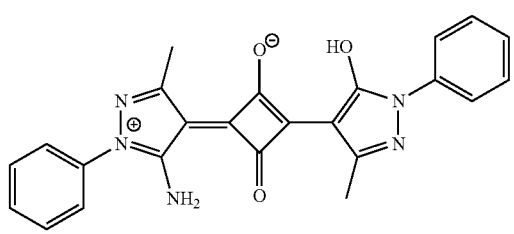
Ad-2
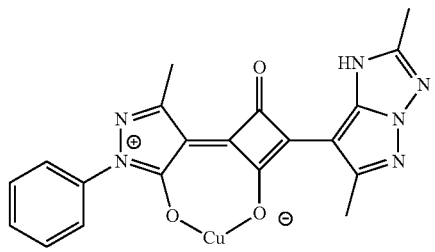
Ad-3
Ad-4
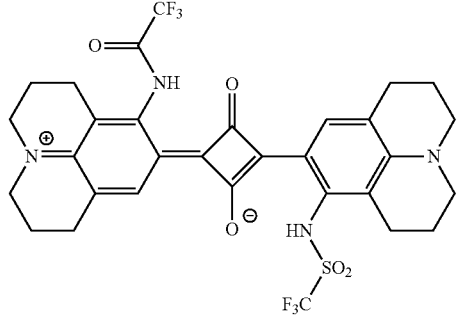

-continued
Ae-1
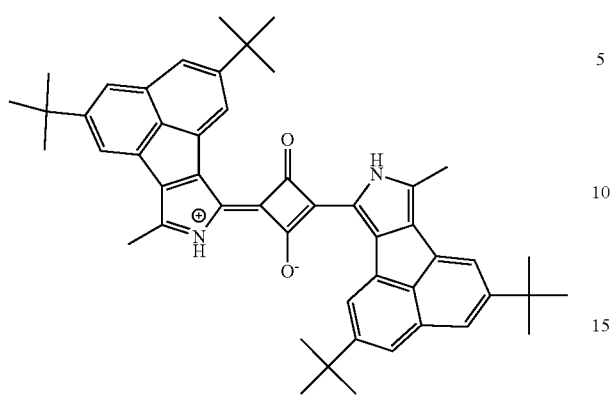
Ae-2
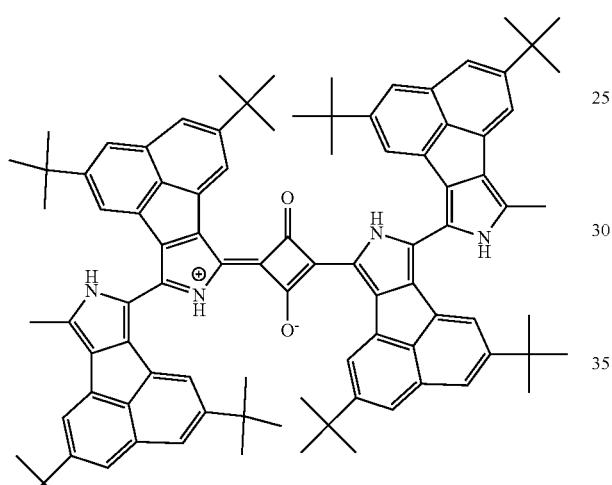
Ae-3
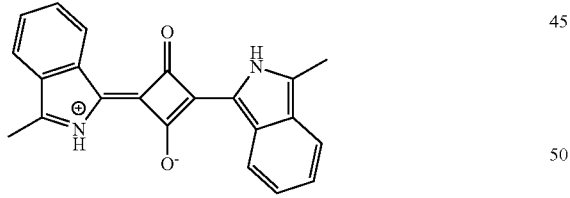
Ae-4
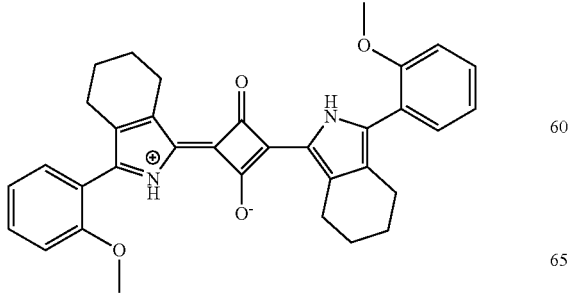
-continued
Af-1
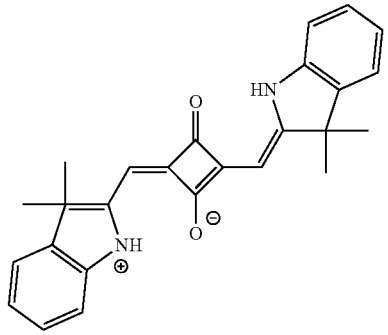
Af-2
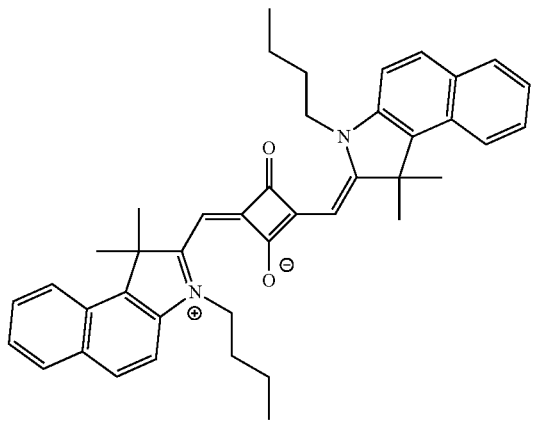
Af-3
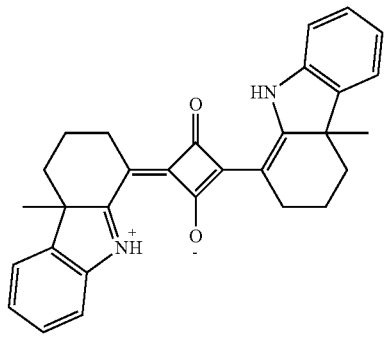
Af-4
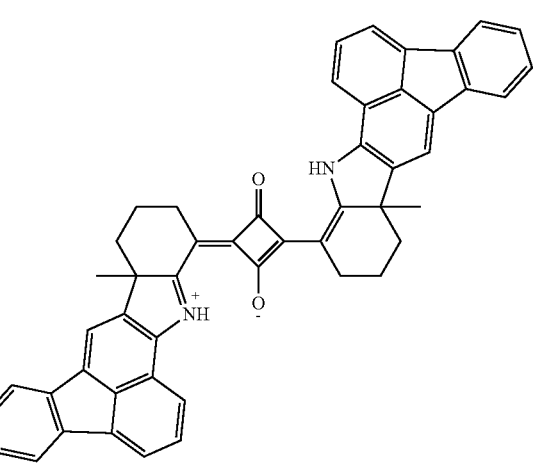

Af-5
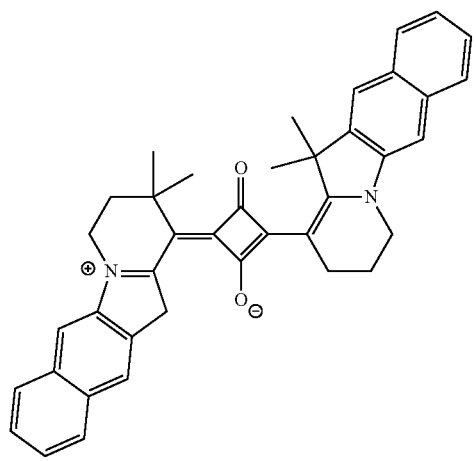
Af-6
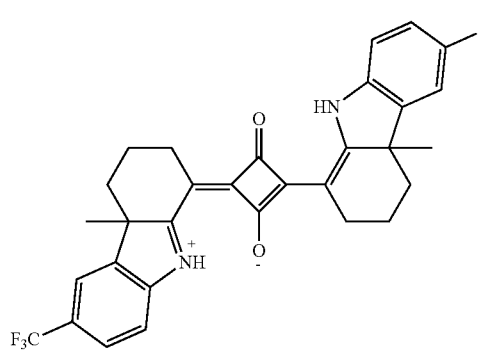
Af-7
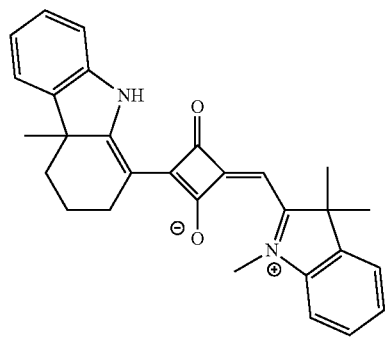
Ag-1
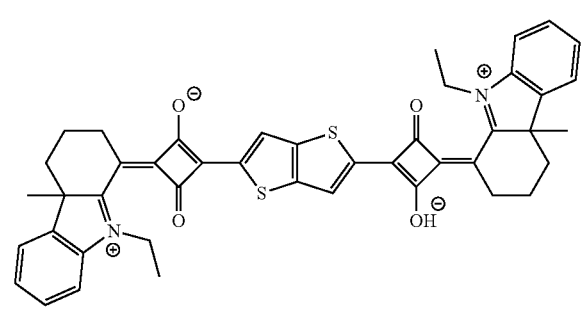
Ag-2
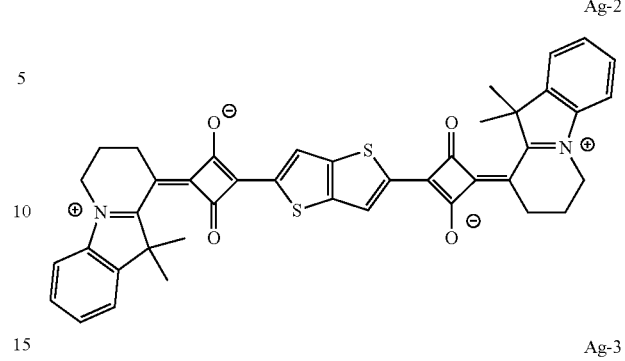
Ag-3
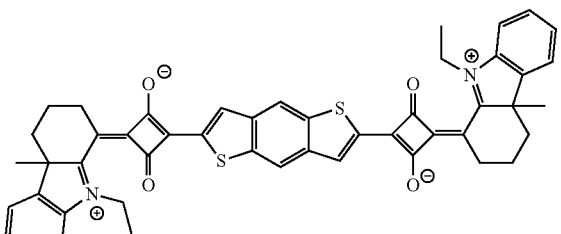
Ag-4
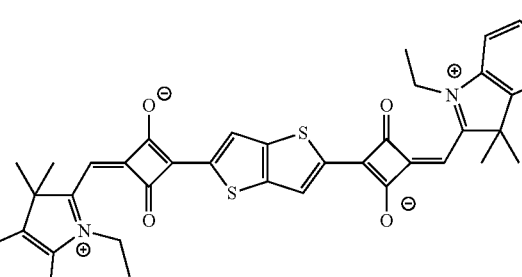
Ag-5
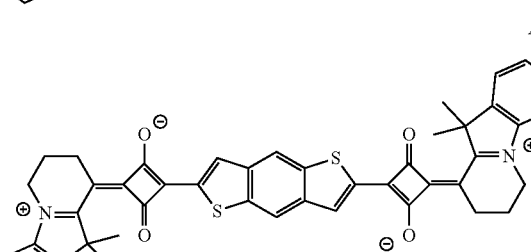
Ag-6
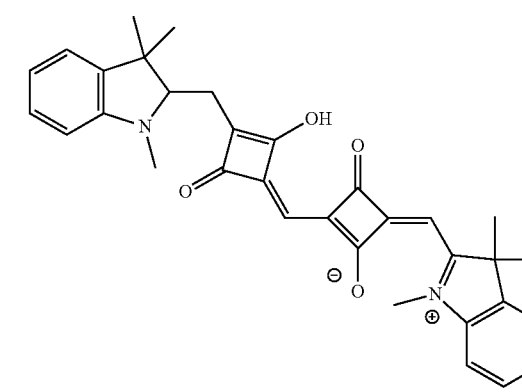

Ah-1
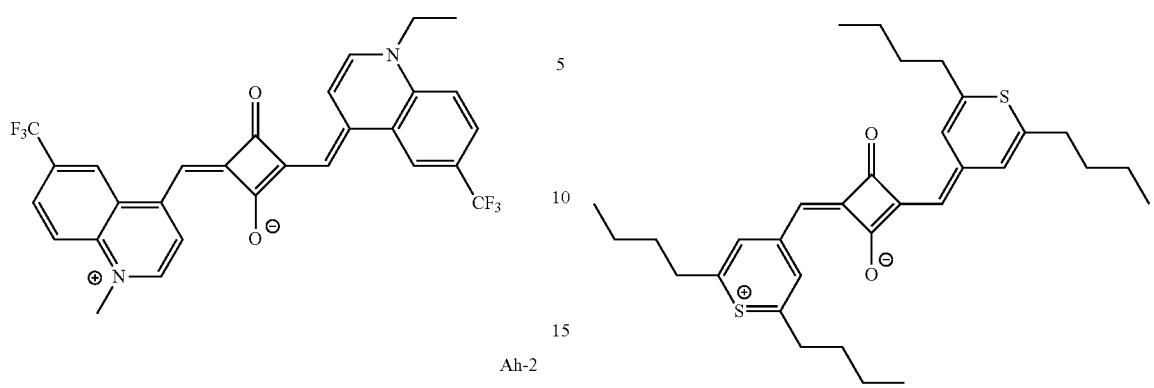
Ah-2
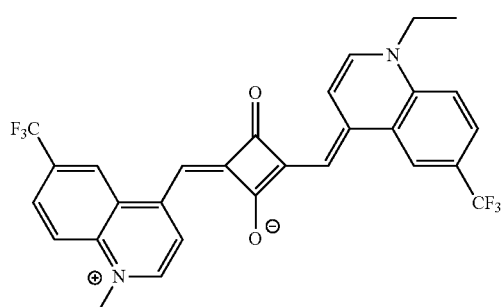
Ah-3
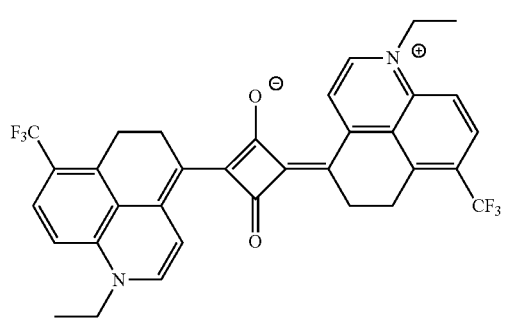
Ah-4
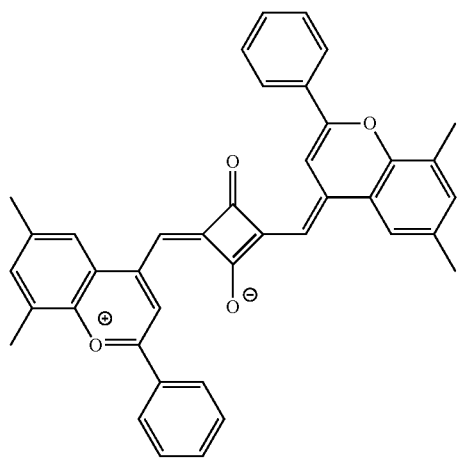
Ah-5
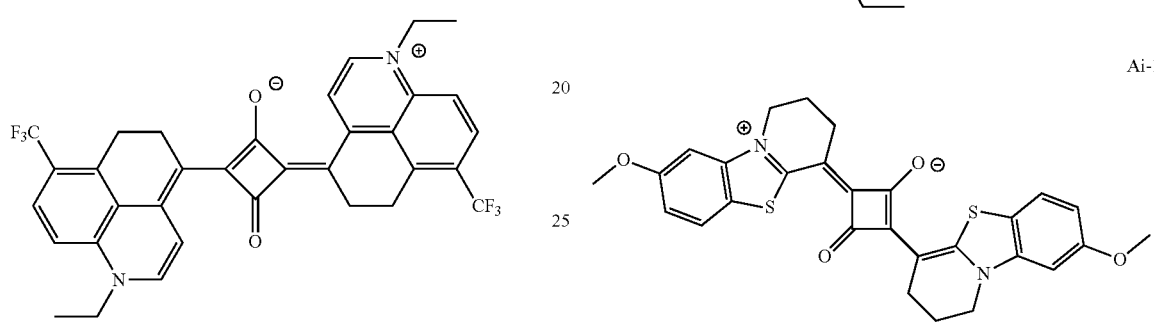
Ai-1
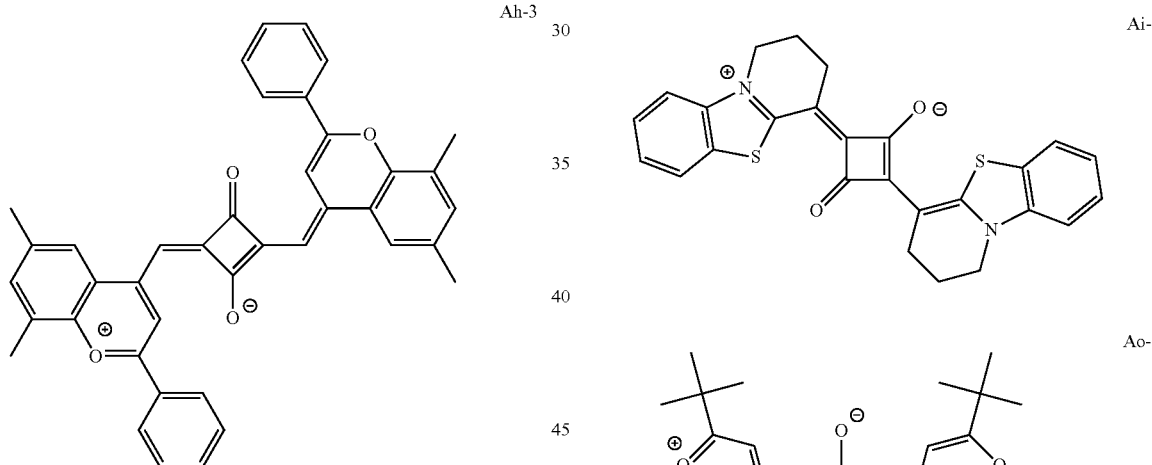
Ai-2
Ao-1
Ao-2
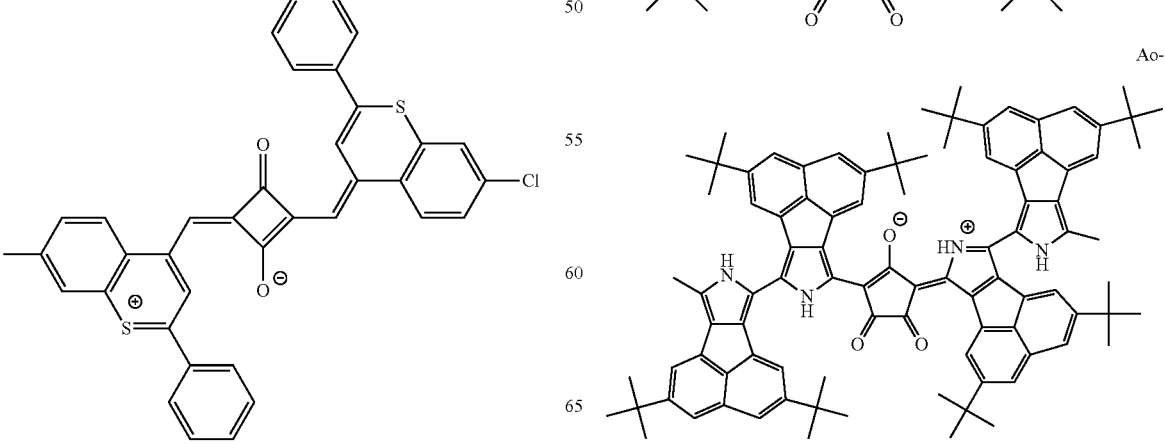

Ao-3
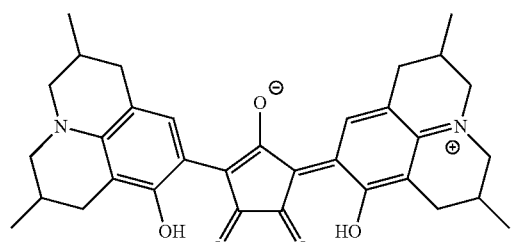
Ap-1
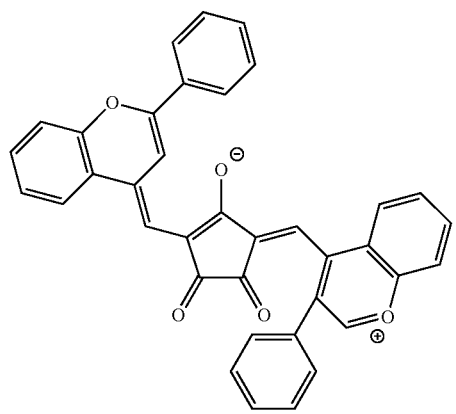
Ap-2
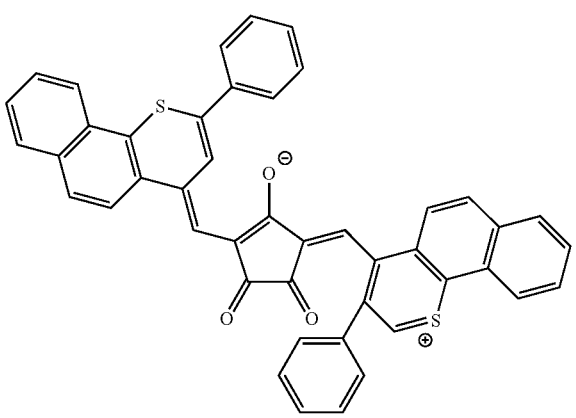
Aq-1
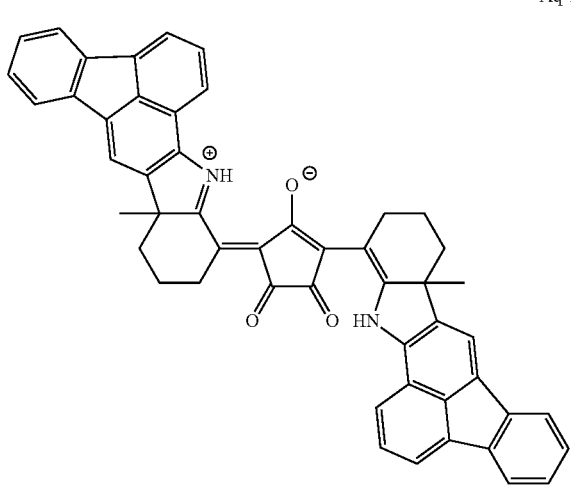
Aq-2
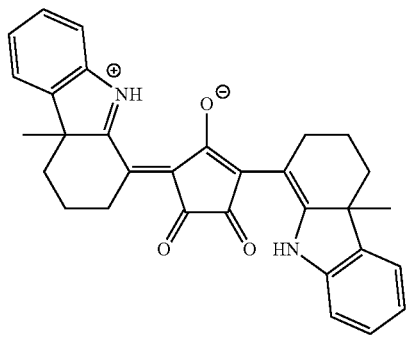
Aq-3
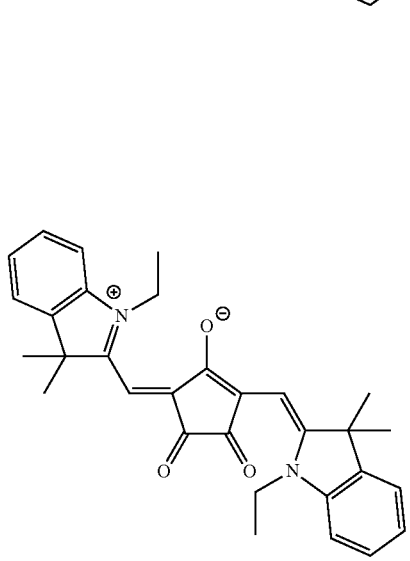
Aq-4
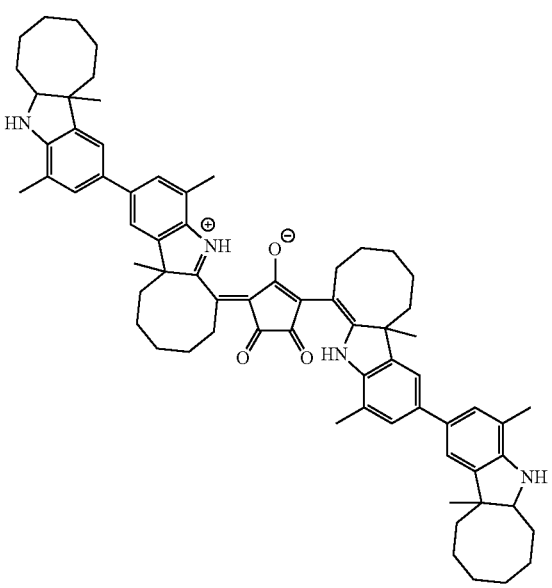

Ar-1

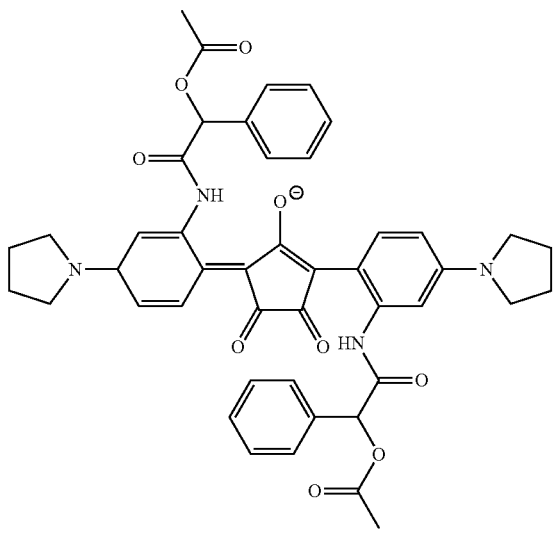

In the composition according to the embodiment of the present invention, the content of the near infrared absorbing pigment is preferably 1 mass % or higher, more preferably 5 mass % or higher, and still more preferably 10 mass % or higher with respect to the total solid content of the composition according to the embodiment of the present invention. In a case where the content of the near infrared absorbing pigment is 10 mass % or higher, the effect of the present invention is more remarkably exhibited. Furthermore, a film having excellent near infrared shielding properties is easily formed. In addition, the upper limit of the content of the near infrared absorbing pigment is preferably 80 mass % or lower, more preferably 70 mass % or lower, and still more preferably 60 mass % or lower. In a case where the content of the near infrared absorbing pigment is 60 mass % or lower, an effect in which a sufficient prescription likelihood can be secured can be expected. In the present invention, as the near infrared absorbing pigment, one kind may be used alone, or two or more kinds may be used. In a case where two or more thereof are used in combination, it is preferable that the total content thereof is within the above-described range.

<<Other Near Infrared Absorbers>>

The composition according to the embodiment of the present invention may further include near infrared absorbers (also referred to as "other near infrared absorbers") other than the near infrared absorbing pigment. Examples of the other near infrared absorbers include inorganic particles.

The shape of the inorganic particles is not particularly limited and may have a sheet shape, a wire shape, or a tube shape irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In a case where the composition according to the embodiment of the present invention contains other near infrared absorbers, the content of the other near infrared absorbers is preferably 0.01 to 50 mass % with respect to the total solid content of the composition. The lower limit is preferably 0.1 mass % or higher and more preferably 0.5 mass % or higher. The upper limit is preferably 30 mass % or lower, and more preferably 15 mass % or lower. In addition, the content of the other near infrared absorbers is preferably 1 to 99 mass % with respect to the total mass of the near infrared absorbing pigment and the other near infrared absorbers. The upper limit is preferably 80 mass % or lower, more preferably 50 mass % or lower, and still more preferably 30 mass % or lower.

In addition, it is also preferable that the composition according to the embodiment of the present invention does not substantially contain the other near infrared absorbers. Substantially not including the other near infrared absorbers represents that the content of the other near infrared absorbers is preferably 0.5 mass % or lower, more preferably 0.1 mass % or lower, and still more preferably 0 mass % with respect to the total mass of the near infrared absorbing pigment and the other near infrared absorbers.

<<Solvent>>

The composition according to the embodiment of the present invention contains a solvent. In the present invention, as the solvent, a material which satisfies the above-described expression (1) with the above-described near infrared absorbing pigment is selected and used. Examples of the solvent include an organic solvent. Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, and propylene glycol monopropyl ether acetate. Examples of ketones include methyl ethyl ketone, cyclohexanone, cyclopentanone, 2-heptanone, and 3-heptanone. Examples of aromatic hydrocarbons include toluene and xylene. In this case, it may be preferable that the content of the aromatic hydrocarbons (for example, benzene, toluene, xylene, or ethylbenzene) as the solvent is low (for example, 50 mass parts per million (ppm) or lower, 10 mass ppm or lower, or 1 mass ppm or lower with respect to the total amount of the organic solvent) in consideration of environmental aspects and the like.

In the present invention, as the solvent, one kind may be used alone, or two or more kinds may be used in combination. In a case where the composition according to the embodiment of the present invention includes two or more kinds of solvents, among the two or more kinds of solvents, the difference between a d value of a Hansen solubility parameter of a solvent with the highest d value of Hansen solubility parameter and a d value of a Hansen solubility parameter of a solvent with the lowest d value of Hansen solubility parameter is preferably 10 $MPa^{0.5}$ or less, more preferably 8 $MPa^{0.5}$ or less, and still more preferably 7 $MPa^{0.5}$ or less.

According to this aspect, an effect that the variation of the mixed d value in a case where one of the solvents volatilizes during storage at room temperature can be suppressed can be expected.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation, thin-film distillation, and the like) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure).

In addition, the solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 90 mass %, and still more preferably 30 to 90 mass % with respect to the total amount of the composition.

In addition, from the viewpoint of environmental regulation, it is preferable that the composition according to the embodiment of the present invention does not contain environmentally regulated substances substantially. In the present invention, the description "does not contain environmentally regulated substances substantially" means that the content of the environmentally regulated substances in the composition is 50 ppm by mass or less, preferably 30 ppm by mass or less, still more preferably 10 ppm by mass or less, and particularly preferably 1 ppm by mass or less. Examples of the environmentally regulated substances include alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method.

These compounds can be used as a solvent at the time of producing respective components used in the composition according to the embodiment of the present invention, and may be incorporated into the composition as a residual solvent. From the viewpoint of human safety and environmental considerations, it is preferable to reduce these substances as much as preferable.

Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, composition produced by mixing these compounds, or the like.

<<Resin>>

It is preferable that the composition according to the embodiment of the present invention contains a resin. The resin is blended, for example, in order to disperse particles of the near infrared absorbing pigment and the like in the composition or to be blended as a binder. The resin which is mainly used to disperse particles of the near infrared absorbing pigment and the like will also be called a dispersant. However, the above-described uses of the resin are merely exemplary, and the resin can be used for purposes other than the uses.

The weight-average molecular weight (Mw) of the resin is preferably 2,000 to 2,000,000. The upper limit is preferably 1,000,000 or lower and more preferably 500,000 or lower. The lower limit is preferably 3,000 or higher and more preferably 5,000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used.

A resin used in the present invention preferably includes a resin having an acid group and/or a hydroxyl group and more preferably includes a resin having an acid group. Examples of the acid group include a carboxyl group, a phosphate group, a sulfo group, and a phenolic hydroxyl group. Among these, a carboxyl group is preferable. Among these acid groups, one kind may be used alone, or two or more kinds may be used in combination. The resin having an acid group can also be used as an alkali-soluble resin.

As the resin having an acid group, a polymer including a repeating unit having a carboxyl group at a side chain is preferable. Specific examples thereof include alkali-soluble phenol resins such as a methacrylic acid copolymer, an acrylic acid copolymer, an itaconic acid copolymer, a crotonic acid copolymer, a maleic acid copolymer, a partially esterified maleic acid copolymer, and a novolac resin, an acidic cellulose derivative having a carboxyl group at a side chain thereof, and a resin obtained by adding an acid anhydride to a polymer having a hydroxyl group. In particular, a copolymer of (meth)acrylic acid and another monomer which is copolymerizable with the (meth)acrylic acid is suitably used as the alkali-soluble resin. Examples of another monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer.

In addition, as another monomer, N-position-substituted maleimide monomers such as N-phenylmaleimide or N-cyclohexylmaleimide can also be used. Among these monomers which are copolymerizable with the (meth)acrylic acid, one kind may be used alone, or two or more kinds may be used.

The resin having an acid group may further have a polymerizable group. Examples of the polymerizable group include a (meth)allyl group and a (meth)acryloyl group. Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRY-CURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer consisting of benzyl (meth)acrylate, (meth)acrylic acid, and another monomer can be preferably used. In addition, copolymers described in JP1995-140654A (JP-H07-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer including a repeating unit derived from a compound represented by Formula (ED1) and/or a compound represented by Formula (ED2) (hereinafter, these compounds will also be referred to as an "ether dimer") is also preferable.

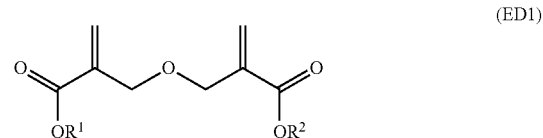

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. With regard to Formula (ED2), reference can be made to JP2010-168539A.

Specific examples of the ether dimer can be found in paragraph "0317" of JP2013-029760A, the content of which is incorporated herein by reference.

The resin having an acid group may include a repeating unit which is derived from a compound represented by Formula (X).

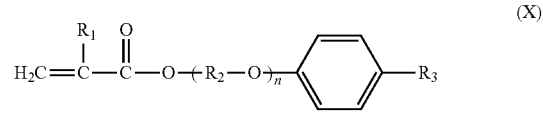

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product can also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

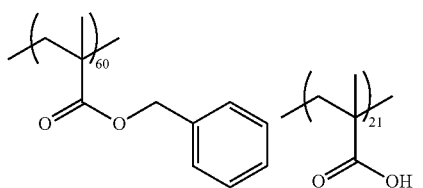
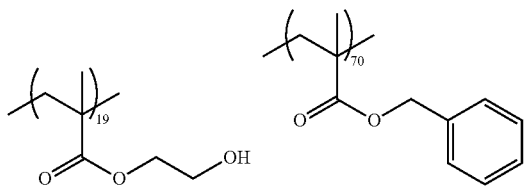
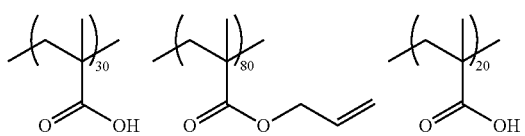
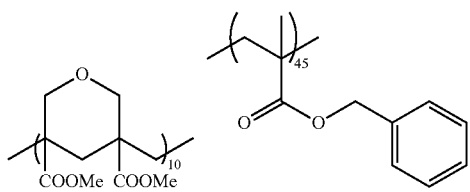
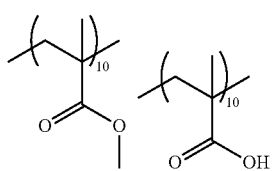
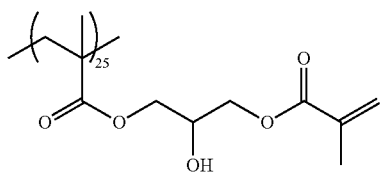

In the composition according to the embodiment of the present invention, as the resin, a resin having a repeating unit represented by Formulae (A3-1) to (A3-7) is also preferably used.

(A3-1)
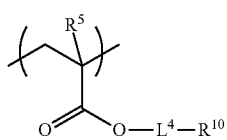

(A3-2)
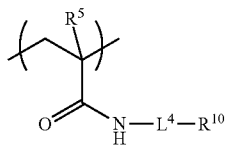

(A3-3)
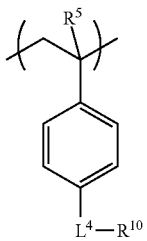

(A3-4)
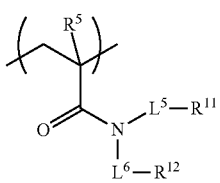

(A3-5)
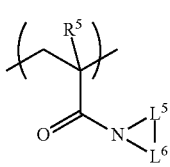

(A3-6)
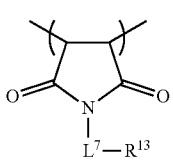

(A3-7)
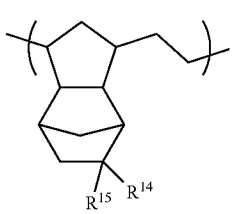

In the formulae, $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group. $R^{14}$ and $R^{15}$ each independently represent a hydrogen atom or a substituent.

The number of carbon atoms in the alkyl group represented by $R^5$ is preferably 1 to 5, more preferably 1 to 3, and particularly preferably 1. It is preferable that $R^5$ represents a hydrogen atom or a methyl group.

Examples of the divalent linking group represented by $L^4$ to $L^7$ include an alkylene group, an arylene group, —O—, —S—, —CO—, —COO—, —OCO—, —SO$_2$—, —NR$^{10}$— ($R^{10}$ represents a hydrogen atom or an alkyl group and preferably a hydrogen atom), and a group consisting of a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

The alkyl group represented by $R^{10}$ to $R^{13}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ to $R^{13}$ is preferably 6 to 18, more preferably 6 to 12, and still more preferably 6. It is preferable that $R^{10}$ represents a cyclic alkyl group or an aryl group. It is preferable that $R^{11}$ and $R^{12}$ represent a linear or branched alkyl group. It is preferable that $R^{13}$ represents a linear alkyl group, a branched alkyl group, or an aryl group.

Examples of the substituent represented by $R^{14}$ and $R^{15}$ include a halogen atom, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio group, an arylthio group, a heteroarylthio group, $-NR^{a1}R^{a2}$, $-COR^{a3}$, $-COOR^{a4}$, $-OCOR^{a5}$, $-NHCOR^{a6}$, $-CONR^{a7}R^{a8}$, $-NHCONR^{a9}R^{10}$, $-NHCOOR^{a11}$, $-SO_2R^{a12}$, $-SO_2OR^{a13}$, $-NHSO_2R^{a14}$, and $-SO_2NR^{a15}R^{a16}$. $R^{a1}$ to $R^{a16}$ each independently represent a hydrogen atom, an alkyl group, an alkenyl group, an alkynyl group, an aryl group, or a heteroaryl group. In particular, it is preferable that at least one of $R^{14}$ or $R^{15}$ represents a cyano group or $-COOR^{a4}$. It is preferable that $R^{a4}$ represents a hydrogen atom, an alkyl group, or an aryl group.

Examples of a commercially available product of the resin having a repeating unit represented by Formula (A3-7) include ARTON F4520 (manufactured by JSR Corporation).

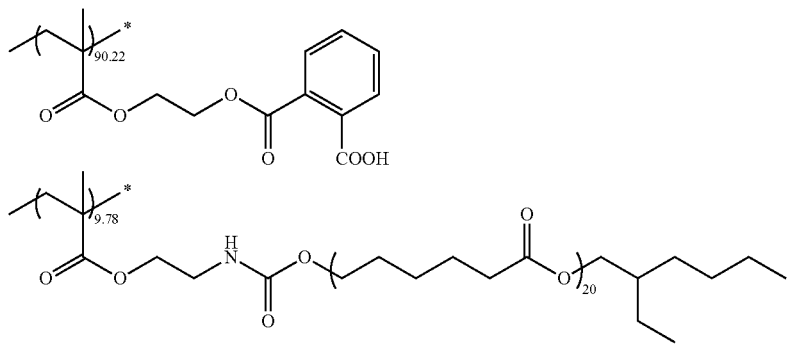

In addition, the details of the resin having a repeating unit represented by Formula (A3-7) can be found in paragraphs "0053" to "0075" and "0127" to "0130" of JP2011-100084A, the content of which is incorporated herein by reference.

The composition according to the embodiment of the present invention can also include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to a graft chain, dispersibility of the near infrared absorbing pigment and dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. Specific examples of the oligoimine dispersant are as follows. The following resin may also be a resin having an acid group (alkali-soluble resin). In addition, as the oligoimine dispersant, a resin described in paragraphs "0168" to "0174" of JP2012-255128A can be used.

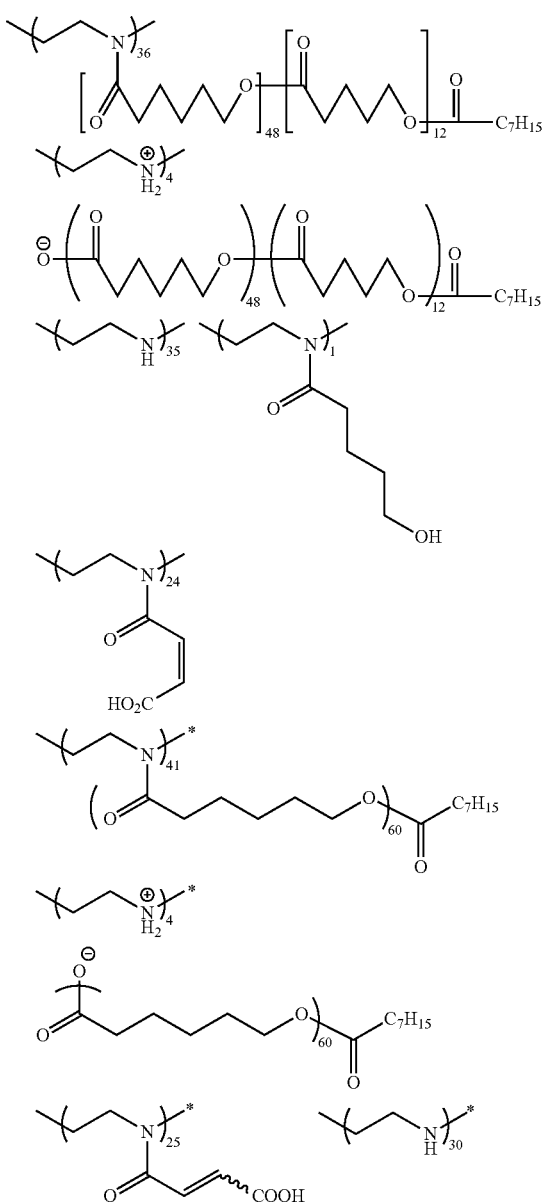

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

In the composition according to the embodiment of the present invention, the content of the resin is preferably 1 to 80 mass % with respect to the total solid content of the composition according to the embodiment of the present invention. The lower limit is preferably 5 mass % or higher and more preferably 7 mass % or higher.

The upper limit is preferably 50 mass % or lower, more preferably 40 mass % or lower, and still more preferably 30 mass % or lower.

In addition, in a case where the composition contains a dispersant as the resin, the content of the dispersant is preferably 0.1 to 40 mass % with respect to the total solid content of the composition. The upper limit is preferably 20 mass % or lower and more preferably 10 mass % or lower. The lower limit is preferably 0.5 mass % or higher and more preferably 1 mass % or higher. In addition, the content of the dispersant is preferably 1 to 100 parts by mass with respect to 100 parts by mass of the near infrared absorbing pigment. The upper limit is preferably 80 parts by mass or less and more preferably 75 parts by mass or less. The lower limit is preferably 2.5 parts by mass or more and more preferably 5 parts by mass or more.

<<Polymerizable Monomer>>

It is preferable that the composition according to the embodiment of the present invention contains a polymerizable monomer. The polymerizable monomer is preferably a compound derived from a polyhydric alcohol. As the polyhydric alcohol, a trihydric or more alcohol is preferable, a tri- to pentadecahydric alcohol is preferable, a tri- to decahydric alcohol is more preferable, and a tri- to hexahydric alcohol is still more preferable. In addition, as the polymerizable monomer, a compound which has a group having an ethylenically unsaturated bond is preferable, a compound which has two or more groups having an ethylenically unsaturated bond is more preferable, and a compound which has three or more groups having an ethylenically unsaturated bond is still more preferable. The upper limit of the number of groups having an ethylenically unsaturated bond in the polymerizable monomer is, for example, preferably 15 or less and more preferably 10 or less. Examples of the group having an ethylenically unsaturated bond include a vinyl group, a styrene group, a (meth)allyl group, and a (meth)acryloyl group. Among these, a (meth)acryloyl group is preferable.

The molecular weight of the polymerizable monomer is preferably 5000 or lower, more preferably 3000 or lower, still more preferably 2000 or lower, and still more preferably 1500 or lower. The lower limit is, for example, preferably 100 or higher and more preferably 250 or higher. As the polymerizable monomer, a (meth)acrylate compound having 3 to 15 functional groups is preferable, a (meth)acrylate compound having 3 to 10 functional groups is more preferable, and a (meth)acrylate compound having 3 to 6 functional groups is still more preferable.

As the polymerizable monomer, a compound which has at least one group selected from an acid group and a hydroxyl group and the group having an ethylenically unsaturated bond is also preferable. Among these, from the reason that storage stability of the composition is good, and further, solvent resistance of the obtained film is more easily improved, it is still more preferable that the polymerizable monomer is a compound which has an acid group and the group having an ethylenically unsaturated bond. Examples of the acid group include a carboxyl group, a sulfo group, and a phosphate group. Among these, a carboxyl group is preferable.

An acid value of the polymerizable monomer is preferably 1.0 mmol/g or higher, more preferably 1.5 mmol/g or higher, and still more preferably 2.0 mmol/g or higher. In a case where the acid value of the polymerizable monomer is within the above-described range, storage stability of the composition and light resistance and solvent resistance of the obtained film are particularly excellent. In addition, a hydroxyl number of the polymerizable monomer is preferably 1.5 mmol/g or higher, more preferably 2.0 mmol/g or higher, and still more preferably 2.5 mmol/g or higher. In a case where the hydroxyl number of the polymerizable monomer is within the above-described range, the permeation of the oxygen is suppressed by hydrophilizing of the film and light resistance is further improved.

A C=C value of the polymerizable monomer is preferably 5 mmol/g or higher, more preferably 6 mmol/g or higher, and still more preferably 7 mmol/g or higher. In a case where the C=C value of the polymerizable monomer is within the above-described range, a film having sufficient strength is easily obtained. The C=C value of the polymerizable monomer is obtained by dividing the number of groups having an ethylenically unsaturated bond included in one molecule of the polymerizable monomer by the molecular weight of the polymerizable monomer.

It is preferable that the polymerizable monomer is a compound represented by Formula (M-1).

(In Formula (M-1), $A^1$ represents a hydroxyl group or an acid group, $L^1$ represents a (n1+n2) valent group, $B^1$ represents a group having an ethylenically unsaturated bond, n1 represents an integer of 0 or more, n2 represents an integer of 1 or more, n1+n2 is an integer of 3 to 15)

Examples of the acid group represented by $A^1$ include a carboxyl group, a sulfo group, and a phosphate group. Among these, a carboxyl group is preferable. Examples of the (n1+n2) valent group represented by $L^1$ include a hydrocarbon group, a heterocyclic group, —O—, —S—, —NR—, —CO—, —COO—, —OCO—, —SO$_2$—, and a group consisting of a combination of the above-described groups. R represents a hydrogen atom, an alkyl group, or an aryl group and preferably a hydrogen atom. The hydrocarbon group may be an aliphatic hydrocarbon group or an aromatic hydrocarbon group. In addition, the aliphatic hydrocarbon group may be cyclic or acyclic. In addition, the aliphatic hydrocarbon group may be a saturated aliphatic hydrocarbon group or an unsaturated aliphatic hydrocarbon group. The hydrocarbon group may have a substituent or may be unsubstituted. In addition, the cyclic aliphatic hydrocarbon group and the aromatic hydrocarbon group may be a monocyclic or a fused ring. The heterocyclic group may be a monocyclic or a fused ring. It is preferable that the heterocyclic group is a 5-membered or 6-membered ring. The heterocyclic group may be an aliphatic heterocyclic group or an aromatic heterocyclic group. In addition, examples of the heteroatom constituting the heterocyclic group include a nitrogen atom, an oxygen atom, and a sulfur atom. It is preferable that $L^1$ represents a group including at least a hydrocarbon group. The number of carbon atoms constituting $L^1$ is preferably 3 to 100 and more preferably 6 to 50. Examples of the group having an ethylenically unsaturated bond represented by $B^1$ include a vinyl group, a styrene group, a (meth)allyl group, and a (meth)acryloyl group. Among these, a (meth)acryloyl group is preferable. n1 is preferably 0 to 2 and more preferably 0 or 1. n2 represents preferably 2 or more and more preferably 3 or more. The upper limit of n2 is preferably 15 or lower, more preferably 10 or lower, still more preferably 6 or lower, and particularly preferably 4 or lower.

Specific examples of the polymerizable monomer include compounds having the following structures.

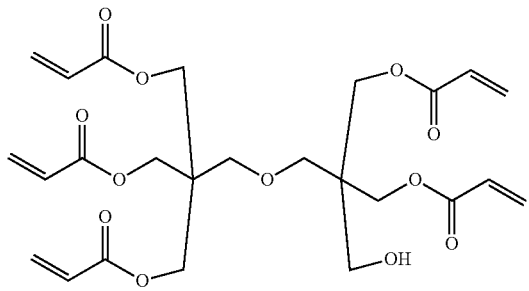

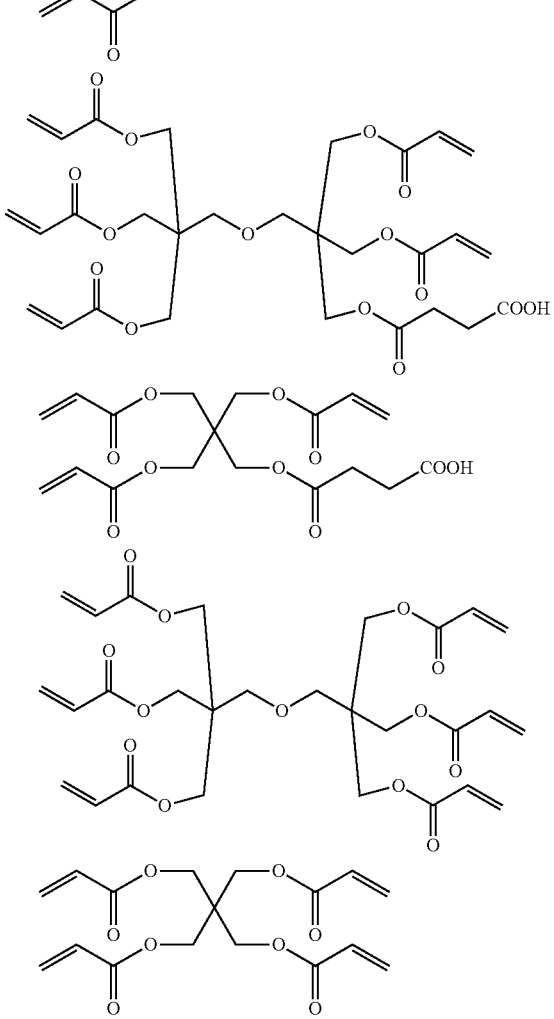

As the polymerizable monomer, a compound having an alkyleneoxy group is also preferable. As the compound having an alkyleneoxy group, a compound having an ethyleneoxy group and/or a propyleneoxy group is preferable, a compound having an ethyleneoxy group is more preferable, and a trifunctional to hexafunctional (meth)acrylate compound having 4 to 20 ethyleneoxy groups is still more preferable.

As the polymerizable monomer, compounds represented by Formulae (MO-1) to (MO-5) can also be preferably used. In a case where T in the formulae represents an oxyalkylene group, a terminal thereof on a carbon atom side is bonded to R.

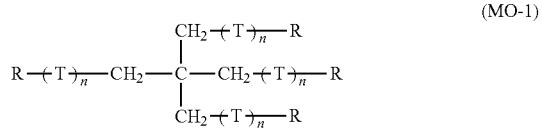

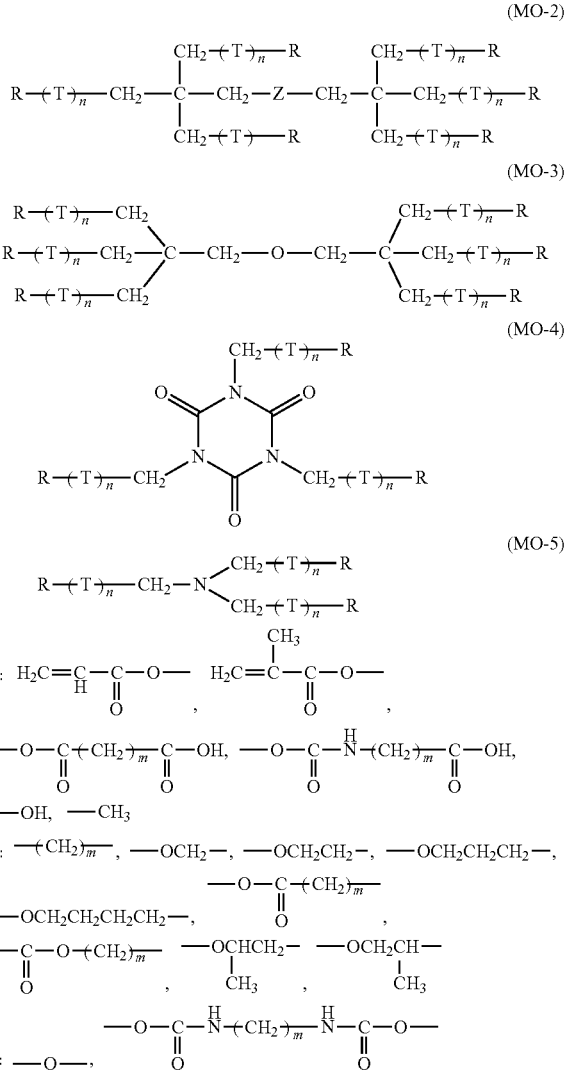

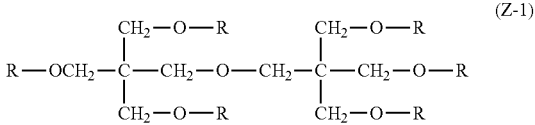

In Formula (Z-1), all of six R's represent a group represented by Formula (Z-2), or one to five R's among the six R's represent a group represented by Formula (Z-2) and the remaining R's represent a group represented by Formula (Z-3), an acid group, or a hydroxyl group.

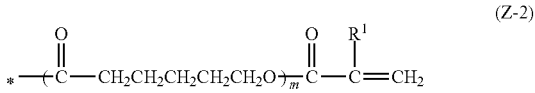

In Formula (Z-2), $R^1$ represents a hydrogen atom or a methyl group, m represents a number of 1 or 2, and "*" represents a direct bond.

$$*-\overset{O}{\overset{\|}{C}}-\overset{R^1}{\overset{|}{C}}=CH_2 \quad (Z\text{-}3)$$

In Formula (Z-3), $R^1$ represents a hydrogen atom or a methyl group, and "*" represents a direct bond.

As the polymerizable monomer, a compound represented by Formula (Z-4) or (Z-5) can also be used.

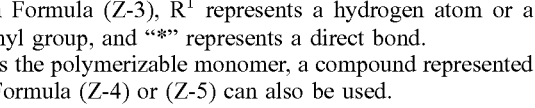

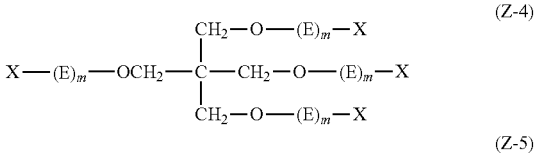

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In Formula (Z-4), the total number of (meth)acryloyl groups is 3 or 4, m's each independently represent an integer of 0 to 10, and the sum of m's is an integer of 0 to 40. In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4. In addition, the sum of m's is preferably an integer of 2 to 40, more preferably an integer of 2 to 16, and still more preferably an integer of 4 to 8. In Formula (Z-5), n represents preferably an integer of 0 to 6 and more preferably an integer of 0 to 4. In addition, the sum of n's is preferably an integer of 3 to 60, more preferably an integer of 3 to 24, and still more In the formulae, n represents 0 to 14, and m represents 1 to 8. A plurality of R's and a plurality of T's which are present in one molecule may be the same as or different from each other. At least one of a plurality of R's which are present in each of the compounds represented by Formulae (MO-1) to (MO-5) represents a group represented by —OC(=O)CH=CH₂ or —OC(=O)C(CH₃)=CH₂. Specific examples of the polymerizable monomers represented by Formulae (MO-1) to (MO-5) include compounds described in paragraphs "0248" to "0251" of JP2007-269779A.

In addition, as the polymerizable monomer, a compound having a caprolactone structure is also preferably used. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. As the compound having a caprolactone structure, a compound represented by Formula (Z-1) is preferable.

preferably an integer of 6 to 12. In addition, it is preferable that, in —((CH$_2$)$_y$CH$_2$O)— or —((CH$_2$)$_y$CH(CH$_3$)O)— of Formula (Z-4) or (Z-5), a terminal thereof on an oxygen atom side is bonded to X.

In a case where the composition according to the embodiment of the present invention contains a polymerizable monomer, it is preferable that the near infrared absorbing pigment and the polymerizable monomer satisfy the following expression (10). According to this aspect, an effect that movement of the near infrared absorbing pigment and the like to another layer can be suppressed can be expected.

$$|d1-d10| \geq 0.3 \text{ MPa}^{0.5} \quad (10)$$

d1 is a d value of a Hansen solubility parameter of the near infrared absorbing pigment, d10 is a d value of a Hansen solubility parameter of the polymerizable monomer included in the composition, and in a case where the composition includes two or more kinds of polymerizable monomers, d10 is a mass-average value of d values of Hansen solubility parameters of the two or more kinds of polymerizable monomers.

The value of |d1−d10| in the expression (10) is preferably 0.4 MPa$^{0.5}$ or more, more preferably 0.5 MPa$^{0.5}$ or more, still more preferably 0.7 MPa$^{0.5}$ or more, and particularly preferably 0.9 MPa$^{0.5}$ or more. In addition, from the viewpoint of compatibility between the polymerizable monomer and other components included in the composition, such as the solvent, the value of |d1−d0| in the expression (10) is preferably 10 MPa$^{0.5}$ or less, preferably 9 MPa$^{0.5}$ or less, and preferably 8 MPa$^{0.5}$ or less.

In the composition according to the embodiment of the present invention, the content of the polymerizable monomer is preferably 5 to 60 mass % with respect to the total solid content of the composition. The lower limit is preferably 8 mass % or higher and more preferably 10 mass % or higher. The upper limit is preferably 55 mass % or lower, and more preferably 50 mass % or lower.

<<Radical Polymerization Initiator>>

The composition according to the embodiment of the present invention can contain a radical polymerization initiator. The radical polymerization initiator is not particularly limited and can be appropriately selected from known radical polymerization initiators. Examples of the radical polymerization initiator include photoradical polymerization initiators and thermal radical polymerization initiators. Among these, photoradical polymerization initiators are preferable. As the photoradical polymerization initiators, a compound having photosensitivity to light in a range from an ultraviolet range to a visible range is preferable.

Examples of the radical polymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the radical polymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxy ketone compound, an α-aminoketone compound, and an acylphosphine compound is more preferable, and an oxime compound is still more preferable. The details of the radical polymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

As the oxime compound, a compound described in JP2001-233842A, a compound described in JP2000-080068A, a compound described in JP2006-342166A, or a compound described in JP2016-021012A can be used. Examples of the oxime compound which can be suitably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be suitably used. In addition, TR-PBG-304 (manufactured by Changzhou Tronly New Electronic Materials Co., Ltd.) and ADEKA OPTOMER N-1919 (manufactured by Adeka Corporation, a photopolymerization initiator 2 described in JP2012-014052A) can also be used. In addition, as the oxime compound, it is also preferable to use a compound having no colorability or a compound having high transparency and being difficult to discolor. Examples of a commercially available product include ADEKA ARKLS NCI-730, NCI-831, and NCI-930 (all of which are manufactured by Adeka Corporation).

In the present invention, an oxime compound having a fluorene ring can also be used as the radical polymerization initiator. Specific examples of the oxime compound having a fluorene ring include a compound described in JP2014-137466A. The content is incorporated herein by reference.

In the present invention, an oxime compound having a fluorine atom can also be used as the radical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the radical polymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by Adeka Corporation).
Specific examples of the oxime compound which are preferably used in the present invention are shown below, but the present invention is not limited thereto.
(C-1)
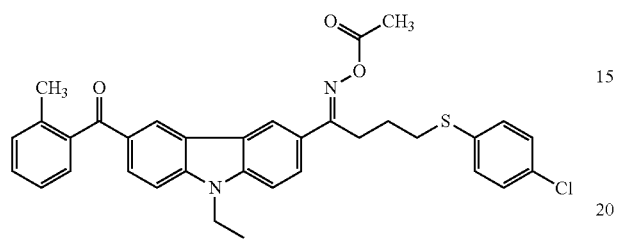
(C-2)
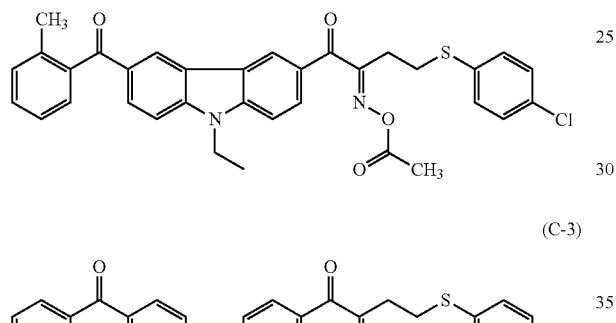
(C-3)
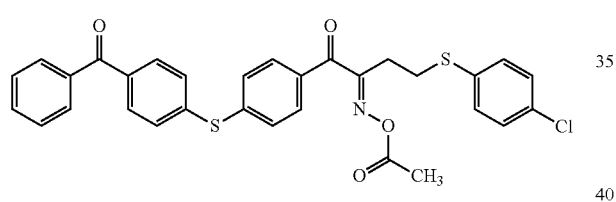
(C-4)
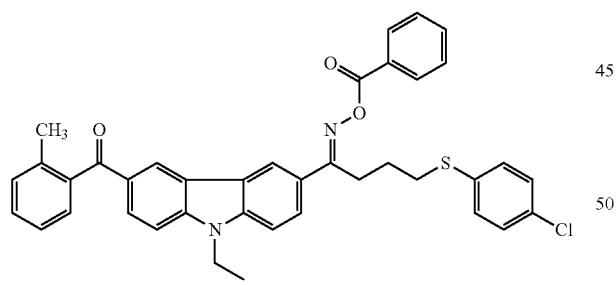
(C-5)
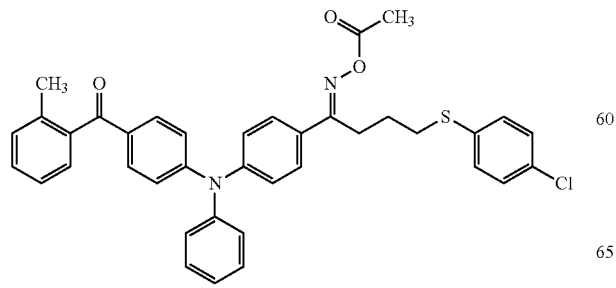
(C-6)
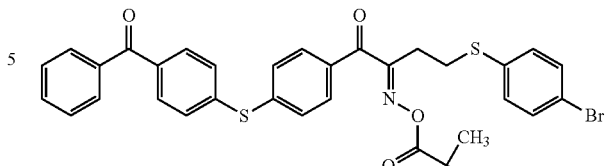
(C-7)
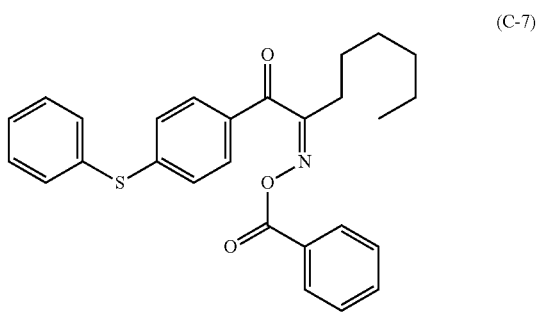
(C-8)
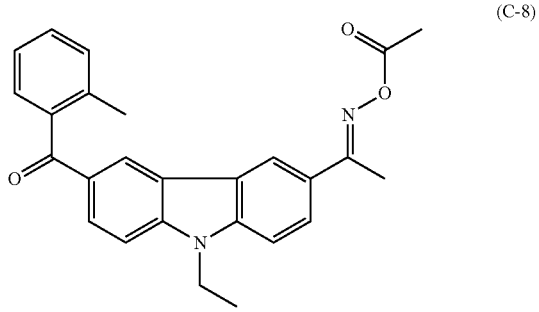
(C-9)
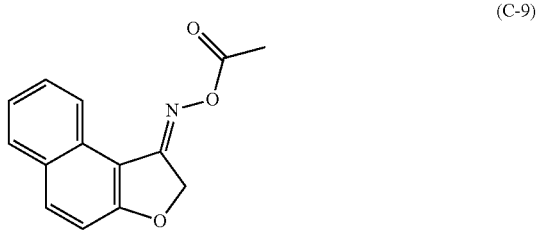
(C-10)
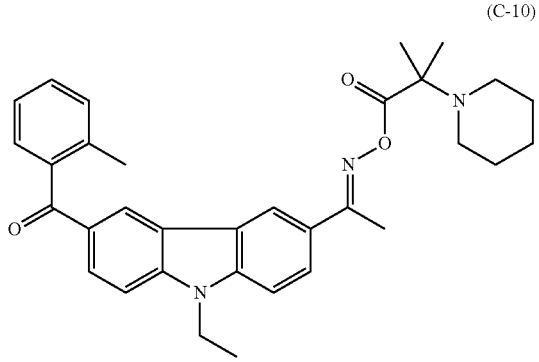

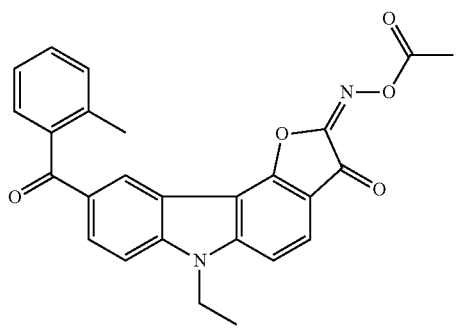
(C-11)

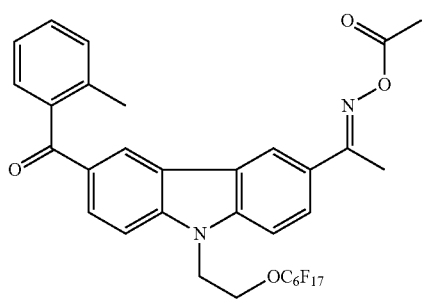
(C-12)

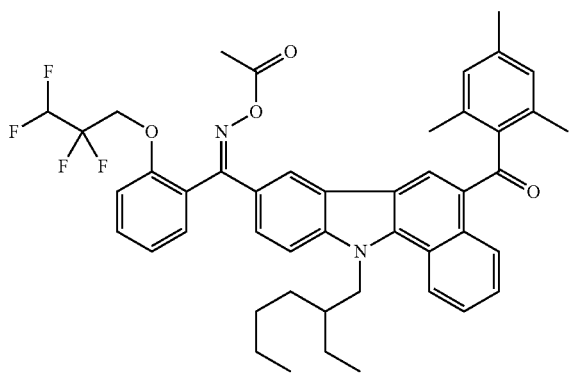
(C-13)

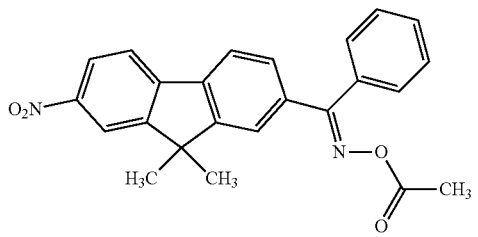
(C-14)

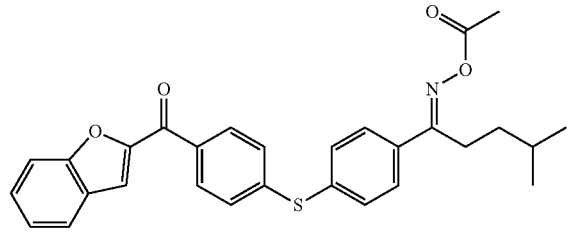
(C-15)

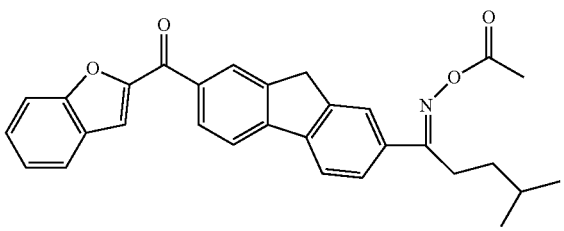
(C-16)

As the oxime compound, a compound having a maximum absorption wavelength in a range of 350 to 500 nm is preferable, and a compound having a maximum absorption wavelength in a range of 360 nm to 480 nm is more preferable.

In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of the compound can be measured using a known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, a bifunctional, or trifunctional or higher photoradical polymerization initiator may be used as the photoradical polymerization initiator. By using such a photoradical polymerization initiator, two or more radicals are generated from one molecule of the photoradical polymerization initiator, as a result, good sensitivity is obtained. In addition, in a case of using a compound having an asymmetric structure, crystallinity is reduced so that solubility in a solvent or the like is improved, precipitation becomes difficult over time, and temporal stability of the composition can be improved. Specific examples of such a photoradical polymerization initiator include the dimers of the oxime compounds described in JP2010-527339A, JP2011-524436A, WO2015/004565A, paragraphs "0412" to "0417" of JP2016-532675A, and paragraphs "0039" to "0055" of WO2017/033680A, the compound (E) and the compound (G) described in JP2013-522445A, Cmpd 1 to 7 described in WO2016/034963A, the oxime ester photoinitiators described in paragraph "0007" of JP2017-523465A, the photoinitiators described in paragraphs "0020" to "0033" of JP2017-167399A, and the photopolymerization initiator (A) described in paragraphs "0017" to "0026" of JP2017-151342A.

It is preferable that the radical polymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the radical polymerization initiator is preferably 0.1 to 50 mass %, more preferably 0.5 to 30 mass %, and still more preferably 1 to 20 mass % with respect to the total solid content of the composition. In a case where the content of the radical polymerization initiator is within the above-described range, developability is excellent. The composition according to the embodiment of the present invention may include one kind of radical polymerization initiator or two or more kinds thereof. In a case where the composition includes two or more kinds of radical polymerization initiators, it is preferable that the total content of thereof is within the above-described range.

<<Epoxy Compound>>

The composition according to the embodiment of the present invention can contain a compound having an epoxy group (hereinafter, also referred to as "epoxy compound"). By including an epoxy compound in the composition according to the embodiment of the present invention, a film having excellent solvent resistance is easily obtained. Examples of the epoxy compound include a monofunctional or polyfunctional glycidyl ether compound, a polyfunctional aliphatic glycidyl ether compound, a compound having an alicyclic epoxy group, and a resin including a repeating unit having an epoxy group.

It is preferable that the epoxy compound is a compound having 1 to 100 epoxy groups in one molecule. The upper limit of the number of epoxy groups is, for example, 10 or less or 5 or less. The lower limit is preferably 2 or more.

The epoxy compound may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the epoxy compound is preferably 2000 to 100000. The upper limit of the weight-average molecular weight is preferably 10000 or lower, more preferably 5000 or lower, and still more preferably 3000 or lower.

Examples of a commercially available product of the epoxy compound include EHPE 3150 (manufactured by Daicel Corporation), EPICLON N-695 (manufactured by DIC Corporation), ADEKA GLYCILOL ED-505 (manufactured by Adeka Corporation, an epoxy group-containing monomer), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer). In addition, as the epoxy compound, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference.

In a case where the composition according to the embodiment of the present invention contains an epoxy compound, the content of the epoxy compound is preferably 0.1 mass % or higher and more preferably 0.5 mass % or higher with respect to the total solid content of the composition.

The upper limit is preferably 60 mass % or lower, more preferably 50 mass % or lower, and still more preferably 40 mass % or lower.

<<Chromatic Colorant>>

The composition according to the embodiment of the present invention can contain a chromatic colorant. In the present invention, "chromatic colorant" denotes a colorant other than a white colorant and a black colorant. It is preferable that the chromatic colorant is a colorant having an absorption in a wavelength range of 400 nm or longer and shorter than 650 nm.

In the present invention, the chromatic colorant may be a pigment or a dye. As the pigment, an organic pigment is preferable. Examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, known dyes can be used without any particular limitation. As a chemical structure, dyes such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, and a pyrromethene dye can be used. In addition, a polymer of the above-described dyes may be used. In addition, dyes described in JP2015-028144A and JP2015-034966A can also be used.

In a case where the composition according to the embodiment of the present invention contains a chromatic colorant, the content of the chromatic colorant is preferably 1 to 50 mass % with respect to the total solid content of the composition according to the embodiment of the present invention. In a case where the composition according to the embodiment of the present invention includes two or more kinds of chromatic colorants, it is preferable that the total content of the two or more kinds of chromatic colorants is within the above-described range.

In addition, it is also preferable that the composition according to the embodiment of the present invention does not substantially contain a chromatic colorant. The case in which the composition according to the embodiment of the present invention does not substantially contain a chromatic colorant represents that the content of the chromatic colorant is preferably 0.1 mass % or lower, more preferably 0.05 mass % or lower, and still more preferably 0 mass % with respect to the total solid content of the composition.

<<Coloring Material which Allows Transmission of Infrared Light and Shields Visible Light>>

The composition according to the embodiment of the present invention may also contain a coloring material which allows transmission of infrared light and shields visible light (hereinafter, also referred to as "coloring material which shields visible light").

In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm.

In the present invention, it is preferable that the coloring material which shields visible light satisfies at least one of the following requirement (1) or (2).

(1): The coloring material which shields visible light includes two or more kinds of chromatic colorants, and a combination of the two or more kinds of chromatic colorants forms black.

(2): The coloring material which shields visible light includes an organic black colorant.

In a case where the composition according to the embodiment of the present invention contains the coloring material which shields visible light, the content of the coloring material which shields visible light is preferably 30 mass % or lower, more preferably 20 mass % or lower, and still more preferably 15 mass % or lower with respect to the total solid content of the composition. The lower limit is, for example, 0.01 mass % or higher or 0.5 mass % or higher.

<<Dispersion Aid>>

The composition according to the embodiment of the present invention preferably includes a dispersion aid. By including the dispersion aid in the composition according to the embodiment of the present invention, dispersibility of the pigment in the composition can be further improved. In the present invention, the dispersion aid is a compound which has a group capable of interacting with both the pigment and the dispersant. As the dispersant, a resin (dispersion resin) is preferable. That is, it is preferable that the dispersion aid used in the present invention is a compound which has a group capable of interacting with both the pigment and the resin (dispersion resin).

The absolute value of the difference between the maximum absorption wavelength of the dispersion aid used for the composition according to the embodiment of the present invention and the maximum absorption wavelength of the near infrared absorbing pigment used for the composition according to the embodiment of the present invention is preferably higher than 200 nm, more preferably higher than 300 nm, and still more preferably higher than 400 nm. The upper limit is preferably 800 nm or lower and more preferably 750 nm or lower. By using a combination in which the absolute value of the difference between the maximum absorption wavelength thereof is higher than 200 nm, dispersibility of the near infrared absorbing pigment can be further improved. It is preferable that the dispersion aid has a maximum absorption wavelength in a range of 200 to 500 nm (preferably 250 to 450 nm and more preferably 250 to 400 nm).

In a case of using a compound including an aromatic ring as the near infrared absorbing pigment, it is preferable to use, as the dispersion aid, a compound having an aromatic ring of the same structure as the aromatic ring included in the near infrared absorbing pigment. According to this aspect, dispersibility of the near infrared absorbing pigment can be further improved.

In addition, in a case of using a squarylium compound having a partial structure represented by Formula (S1) as the near infrared absorbing pigment, it is preferable to use, as the dispersion aid, a compound including a structural moiety which is included in a group bonding to *1 position of Formula (S1) or a group bonding to *2 position of Formula (S1) and which is conjugated with the partial structure represented by Formula (S1) of the squarylium compound as the near infrared absorbing pigment. In addition, in a case of using a croconium compound having a partial structure represented by Formula (C1) as the near infrared absorbing pigment, it is preferable to use, as the dispersion aid, a compound including a structural moiety which is included in a group bonding to *3 position of Formula (C1) or a group bonding to *4 position of Formula (C1) and which is conjugated with the partial structure represented by Formula (C1) of the croconium compound as the near infrared absorbing pigment. According to these aspects, dispersibility of the near infrared absorbing pigment can be further improved.

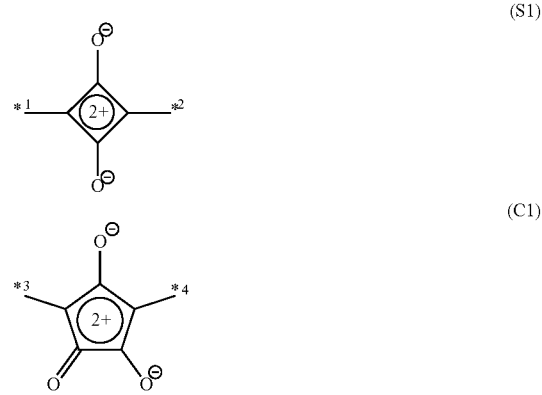

In the formulae, *1 to *4 respectively represent a direct bond.

In addition, in a case where the near infrared absorbing pigment is the squarylium compound having the partial structure represented by Formula (S1) and at least one of the group bonding to *1 position of Formula (S1) or the group bonding to *2 position of Formula (S1) includes a structure in which two or more rings are fused, it is preferable that the dispersion aid is a compound including the structure of the near infrared absorbing pigment in which two or more rings are fused. In addition, in a case where the near infrared absorbing pigment is a croconium compound having the partial structure represented by Formula (C1) and at least one of the group bonding to *3 position of Formula (C1) or the group bonding to *4 position of Formula (C1) includes a structure in which two or more rings are fused, it is preferable that the dispersion aid is a compound including the structure of the near infrared absorbing pigment in which two or more rings are fused.

In addition, it is preferable that the structure in which two or more rings are fused, which is included in the dispersion aid, is a fused ring including one or more of at least one ring selected from a benzene ring, an imidazole ring, an oxazole ring, a thiazole ring, a pyridine ring, and a pyrazine ring, or the structure in which two or more rings are fused is a fused ring including an indolenine ring, a fluorene ring, or a carbazole ring. According to these aspects, dispersibility of the near infrared absorbing pigment can be further improved.

Examples of such compounds include compounds having the following structures.
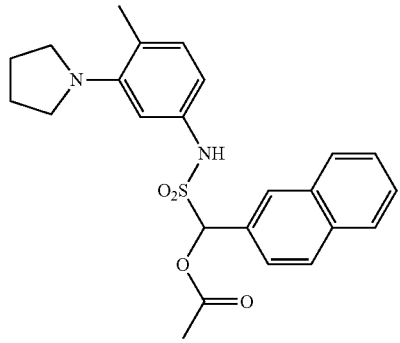
Ba-1
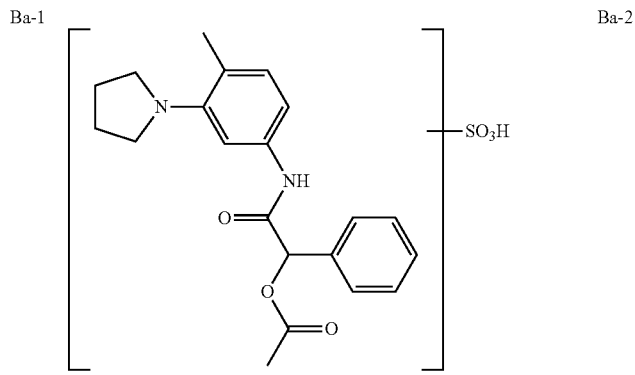
Ba-2
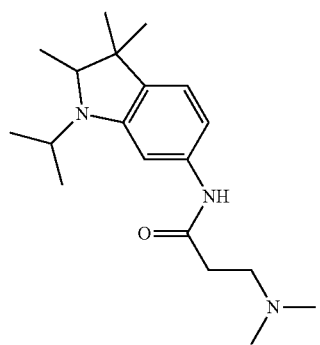
Ba-3
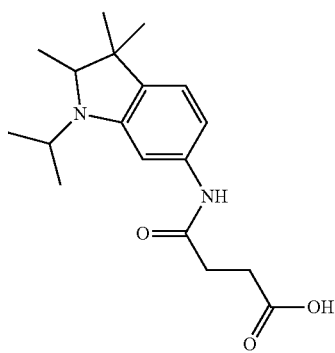
Ba-4
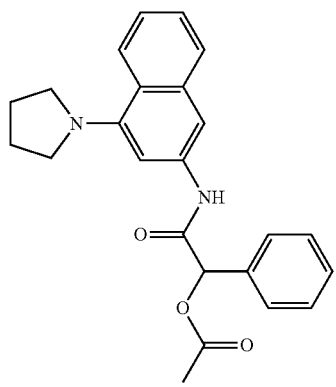
Ba-5
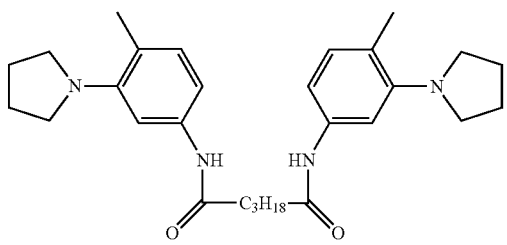
Ba-6
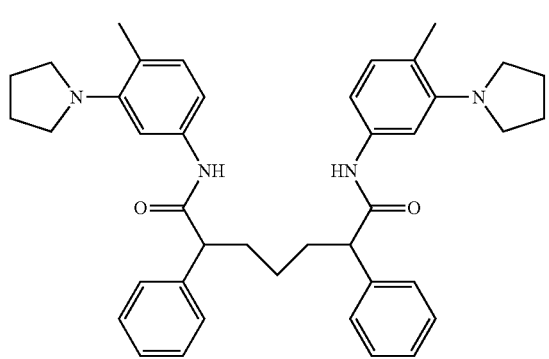
Ba-7
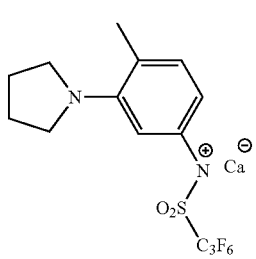
Ba-8

-continued
Ba-9
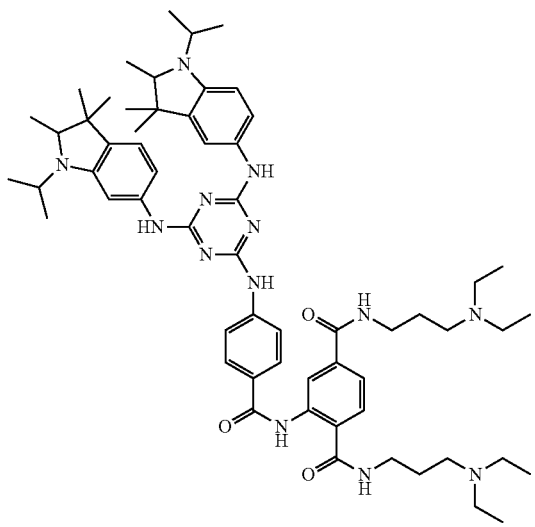
Ba-10
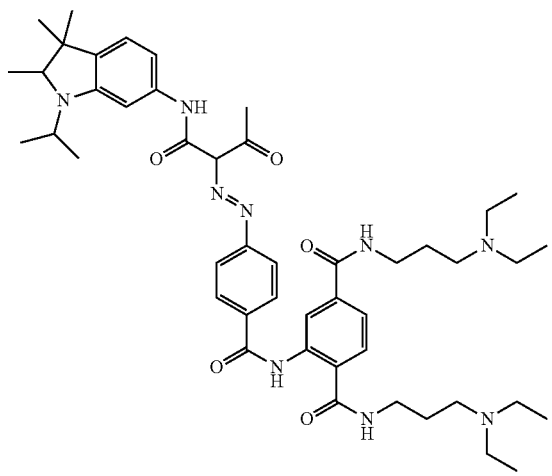
Bb-1
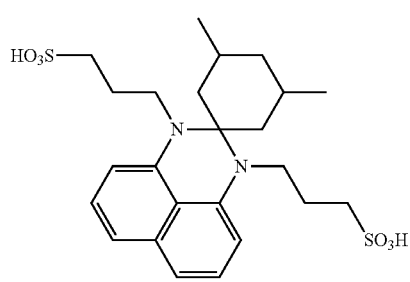
Bb-2
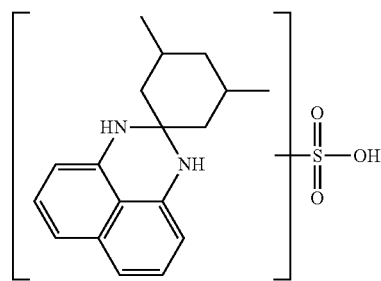
Bb-3
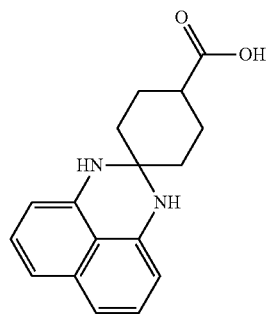
Bb-4
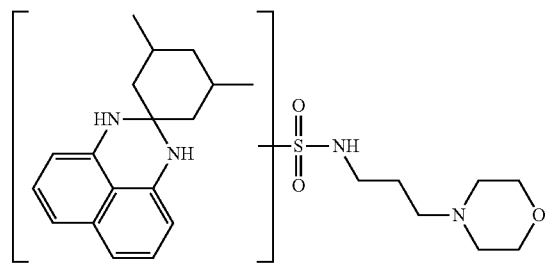
Bb-5
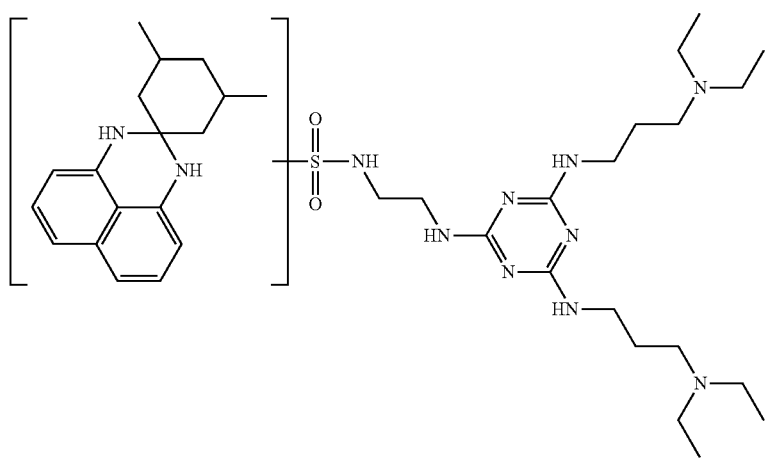

-continued
Bb-6
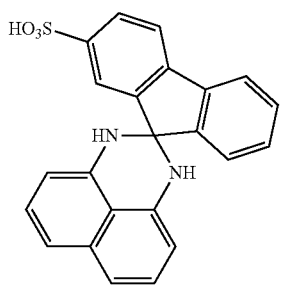
Bb-7
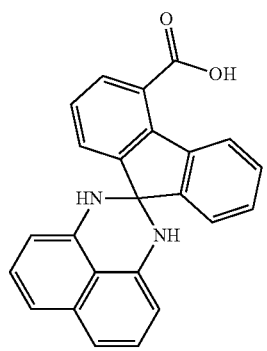
Bb-8
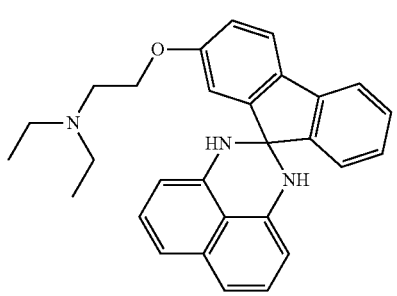
Bb-9
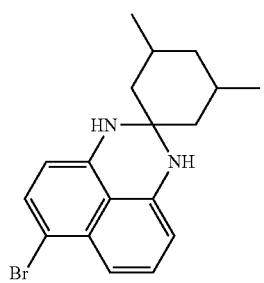
Bb-10
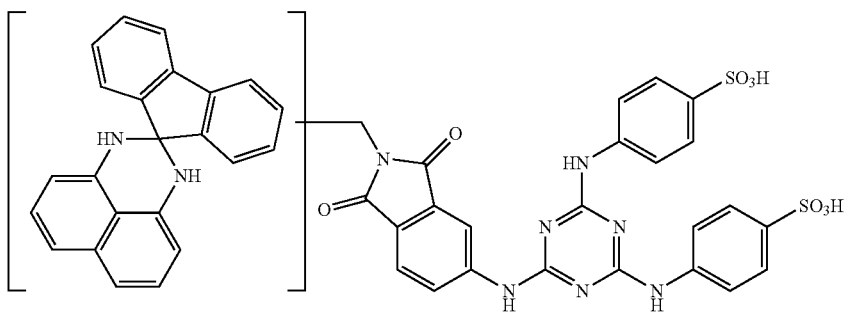
Bb-11
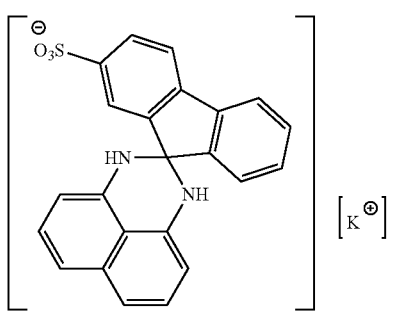

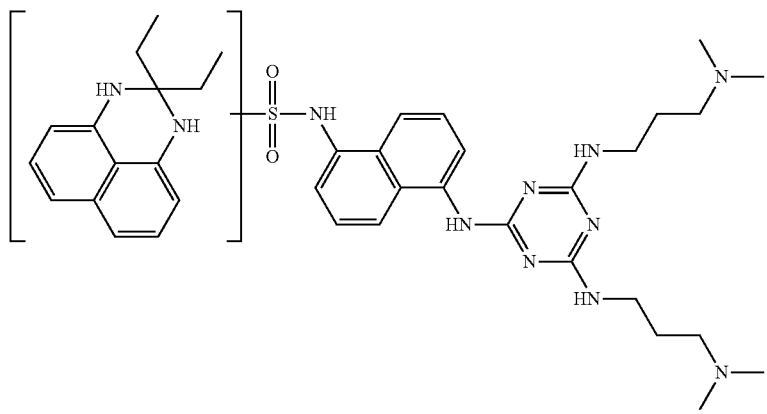
Bb-12
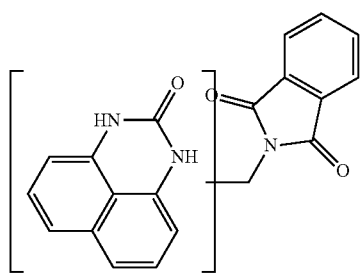
Bb-13
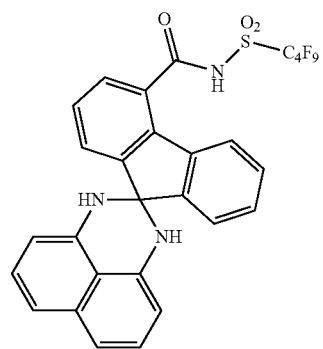
Bb-14
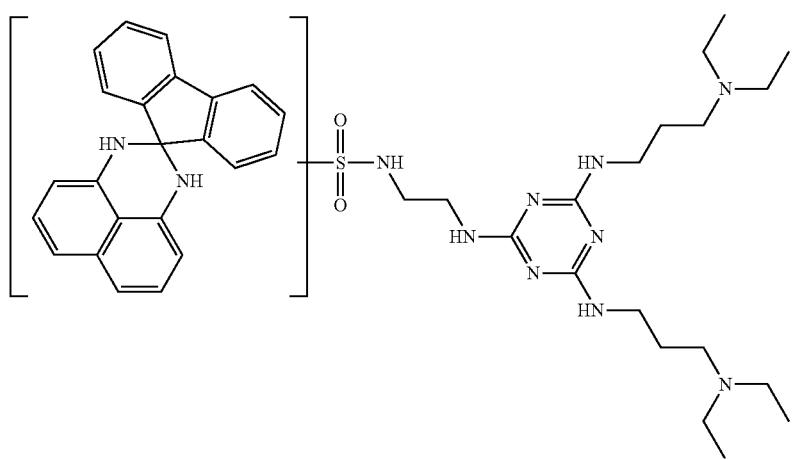
Bb-15

-continued
Bb-16
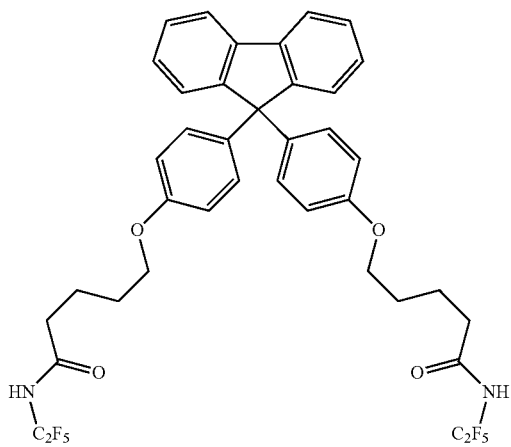
Bb-17
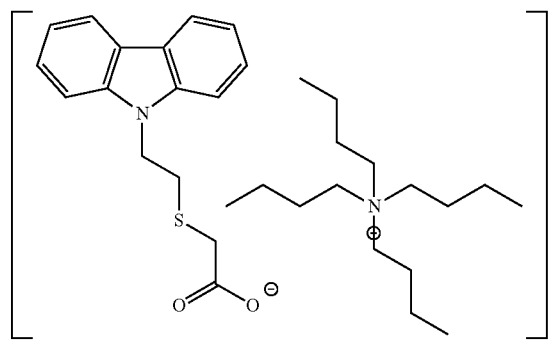
Bb-18
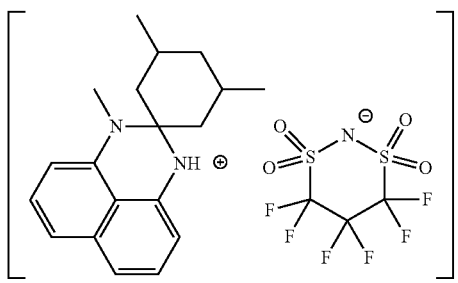
Bb-19
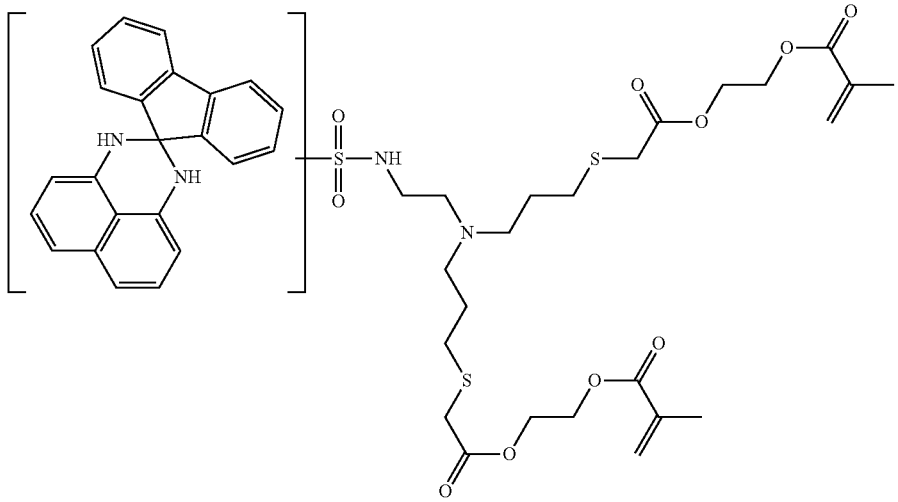
Bb-20
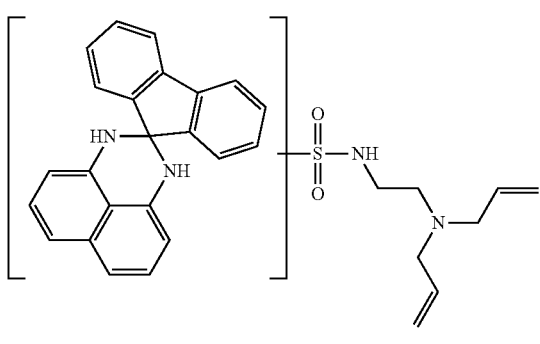
Bb-21
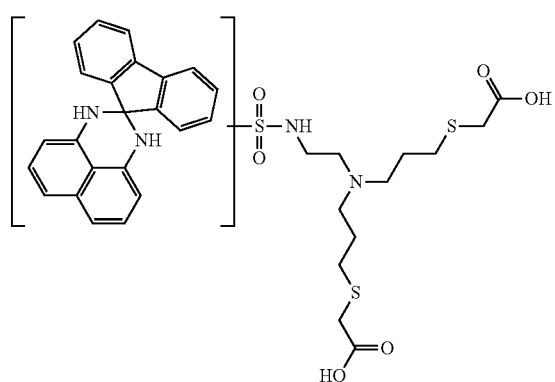

Bd-1
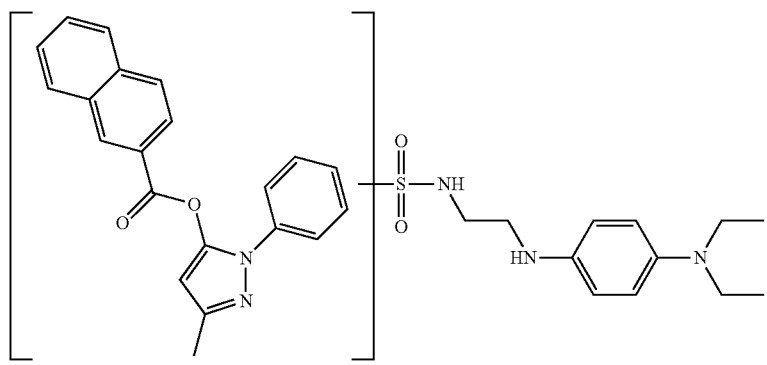
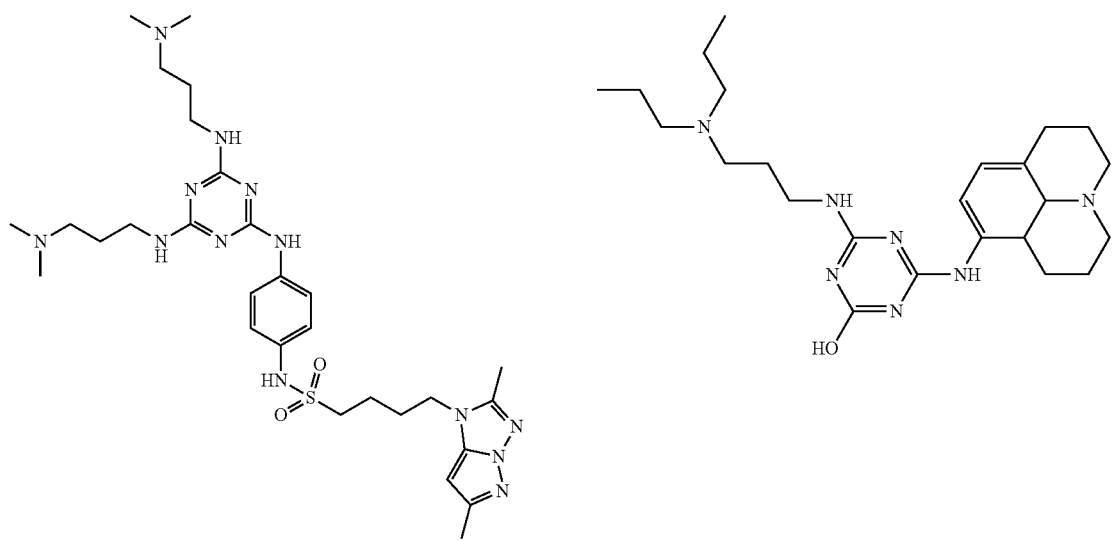
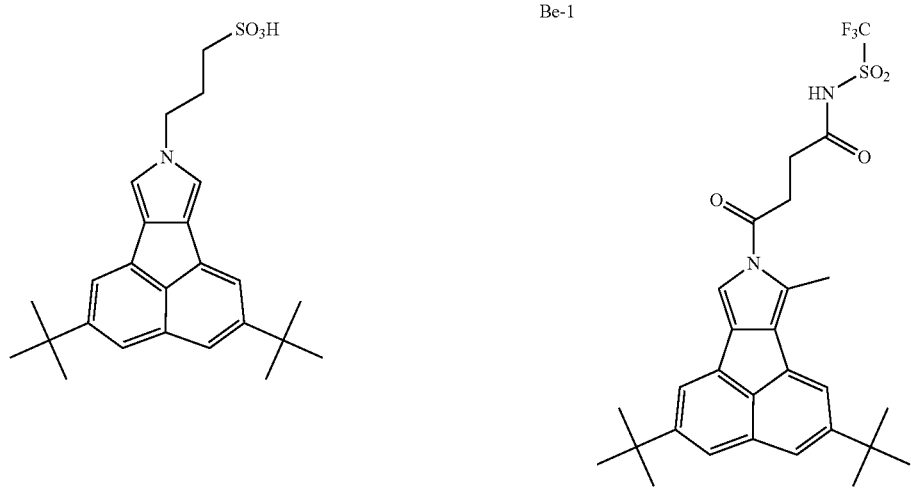

-continued
Be-3
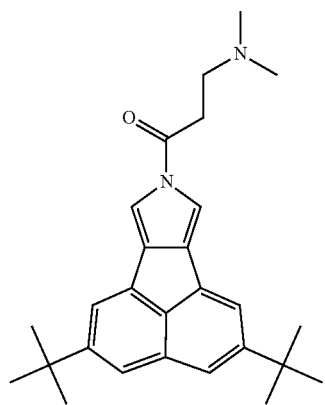
Be-4
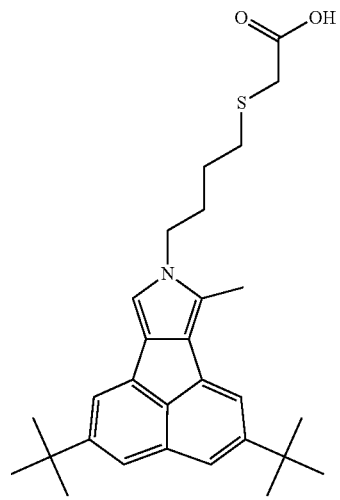
Be-5
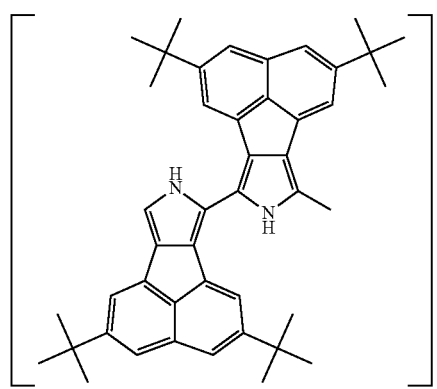
Be-6
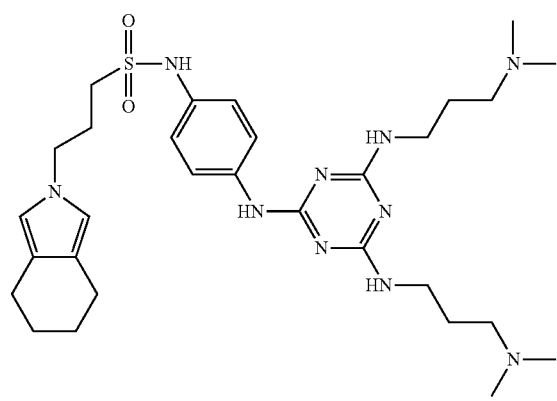

-continued
Be-7
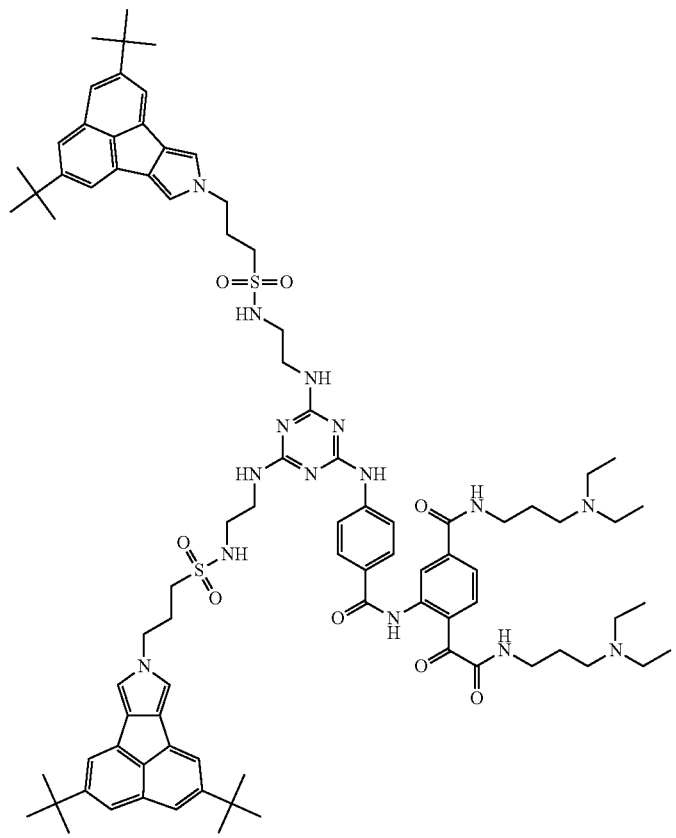
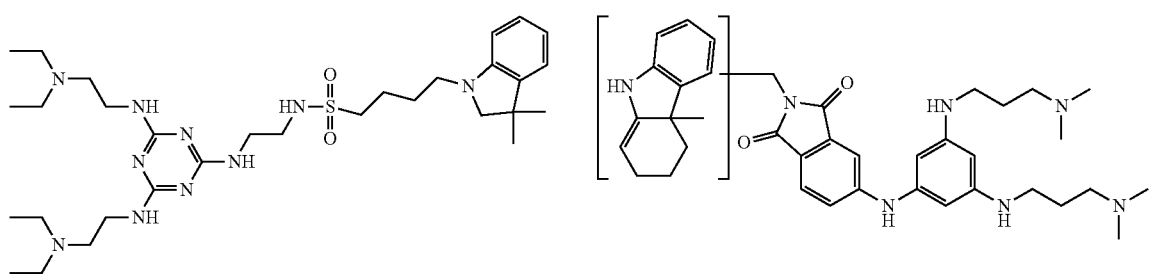
Bf-1
Bf-2
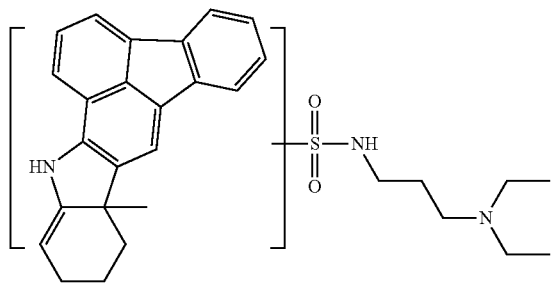
Bf-3

-continued
Bf-4
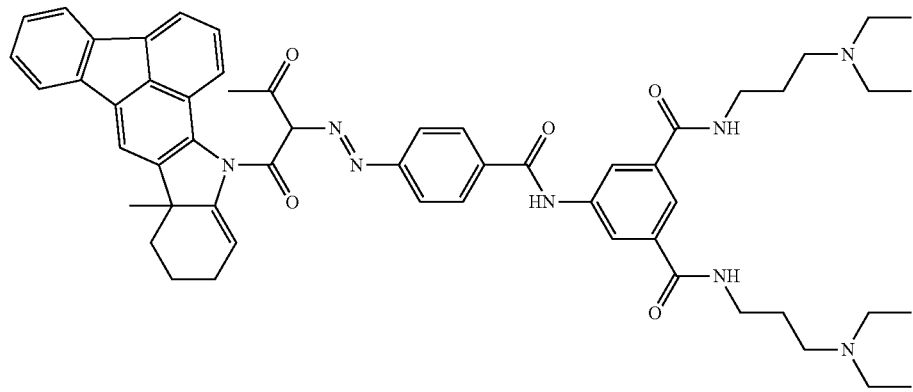
Bf-5
Bf-6
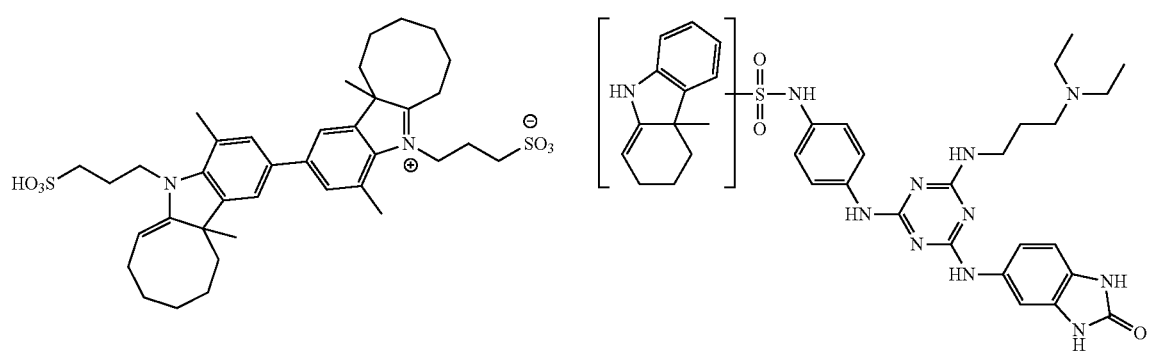
Bf-7
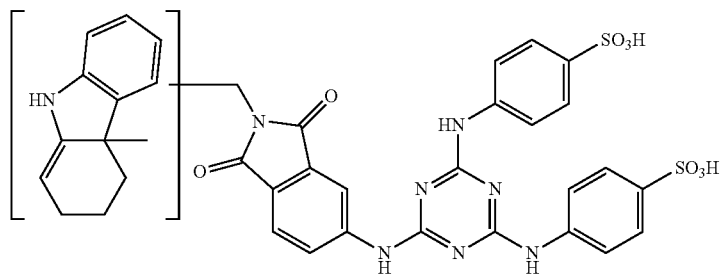
Bg-1
Bh-1
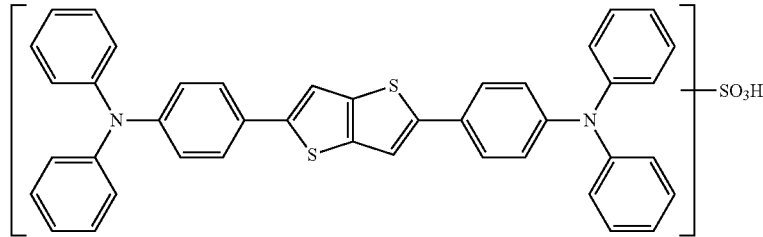

Bh-2
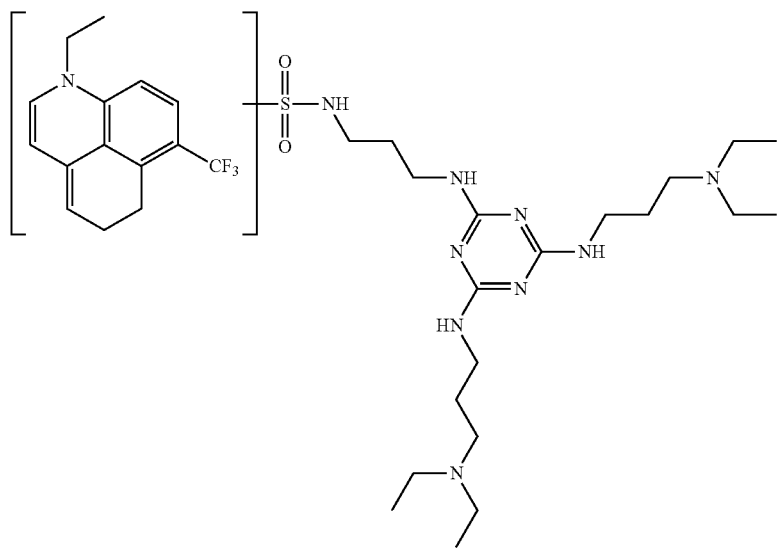
Bh-3
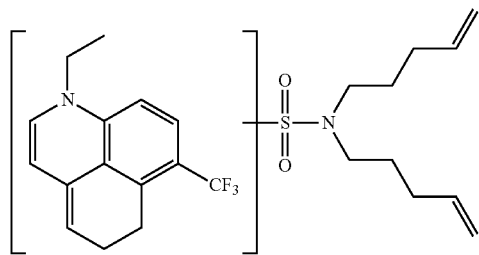
Bi-1
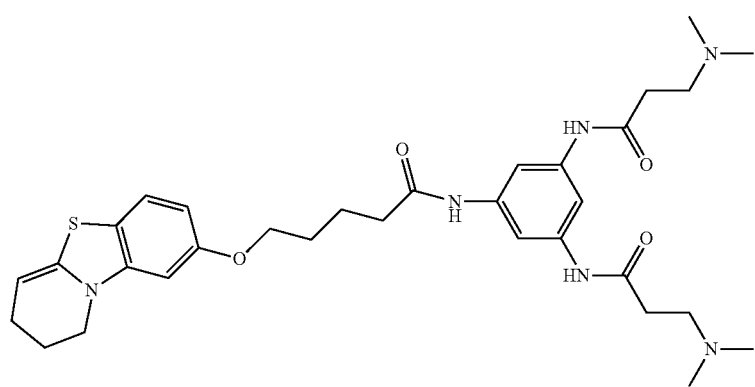

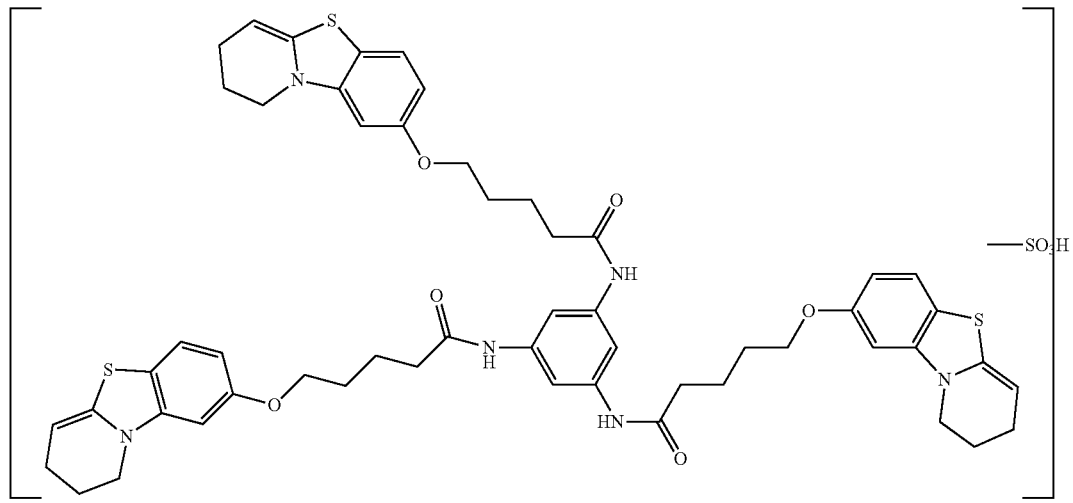

Bi-2

Bj-1

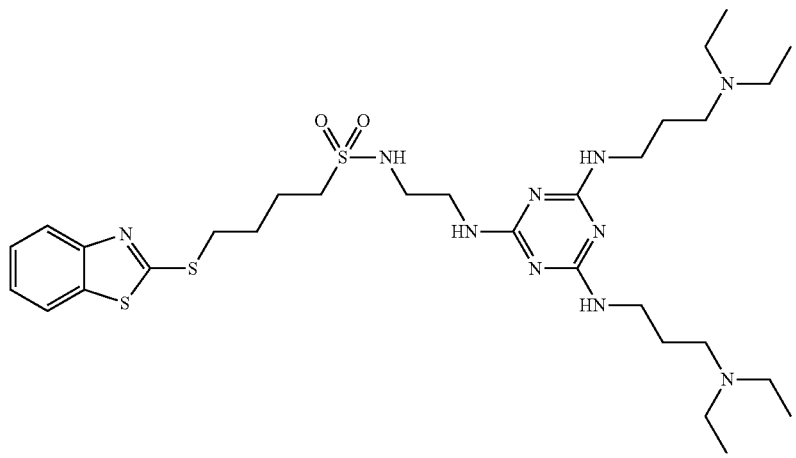

In the composition according to the embodiment of the present invention, it is also preferable to use a pigment derivative as the dispersion aid. Examples of the pigment derivative include a compound in which at least one group selected from an acid group or a basic group is bonded to a colorant skeleton. As the pigment derivative, a compound represented by Formula (B1) is preferable.

$$P\text{-}(\text{-}L\text{-}(X)_n)_m \quad (B1)$$

In Formula (B1), P represents a colorant skeleton, L represents a single bond or a linking group, X represents an acid group or a basic group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

The colorant skeleton represented by P is preferably at least one selected from a squarylium colorant skeleton, a pyrrolopyrrole colorant skeleton, a diketo pyrrolopyrrole colorant skeleton, a quinacridone colorant skeleton, an anthraquinone colorant skeleton, a dianthraquinone colorant skeleton, a benzoisoindole colorant skeleton, a thiazine indigo colorant skeleton, an azo colorant skeleton, a quinophthalone colorant skeleton, a phthalocyanine colorant skeleton, a naphthalocyanine colorant skeleton, a dioxazine colorant skeleton, a perylene colorant skeleton, a perinone colorant skeleton, a benzimidazolone colorant skeleton, a benzothiazole colorant skeleton, a benzimidazole colorant skeleton, or a benzoxazole colorant skeleton, still more preferably at least one selected from a squarylium colorant skeleton, a pyrrolopyrrole colorant skeleton, a diketo pyrrolopyrrole colorant skeleton, a quinacridone colorant skeleton, or a benzimidazolone colorant skeleton, and particularly preferably a squarylium colorant skeleton.

The linking group represented by L is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent. Examples of the substituent include the substituent T described in Formula (PP).

Examples of the acid group represented by X include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and the heterocyclic group represented by $R^{X1}$ to $R^{X6}$ may further have a substituent. Examples of the substituent which may be further included include the above-described substituent T. Among these, a halogen atom is preferable and a fluorine atom is more preferable.

Examples of the basic group represented by X include an amino group.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, and paragraphs "0063" to "0094" of WO2012/102399A can be used, the contents of which are incorporated herein by reference.

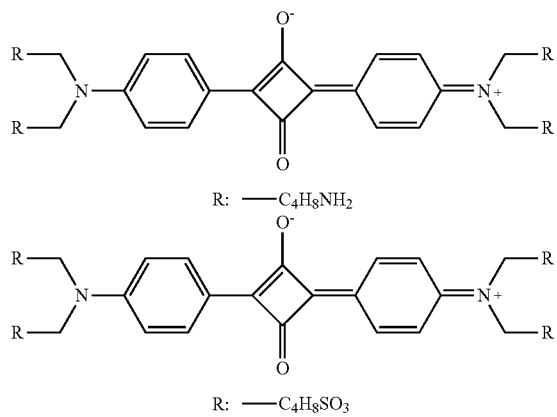

In a case where the composition according to the embodiment of the present invention contains a dispersion aid, the content of the dispersion aid is preferably 1 to 50 parts by mass with respect to 100 parts by mass of the near infrared absorbing pigment. The lower limit value is preferably 3 parts by mass or more and more preferably 5 parts by mass or more. The upper limit value is preferably 40 parts by mass or less and more preferably 30 parts by mass or less. In a case where the content of the dispersion aid is within the above-described range, dispersibility of the near infrared absorbing pigment can be improved, and aggregation of the near infrared absorbing pigment can be efficiently suppressed. As the dispersion aid, one kind may be used alone, or two or more kinds may be used. In a case where two or more kinds thereof are used in combination, it is preferable that the total amount thereof is within the above-described range.

In addition, in a case where the composition according to the embodiment of the present invention contains a pigment derivative, the content of the pigment derivative is preferably 1 to 50 parts by mass with respect to 100 parts by mass of the near infrared absorbing pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is within the above-described range, dispersibility of the near infrared absorbing pigment can be improved, and aggregation of the near infrared absorbing pigment can be efficiently suppressed. As the pigment derivative, one kind may be used alone, or two or more kinds may be used. In a case where two or more kinds thereof are used in combination, it is preferable that the total amount thereof is within the above-described range.

<<Polymerization Inhibitor>>

The composition according to the embodiment of the present invention can contain a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the composition according to the embodiment of the present invention.

<<Silane Coupling Agent>>

The composition according to the embodiment of the present invention can contain a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the content of which is incorporated herein by reference. The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more kinds thereof are used in combination, it is preferable that the total amount thereof is within the above-described range.

<<Surfactant>>

The composition according to the embodiment of the present invention can contain a surfactant. As the surfactant, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the composition according to the embodiment of the present invention containing a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and particularly preferably 7 to 25 mass %. The fluorine surfactant in which the fluorine content is within the above-described range is effective from the viewpoints of the uniformity in the thickness of the coating film and liquid saving properties, and the solubility thereof in the composition is also excellent.

Examples of the fluorine surfactant include a surfactant described in paragraphs "0060" to "0064" of JP2014-041318A (corresponding to paragraphs "0060" to "0064" of WO2014/017669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be suitably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, the fluorine surfactant is also preferably a polymer of a fluorine atom-containing vinyl ether compound having a fluorinated alkyl group or a fluorinated alkylene ether group and a hydrophilic vinyl ether compound. The details of the fluorine surfactant can be found in the description of JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

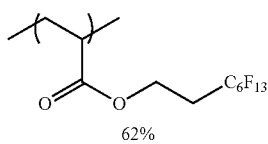

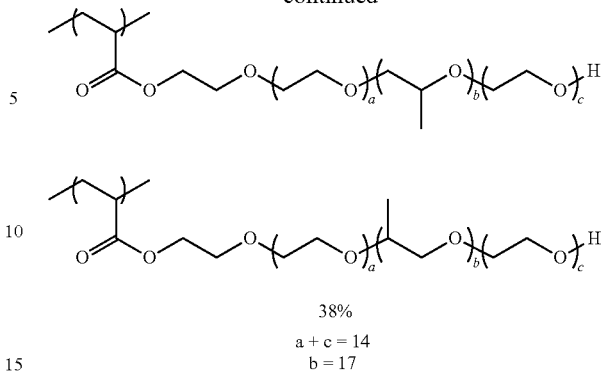

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

The content of the surfactant is preferably 0.01 to 1 mass % with respect to the total solid content of the composition according to the embodiment of the present invention. The upper limit is preferably 0.5 mass % or lower, more preferably 0.1 mass % or lower, and still more preferably 0.05 mass % or lower. The lower limit is preferably 0.015 mass % or higher.

In addition, the content of the fluorine surfactant is preferably 0.01 to 1 mass % with respect to the total solid content of the composition according to the embodiment of the present invention. The upper limit is preferably 0.5 mass % or lower, more preferably 0.1 mass % or lower, and still more preferably 0.05 mass % or lower. The lower limit is preferably 0.015 mass % or higher. As the surfactant, one kind may be used alone, or two or more kinds may be used. In a case where two or more kinds thereof are used in combination, it is preferable that the total content thereof is within the above-described range.

<<Ultraviolet Absorber>>

The composition according to the embodiment of the present invention can contain an ultraviolet absorber. As the ultraviolet absorber, a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, a triazine compound, or the like can be used. With regard to details thereof, reference can be made to the description in paragraphs "0052" to "0072" of JP2012-208374A, paragraphs "0317" to "0334" of JP2013-068814A, and paragraphs "0061" to "0080" of JP2016-162946A, and the contents of which are incorporated herein by reference. Examples of a commercially available product of the conjugated diene compound include UV-503 (manufactured by Daito Chemical Co., Ltd.). Examples of the indole compound include compounds having the following structures. In addition, as the benzotriazole compound, MYUA series (manufactured by Miyoshi Oil&Fat Co., Ltd.; The Chemical Daily, Feb. 1, 2016) may be used.

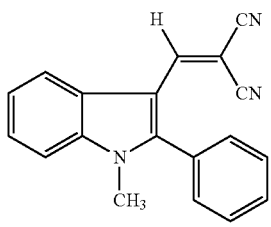 [SMILES: Cn1c(-c2ccccc2)c(C=C(C#N)C#N)c2ccccc21]

In the present invention, as the ultraviolet absorber, compounds represented by Formulae (UV-1) to (UV-3) can be preferably used.

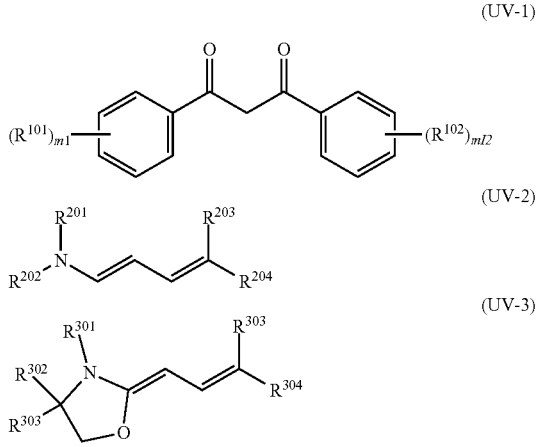

In Formula (UV-1), $R^{101}$ and $R^{102}$ each independently represent a substituent, and m1 and m2 each independently represent 0 to 4. In Formula (UV-2), $R^{201}$ and $R^{202}$ each independently represent a hydrogen atom or an alkyl group, and $R^{203}$ and $R^{204}$ each independently represent a substituent. In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

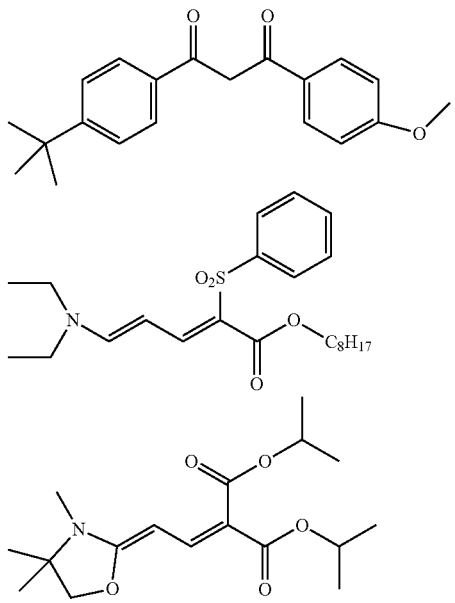

In the composition according to the embodiment of the present invention, the content of the ultraviolet absorber is preferably 0.01 to 10 mass % and more preferably 0.01 to 5 mass % with respect to the total solid content of the composition. In the present invention, as the ultraviolet absorber, one kind may be used alone, or two or more kinds may be used. In a case where two or more kinds thereof are used in combination, it is preferable that the total amount thereof is within the above-described range.

<<Antioxidant>>

The composition according to the embodiment of the present invention can contain an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite.

Examples of a commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation).

In the composition according to the embodiment of the present invention, the content of the antioxidant is preferably 0.01 to 20 mass % and more preferably 0.3 to 15 mass % with respect to the total solid content of the composition.

As the antioxidant, one kind may be used alone, or two or more kinds may be used in combination. In a case where two or more kinds thereof are used in combination, it is preferable that the total amount thereof is within the above-described range.

<<Other Components>>

Optionally, the composition according to the embodiment of the present invention may contain a sensitizer, a curing accelerator, a filler, a thermal curing accelerator, thermal polymerization inhibitor, a plasticizer, and other auxiliary agents (for example, conductive particles, an antifoaming agent, a flame retardant, a leveling agent, a peeling accelerator, a flavoring agent, a surface tension adjuster, or a chain transfer agent). The details of these components can be found in the description of paragraphs "0101" to "0104", "0107" to "0109", and the like of JP2008-250074A, the content of which is incorporated herein by reference. In addition, optionally, the composition according to the embodiment of the present invention may contain a potential antioxidant. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or basic catalyst and the compound functions as an antioxidant. Examples of the potential antioxidant include the compounds described in WO2014/021023A, WO2017/030005A, and JP2017-008219A. Examples of a commercially available product include ADEKA ARKLS GPA-5001 (manufactured by Adeka Corporation).

The moisture content of the composition according to the embodiment of the present invention is preferably 5 mass % or lower, more preferably 2 mass % or lower, still more preferably 1 mass % or lower, and particularly preferably 0.5 mass % or lower. In a case where the moisture content is 5 mass % or lower, an effect that hydrolysis of an IR coloring material can be suppressed can be expected.

For example, in a case where a film is formed by coating, the viscosity (23° C.) of the composition according to the embodiment of the present invention is preferably 1 to 100 mPa×s. The lower limit is more preferably 2 mPa×s or higher and still more preferably 3 mPa×s or higher. The upper limit is more preferably 50 mPa×s or lower, still more preferably 30 mPa×s or lower, and particularly preferably 15 mPa×s or lower.

A storage container of the composition according to the embodiment of the present invention is not particularly limited, and a known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the composition according to the embodiment of the present invention is not particularly limited. The composition according to the embodiment of the present invention can be preferably used to form a near infrared cut filter or the like. In addition, by the composition according to the embodiment of the present invention further containing the coloring material which shields visible light, an infrared transmitting filter which can allow transmission of only near infrared light at a specific wavelength or higher can also be formed.

<Method for Preparing Composition>

The composition according to the embodiment of the present invention can be prepared by mixing the above-described components. During the preparation of the composition, all the components may be dissolved or dispersed in a solvent at the same time to prepare the composition. Optionally, two or more solutions or dispersion liquids to which the respective components are appropriately blended may be prepared, and the solutions or dispersion liquid may be mixed with each other during use (during application) to prepare the composition.

In addition, in the preparation of the composition, a process for dispersing the near infrared absorbing pigment is preferably included. Examples of a mechanical force used for dispersing the near infrared absorbing pigment in the process of dispersing the near infrared absorbing pigment include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the near infrared absorbing pigment using a sand mill (beads mill), it is preferable that the process is performed under conditions for increasing the pulverization efficiency, for example, by using beads having a small size and increasing the filling rate of the beads.

In addition, it is preferable that rough particles are removed by filtering after crushing, centrifugal separation, and the like after pulverization. In addition, as the process and the disperser for dispersing the near infrared absorbing pigment, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the near infrared absorbing pigment, the near infrared absorbing pigment may be refined in a salt milling step. A material, a device, process conditions, and the like used in the salt milling step can be found in, for example, JP2015-194521A and JP2012-046629A.

It is preferable that, in the preparation of the composition, the composition is filtered through a filter for the purpose of removing foreign matters, reducing defects, or the like. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case of using a filter, different filters (for example, a first filter and a second filter) may be combined. Here, the filtration with each of the filters may be performed once or may be performed twice or more times.

In addition, filters having different pore sizes within the above-described range may be combined. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtration through the first filter may be performed only a dispersion liquid, the other components may be mixed therewith, and then the filtration through the second filter may be performed.

<Film>

Next, a film according to the embodiment of the present invention will be described. The film according to the embodiment of the present invention is obtained from the above-described composition according to the embodiment of the present invention. The film according to the embodiment of the present invention can be preferably used as a near infrared cut filter. In addition, the film according to the embodiment of the present invention can also be used as a heat ray shielding filter. The film according to the embodiment of the present invention may be a film having a pattern or a film (flat film) not having a pattern. In addition, the film according to the embodiment of the present invention may be used in a state where it is laminated on a support, or the film according to the embodiment of the present invention may be peeled off from a support. Examples of the support include a semiconductor base material such as a silicon substrate and a transparent base material.

A charge coupled device (CCD), a complementary metal-oxide semiconductor (CMOS), a transparent conductive film, or the like may be formed on the semiconductor base material used as the support. In addition, a black matrix which separates pixels from each other may be formed on the semiconductor base material. In addition, optionally, an undercoat layer may be provided on the semiconductor base material to improve adhesiveness with a layer above the semiconductor base material, to prevent diffusion of materials, or to make a surface of the substrate flat.

The transparent base material used as the support is not particularly limited as long as it is formed of a material which can allow transmission of at least visible light. Examples thereof include a base material formed of a material such as glass and resin. Examples of the resin include polyester resins such as polyethylene terephthalate and polybutylene terephthalate, polyolefin resins such as polyethylene, polypropylene, and ethylene vinyl acetate copolymer, norbornene resin, acrylic resins such as polyacrylate and polymethylmethacrylate, urethane resin, vinyl chloride resin, fluororesin, polycarbonate resin, polyvinyl butyral resin, and polyvinyl alcohol resin. Examples of the glass include soda lime glass, borosilicate glass, non-alkali glass, quartz glass, and copper-containing glass. Examples of the copper-containing glass include a phosphate glass containing copper and a fluorophosphate glass containing copper. The content of copper in the copper-containing glass is preferably 0.1 to 20 mass %, more preferably 0.3 to 17 mass %, and still more preferably 0.5 to 15 mass %. It is preferable that the copper-containing glass has a maximum absorption wavelength in a range of 700 to 1100 nm. The lower limit is preferably 800 nm or higher and more preferably 900 nm or higher. The upper limit is preferably 1050 nm or lower and more preferably 1000 nm or lower. As the copper-containing glass, a commercially available product may also be used. Examples of a commercially available product of the copper-containing glass include NF-50 (manufactured by AGC Techno Glass Co., Ltd.).

The thickness of the film according to the embodiment of the present invention can be adjusted according to the purpose. The thickness of the film is preferably 20 µm or less, more preferably 10 µm or less, and still more preferably 5 µm or less. The lower limit of the thickness of the film is preferably 0.1 µm or more and more preferably 0.2 µm or more.

In a case where the film according to the embodiment of the present invention is used as a near infrared cut filter, it is preferable that the film according to the embodiment of the present invention has a maximum absorption wavelength in a range of 700 to 1800 nm (preferably 700 to 1300 nm and more preferably 700 to 1000 nm). The average light transmittance in a wavelength range of 400 to 600 nm is preferably 50% or higher, more preferably 70% or higher, still more preferably 80% or higher, and particularly preferably 85% or higher. In addition, a transmittance of in the entire wavelength range of 400 to 600 nm is preferably 50% or higher, more preferably 70% or higher, and still more preferably 80% or higher. In addition, in the film according to the embodiment of the present invention, a transmittance at at least one point in a wavelength range of 700 to 1800 nm (preferably 700 to 1300 nm and more preferably 700 to 1000 nm) is preferably 15% or lower, more preferably 10% or lower, and still more preferably 5% or lower. In addition, in the film according to the embodiment of the present invention, a ratio $A_1/A_2$ of a maximum value $A_1$ of an absorbance in a wavelength range of 400 to 600 nm to an absorbance $A_2$ at the maximum absorption wavelength is preferably 0.3 or lower, more preferably 0.20 or lower, still more preferably 0.15 or lower, and particularly preferably 0.10 or lower.

The film according to the embodiment of the present invention can be used in combination with a color filter which includes a chromatic colorant. The color filter can be manufactured using a coloring composition including a chromatic colorant. Examples of the chromatic colorant include the exemplified chromatic colorants which may be included in the composition according to the embodiment of the present invention.

In addition, by containing a chromatic colorant, the film according to the embodiment of the present invention may be used as a filter having a function of a near infrared cut filter and a color filter.

In a case where the film according to the embodiment of the present invention is used as a near infrared cut filter and used in combination with a color filter, it is preferable that the color filter is disposed on an optical path of the film according to the embodiment of the present invention. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid-state imaging element may be interposed between the film according to the embodiment of the present invention and the color filter.

In the present invention, "near infrared cut filter" refers to a filter which allows transmission of light (visible light) in the visible range and shields at least a part of light (near infrared light) in the near infrared range. The near infrared cut filter may be a filter which allows transmission of light in the entire wavelength range of the visible range, or may be a filter which allows transmission of light in a specific wavelength range of the visible range and shields light in another specific wavelength range of the visible range. In addition, in the present invention, a color filter refers to a filter which allows transmission of light in a specific wavelength range of the visible range and shields light in another specific wavelength range of the visible range. In addition, in the present invention, an infrared transmitting filter refers to a filter which shields visible light and allows transmission of at least a part of infrared light.

The film according to the embodiment of the present invention can be used in various devices including a solid-state imaging element such as a charge coupled device (CCD) or a complementary metal-oxide semiconductor (CMOS), an infrared sensor, or an image display device.

<Film Forming Method>

The film according to the embodiment of the present invention can be formed through a step of applying the composition according to the embodiment of the present invention.

Examples of the support are as described above. As a method of applying the composition, a known method can be used. Examples of the known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material. The pre-baking time is preferably 10 seconds to 3000 seconds, more preferably 40 to 2500 seconds, and still more preferably 80 to 220 seconds. Drying can be performed using a hot plate, an oven, or the like.

The film forming method according to the present invention may further include a step of forming a pattern.

Examples of the pattern forming method include a pattern forming method using a photolithography method and a pattern forming method using a dry etching method. Among these, the pattern forming method using a photolithography method is preferable. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using a photolithography method includes: a step (exposure step) of exposing the composition layer, which is formed by applying the composition according to the embodiment of the present invention, in a pattern shape; and a step (development step) of forming a pattern by removing a non-exposed area of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 W/m2.

<<Development Step>>

Next, a pattern is formed by removing a non-exposed area of the exposed composition layer by development. The non-exposed area of the composition layer can be removed by development using a developer. As a result, a non-exposed area of the composition layer in the exposure step is eluted into the developer, and only the photocured portion remains on the support. As the developer, an alkali developer which does not cause damages to a solid-state imaging element as a underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

As the developer, an alkaline aqueous solution in which the alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo [5.4.0]-7-undecene; and an inorganic alkaline compound such as sodium hydroxide, potassium hydroxide, sodium carbonate, sodium bicarbonate, sodium silicate, or sodium metasilicate.

In consideration of environmental aspects and safety aspects, the alkaline agent is preferably a compound having a high molecular weight. A concentration of the alkaline agent in the alkaline aqueous solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where the alkaline aqueous solution is used as a developer, it is preferable that the layer is washed (rinsed) with pure water after development. In addition, it is preferable that the rinsing is performed by supplying a rinsing liquid to the composition layer after development while rotating the support on which the composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, the film can also be dried and then heated (post-baking). Post-baking is a heat treatment which is performed after development to. completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using a heating unit such as a hot plate, a convection oven (hot air circulation dryer), and a high-frequency heater under the above-described conditions.

(Case where Pattern is Formed Using Dry Etching Method)

The formation of a pattern using a dry etching method can be performed using a method including: applying the composition to a support or the like to form a composition layer; curing the composition layer to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer.

In particular, as the forming process of the photoresist, it is desirable that a heat treatment after exposure and a heat treatment after development (post-baking treatment) are performed. The details of the pattern formation using the dry etching method can be found in paragraphs "0010" to "0067" of JP2013-064993A, the content of which is incorporated herein by reference.

<Near Infrared Cut Filter>

Next, a near infrared cut filter according to the embodiment of the present invention will be described. The near infrared cut filter according to the embodiment of the present invention includes the film according to the embodiment of the present invention. In the near infrared cut filter according to the embodiment of the present invention, the average light transmittance in a wavelength range of 400 to 600 nm is preferably 70% or higher, more preferably 80% or higher, still more preferably 85% or higher, and particularly preferably 90% or higher. In addition, a transmittance of in the entire wavelength range of 400 to 600 nm is preferably 70% or higher, more preferably 80% or higher, and still more preferably 90% h or higher. In addition, a preferable range of the near infrared shielding properties of the near infrared cut filter varies depending on the use. A transmittance at at least one point in a wavelength range of 700 to 1800 nm (preferably 700 to 1300 nm and more preferably 700 to 1000 nm) is preferably 20% or lower, more preferably 15% or lower, and still more preferably 10% or lower.

The near infrared cut filter according to the embodiment of the present invention may have a layer containing copper, a dielectric multi-layer film, or an ultraviolet absorbing layer in addition to the film according to the embodiment of the present invention. In a case where the near infrared cut filter further includes the layer containing copper and/or the dielectric multi-layer film, it is possible to further widen the viewing angle and further improve near infrared shielding properties. In addition, in a case where the near infrared cut filter further includes the ultraviolet absorbing layer, the near infrared cut filter having excellent ultraviolet shielding properties can be obtained. The details of the ultraviolet absorbing layer can be found in the description of an absorbing layer described in paragraphs "0040" to "0070" and paragraphs "0119" to "0145" of WO2015/099060A, the content of which is incorporated herein by reference. The details of the dielectric multi-layer film can be found in paragraphs "0255" to "0259" of JP2014-041318A, the content of which is incorporated herein by reference. As the layer containing copper, a glass base material (copper-containing glass base material) formed of glass containing copper, or a layer (copper complex-containing layer) containing a copper complex may also be used. Examples of the copper-containing glass base material include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation). Specific examples of the copper complex include compounds described in paragraphs "0009" to "0049" of WO2016/068037A, the content of which is incorporated herein by reference.

<Solid-State Imaging Element>

A solid-state imaging element according to the embodiment of the present invention includes the film according to the embodiment of the present invention. The configuration of the solid-state imaging element is not particularly limited as long as it includes the film according to the embodiment of the present invention and functions as a solid-state imaging element. For example, the following configuration can be adopted.

The solid-state imaging element includes a plurality of photodiodes and transfer electrodes on the support, the photodiodes constituting a light receiving area of the solid-state imaging element, and the transfer electrode consisting of polysilicon or the like. In the solid-state imaging element, a light-shielding film consisting of tungsten or the like which has openings through only light receiving sections of the photodiodes is provided on the photodiodes and the transfer electrodes, a device protective film consisting of silicon nitride or the like is formed on the light-shielding film so as to cover the entire surface of the light-shielding film and the light receiving sections of the photodiodes, and the film according to the embodiment of the present invention is formed on the device protective film. Furthermore, a configuration in which light collecting unit (for example, a microlens; hereinafter, the same shall be applied) is provided above the device protective film and below the film according to the embodiment of the present invention (on a side thereof close the support), or a configuration in which light collecting unit is provided on the film according to the embodiment of the present invention may be adopted. In addition, the color filter may have a structure in which a film which forms each pixel is embedded in a space which is partitioned in, for example, a lattice form by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326 to 328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor according to the embodiment of the present invention will be described using the drawing.

In FIG. 1, reference numeral 110 represents a solid-state imaging element. In an imaging region provided on a solid-state imaging element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

The near infrared cut filter 111 can be formed using the composition according to the embodiment of the present invention. Spectral characteristics of the near infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the infrared transmitting filters 114 can be selected according to the emission wavelength of the infrared LED to be used.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. The details of the examples are as described above. In addition, as the other near infrared cut filter, a dual band pass filter may be used.

EXAMPLES

Hereinafter, the present invention will be described in detail using examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. Unless specified otherwise, "part(s)" and "%" represent "part(s) by mass" and "mass %".

<Measurement of Particle Size>

A particle size of pigment was measured based on a deposition using MICROTRAC UPA-150 manufactured by Nikkiso Co., Ltd., and a D50 particle size in which a cumulative volume in a particle size distribution is 50% h, a D90 particle size in which a cumulative volume in a particle size distribution is 90%, and a ratio (D90 particle size/D50 particle size) of the D90 particle size to the D50 particle size were measured.

Test Example 1

<Preparation of Composition>

Raw materials shown in the following tables were mixed with each other to prepare a composition. As the dispersion liquid, a dispersion liquid prepared as follows was used.

A near infrared absorbing pigment, a pigment derivative, a dispersant, and a solvent described in "Dispersion Liquid" of the following tables were mixed with each other in part by mass shown in "Dispersion Liquid" of the following tables, 230 parts by mass of zirconia beads having a diameter of 0.3 mm was further added thereto, the mixture was dispersed using a paint shaker for 5 hours, and the beads were separated by filtration, thereby producing a dispersion liquid.

In Examples 1 to 55 and Comparative Examples 1 and 2, near infrared absorbing pigments subjected to the following kneading and polishing treatment were used as a near infrared absorbing pigment.

(Kneading and Polishing Treatment Conditions)

5.3 parts by mass of a near infrared absorbing pigment, 74.7 parts by mass of a grinding agent, and 14 parts by mass of a binding agent were added to Labo Plastomill (manufactured by Toyo Seiki Seisaku-sho, Ltd.), the temperature of a kneaded material in the device was controlled to 70° C., and kneading was performed for 2 hours. As the grinding agent, neutral mirabilite anhydride E (average particle size (50% size (D50) based on volume=20 μm, manufactured by Mitajiri Chemical Industry Co., Ltd.) was used, and as the binding agent, diethylene glycol was used. The kneaded material after kneading and polishing was washed with 10 L of water at 24° C. to remove the grinding agent and the binding agent, and then treated in a heating oven at 80° C. for 24 hours.

TABLE 2

| | | Dispersion Liquid | | | | | | | | | | | | | |
|---|---|---|---|---|---|---|---|---|---|---|---|---|---|---|---|
| | | Pigment | | | | | | | | | | | | | |
| | | Whether or not performing kneading | | | Pigment derivative | | Dispersant | | Solvent 1 | | | Resin | | Polymerizable monomer | | Radical polymerization initiator |
| Name | Type | and polishing treatment | HSP-d | Part by mass | Type | Part by mass | Type | Part by mass | Type | Part by mass | HSP-d | Type | Part by mass | Type | Part by mass | Type | Part by mass |
| Example 1 | Near infrared absorbing pigment 1 | Y | 17.4 | 3 | | | C1 | 1.8 | S1 | 39 | 16 | D2 | 5.5 | M1 M2 | 4.8 1.6 | F1 | 1 |
| Example 2 | Near infrared absorbing pigment 2 | Y | 19.4 | 3 | | | C1 | 1.8 | S1 | 39 | 16 | D2 | 5.5 | M1 M2 | 4.8 1.6 | F1 | 1 |
| Example 3 | Near infrared absorbing pigment 3 | Y | 18.2 | 3 | | | C1 | 1.8 | S1 | 39 | 16 | D2 | 5.5 | M1 M2 | 4.8 1.6 | F1 | 1 |
| Example 4 | Near infrared absorbing pigment 4 | Y | 20 | 3 | | | C1 | 1.8 | S1 | 39 | 16 | D2 | 5.5 | M1 M2 | 4.8 1.7 | F1 | 1 |
| Example 5 | Near infrared absorbing pigment 5 | Y | 19.5 | 3 | | | C1 | 1.8 | S1 | 39 | 16 | D2 | 5.5 | M1 M2 | 4.8 1.8 | F1 | 1 |
| Example 6 | Near infrared absorbing pigment 6 | Y | 17.8 | 3 | | | C1 | 1.8 | S1 | 39 | 16 | D2 | 5.5 | M1 M2 | 4.8 1.9 | F1 | 1 |
| Example 7 | Near infrared absorbing pigment 7 | Y | 20.1 | 3 | | | C1 | 1.8 | S1 | 39 | 16 | D2 | 5.5 | M1 M2 | 4.8 1.10 | F1 | 1 |
| Example 8 | Near infrared absorbing pigment 8 | Y | 16.3 | 3 | | | C1 | 1.8 | S1 | 39 | 16 | D2 | 5.5 | M1 M2 | 4.8 1.11 | F1 | 1 |
| Example 9 | Near infrared absorbing pigment 9 | Y | 19.6 | 3 | | | C1 | 1.8 | S1 | 39 | 16 | D2 | 5.5 | M1 M2 | 4.8 1.12 | F1 | 1 |
| Example 10 | Near infrared absorbing pigment 10 | Y | 19.8 | 3 | | | C1 | 1.8 | S1 | 39 | 16 | D2 | 5.5 | M1 M2 | 4.8 1.13 | F1 | 1 |

TABLE 2-continued

| | | Dispersion Liquid | | | | | | | | | | | | | | |
|---|---|---|---|---|---|---|---|---|---|---|---|---|---|---|---|---|
| | | Pigment | | | | | | | | | | | | | | |
| | | Whether or not performing kneading and polishing treatment | | | Pigment derivative | | Dispersant | | Solvent 1 | | | Resin | | Polymerizable monomer | | Radical polymerization initiator |
| Name | Type | | HSP-d | Part by mass | Type | Part by mass | Type | Part by mass | Type | Part by mass | HSP-d | Type | Part by mass | Type | Part by mass | Type | Part by mass |
| Example 11 | Near infrared absorbing pigment 11 | Y | 19.2 | 3 | | | C1 | 1.8 | S1 | 39 | 16 | D2 | 5.5 | M1 M2 | 4.8 1.14 | F1 | 1 |
| Example 12 | Near infrared absorbing pigment 12 | Y | 17.5 | 3 | | | C1 | 1.8 | S1 | 39 | 16 | D2 | 5.5 | M1 M2 | 4.8 1.15 | F1 | 1 |
| Example 13 | Near infrared absorbing pigment 13 | Y | 19.6 | 3 | | | C1 | 1.8 | S1 | 39 | 16 | D2 | 5.5 | M1 M2 | 4.8 1.16 | F1 | 1 |
| Example 14 | Near infrared absorbing pigment 14 | Y | 19.1 | 3 | | | C1 | 1.8 | S1 | 39 | 16 | D2 | 5.5 | M1 M2 | 4.8 1.17 | F1 | 1 |
| Example 15 | Near infrared absorbing pigment 15 | Y | 19.2 | 3 | | | C1 | 1.8 | S1 | 39 | 16 | D2 | 5.5 | M1 M2 | 4.8 1.18 | F1 | 1 |
| Example 16 | Near infrared absorbing pigment 16 | Y | 20.2 | 3 | | | C1 | 1.8 | S1 | 39 | 16 | D2 | 5.5 | M1 M2 | 4.8 1.19 | F1 | 1 |
| Example 17 | Near infrared absorbing pigment 17 | Y | 18 | 3 | | | C1 | 1.8 | S1 | 39 | 16 | D2 | 5.5 | M1 M2 | 4.8 1.20 | F1 | 1 |
| Example 18 | Near infrared absorbing pigment 18 | Y | 17.9 | 3 | | | C1 | 1.8 | S1 | 39 | 16 | D2 | 5.5 | M1 M2 | 4.8 1.21 | F1 | 1 |
| Example 19 | Near infrared absorbing pigment 19 | Y | 19.6 | 3 | | | C1 | 1.8 | S1 | 39 | 16 | D2 | 5.5 | M1 M2 | 4.8 1.22 | F1 | 1 |
| Example 20 | Near infrared absorbing pigment 20 | Y | 16.4 | 3 | | | C1 | 1.8 | S1 | 39 | 16 | D2 | 5.5 | M1 M2 | 4.8 1.23 | F1 | 1 |

TABLE 3

| | Ultraviolet absorber | | Surfactant | | Polymerization inhibitor | | Antioxidant | | Solvent | | | | | | | | |
|---|---|---|---|---|---|---|---|---|---|---|---|---|---|---|---|---|---|
| | | | | | | | | | Solvent 2 | | | Solvent 3 | | | | | |
| Name | Type | Part by mass | Type | Part by mass | Type | Part by mass | Type | Part by mass | Type | Part by mass | HSP-d | Type | Part by mass | HSP-d | Average HSP-d | ΔHSP-d | D50 | D90 | D90/D50 |
| Example 1 | UV1 | 1.6 | W1 | 0.025 | H1 | 0.003 | I1 | 0.002 | S1 | 21.7 | 16 | S3 | 20 | 15.8 | 16.0 | 1.4 | 18.5 | 62.5 | 3.37 |
| Example 2 | UV1 | 1.6 | W1 | 0.025 | H1 | 0.003 | I1 | 0.002 | S1 | 21.7 | 16 | S3 | 20 | 15.8 | 16.0 | 3.4 | 18.4 | 66.0 | 3.58 |
| Example 3 | UV1 | 1.6 | W1 | 0.025 | H1 | 0.003 | I1 | 0.002 | S1 | 21.7 | 16 | S3 | 20 | 15.8 | 16.0 | 2.2 | 20.5 | 64.5 | 3.15 |
| Example 4 | UV1 | 1.6 | W1 | 0.025 | H1 | 0.003 | I1 | 0.002 | S1 | 21.7 | 16 | S3 | 20 | 15.8 | 16.0 | 4.0 | 19.7 | 55.5 | 2.82 |
| Example 5 | UV1 | 1.6 | W1 | 0.025 | H1 | 0.003 | I1 | 0.002 | S1 | 21.7 | 16 | S3 | 20 | 15.8 | 16.0 | 3.5 | 20.2 | 54.5 | 2.70 |
| Example 6 | UV1 | 1.6 | W1 | 0.025 | H1 | 0.003 | I1 | 0.002 | S1 | 21.7 | 16 | S3 | 20 | 15.8 | 16.0 | 1.8 | 19.4 | 52.5 | 2.71 |

TABLE 3-continued

| | Ultraviolet absorber | | Surfactant | | Polymerization inhibitor | | Antioxidant | | Solvent Solvent 2 | | | Solvent 3 | | | | | | |
|---|---|---|---|---|---|---|---|---|---|---|---|---|---|---|---|---|---|---|
| Name | Type | Part by mass | Type | Part by mass | Type | Part by mass | Type | Part by mass | Type | Part by mass | HSP-d | Type | Part by mass | HSP-d | Average HSP-d | Δ HSP-d | D50 | D90 | D90/D50 |
| Example 7 | UV1 | 1.6 | W1 | 0.025 | H1 | 0.003 | I1 | 0.002 | S1 | 21.7 | 16 | S3 | 20 | 15.8 | 16.0 | 4.1 | 19.7 | 55.5 | 2.82 |
| Example 8 | UV1 | 1.6 | W1 | 0.025 | H1 | 0.003 | I1 | 0.002 | S1 | 21.7 | 16 | S3 | 20 | 15.8 | 16.0 | 0.3 | 18.3 | 60.0 | 3.28 |
| Example 9 | UV1 | 1.6 | W1 | 0.025 | H1 | 0.003 | I1 | 0.002 | S1 | 21.7 | 16 | S3 | 20 | 15.8 | 16.0 | 3.6 | 20.6 | 60.5 | 2.94 |
| Example 10 | UV1 | 1.6 | W1 | 0.025 | H1 | 0.003 | I1 | 0.002 | S1 | 21.7 | 16 | S3 | 20 | 15.8 | 16.0 | 3.8 | 17.7 | 67.5 | 3.81 |
| Example 11 | UV1 | 1.6 | W1 | 0.025 | H1 | 0.003 | I1 | 0.002 | S1 | 21.7 | 16 | S3 | 20 | 15.8 | 16.0 | 3.2 | 18.5 | 57.5 | 3.11 |
| Example 12 | UV1 | 1.6 | W1 | 0.025 | H1 | 0.003 | I1 | 0.002 | S1 | 21.7 | 16 | S3 | 20 | 15.8 | 16.0 | 1.5 | 20.7 | 59.5 | 2.87 |
| Example 13 | UV1 | 1.6 | W1 | 0.025 | H1 | 0.003 | I1 | 0.002 | S1 | 21.7 | 16 | S3 | 20 | 15.8 | 16.0 | 3.6 | 17.7 | 53.5 | 3.02 |
| Example 14 | UV1 | 1.6 | W1 | 0.025 | H1 | 0.003 | I1 | 0.002 | S1 | 21.7 | 16 | S3 | 20 | 15.8 | 16.0 | 3.1 | 21.8 | 53.0 | 2.43 |
| Example 15 | UV1 | 1.6 | W1 | 0.025 | H1 | 0.003 | I1 | 0.002 | S1 | 21.7 | 16 | S3 | 20 | 15.8 | 16.0 | 3.2 | 229 | 55.5 | 2.43 |
| Example 16 | UV1 | 1.6 | W1 | 0.025 | H1 | 0.003 | I1 | 0.002 | S1 | 21.7 | 16 | S3 | 20 | 15.8 | 16.0 | 4.2 | 21.6 | 65.5 | 3.04 |
| Example 17 | UV1 | 1.6 | W1 | 0.025 | H1 | 0.003 | I1 | 0.002 | S1 | 21.7 | 16 | S3 | 20 | 15.8 | 16.0 | 2.0 | 20.1 | 57.0 | 2.84 |
| Example 18 | UV1 | 1.6 | W1 | 0.025 | H1 | 0.003 | I1 | 0.002 | S1 | 21.7 | 16 | S3 | 20 | 15.8 | 16.0 | 1.9 | 18.3 | 53.5 | 2.93 |
| Example 19 | UV1 | 1.6 | W1 | 0.025 | H1 | 0.003 | I1 | 0.002 | S1 | 21.7 | 16 | S3 | 20 | 15.8 | 16.0 | 3.6 | 20.9 | 59.0 | 2.82 |
| Example 20 | UV1 | 1.6 | W1 | 0.025 | H1 | 0.003 | I1 | 0.002 | S1 | 21.7 | 16 | S3 | 20 | 15.8 | 16.0 | 0.4 | 22.2 | 65.5 | 2.95 |

TABLE 4

| | Dispersion Liquid | | | | | | | | | | | | | | |
|---|---|---|---|---|---|---|---|---|---|---|---|---|---|---|---|
| | Pigment | | | | Pigment derivative | | Dispersant | | Solvent 1 | | | Resin | | Polymerizable monomer | | Radical polymerization initiator | |
| Name | Type | Whether or not performing kneading and polishing treatment | HSP-d | Part by mass | Type | Part by mass | Type | Part by mass | Type | Part by mass | HSP-d | Type | Part by mass | Type | Part by mass | Type | Part by mass |
| Example 21 | Near infrared absorbing pigment 21 | Y | 21.4 | 3 | | | C1 | 1.8 | S1 | 39 | 16 | D2 | 5.5 | M1 M2 | 4.8 1.24 | F1 | 1 |
| Example 22 | Near infrared absorbing pigment 22 | Y | 19.1 | 3 | | | C1 | 1.8 | S1 | 39 | 16 | D2 | 5.5 | M1 M2 | 4.8 1.25 | F1 | 1 |
| Example 23 | Near infrared absorbing pigment 23 | Y | 18.7 | 3 | | | C1 | 1.8 | S1 | 39 | 16 | D2 | 5.5 | M1 M2 | 4.8 1.26 | F1 | 1 |
| Example 24 | Near infrared absorbing pigment 24 | Y | 18.5 | 3 | | | C1 | 1.8 | S1 | 39 | 16 | D2 | 5.5 | M1 M2 | 4.8 1.27 | F1 | 1 |
| Example 25 | Near infrared absorbing pigment 25 | Y | 17.3 | 3 | | | C1 | 1.8 | S1 | 39 | 16 | D2 | 5.5 | M1 M2 | 4.8 1.28 | F1 | 1 |
| Example 26 | Near infrared absorbing pigment 26 | Y | 17.9 | 3 | | | C1 | 1.8 | S1 | 39 | 16 | D2 | 5.5 | M1 M2 | 4.8 1.29 | F1 | 1 |

TABLE 4-continued

| | Dispersion Liquid | | | | | | | | | | | | | | | |
|---|---|---|---|---|---|---|---|---|---|---|---|---|---|---|---|---|
| | Pigment | | | | | | | | | | | | Polymerizable monomer | | Radical polymerization initiator | |
| | | Whether or not performing kneading and polishing treatment | | | Pigment derivative | | Dispersant | | Solvent 1 | | Resin | | | | | |
| Name | Type | | HSP-d | Part by mass | Type | Part by mass | Type | Part by mass | Type | Part by mass | HSP-d | Type | Part by mass | Type | Part by mass | Type | Part by mass |
| Example 27 | Near infrared absorbing pigment 27 | Y | 18.2 | 3 | | | C1 | 1.8 | S1 | 39 | 16 | D2 | 5.5 | M1 M2 | 4.8 1.30 | F1 | 1 |
| Example 28 | Near infrared absorbing pigment 27 | Y | 18.2 | 3 | | | C1 | 1.8 | S1 | 39 | 16 | D2 | 5.5 | M1 M2 | 4.8 1.31 | F1 | 1 |
| Example 29 | Near infrared absorbing pigment 27 | Y | 18.2 | 3 | | | C1 | 1.8 | S1 | 39 | 16 | D2 | 5.5 | M1 M2 | 4.8 1.32 | F1 | 1 |
| Example 30 | Near infrared absorbing pigment 27 | Y | 18.2 | 3 | | | C1 | 1.8 | S1 | 39 | 16 | D2 | 5.5 | M1 M2 | 4.8 1.33 | F1 | 1 |
| Example 31 | Near infrared absorbing pigment 27 | Y | 18.2 | 3 | | | C1 | 1.8 | St | 39 | 16 | D2 | 5.5 | M1 M2 | 4.8 1.34 | F1 | 1 |
| Example 32 | Near infrared absorbing pigment 27 | Y | 18.2 | 3 | | | C1 | 1.8 | S1 | 39 | 16 | D2 | 5.5 | M1 M2 | 4.8 1.35 | F1 | 1 |
| Example 33 | Near infrared absorbing pigment 27 | Y | 18.2 | 3 | | | C1 | 1.8 | S1 | 39 | 16 | D2 | 5.5 | M1 M2 | 4.8 1.35 | F1 | 1 |
| Example 34 | Near infrared absorbing pigment 27 | Y | 18.2 | 3 | | | C1 | 1.8 | S1 | 28 | 16 | D2 | 5.5 | M1 M2 | 4.8 1.35 | F1 | 1 |
| Example 35 | Near infrared absorbing pigment 26 Near infrared absorbing pigment 27 | Y | 17.9 18.2 | 1.5 1.5 | | | C1 | 1.8 | S1 | 39 | 16 | D2 | 5.5 | M1 M2 | 4.8 1.36 | F1 | 1 |
| Example 36 | Near infrared absorbing pigment 27 PR254 | Y | 18.2 — | 1.5 1.5 | | | C1 | 1.8 | S1 | 39 | 16 | D2 | 5.5 | M1 M2 | 4.8 1.37 | F1 | 1 |
| Example 37 | Near infrared absorbing pigment 27 PG36 | Y | 18.2 — | 1.5 1.5 | | | C1 | 1.8 | S1 | 39 | 16 | D2 | 5.5 | M1 M2 | 4.8 1.38 | F1 | 1 |
| Example 38 | Near infrared absorbing pigment 27 PB15:6 | Y | 18.2 — | 1.5 1.5 | | | C1 | 1.8 | S1 | 39 | 16 | D2 | 5.5 | M1 M2 | 4.8 1.39 | F1 | 1 |
| Example 39 | Near infrared absorbing pigment 27 | Y | 18.2 | 2.4 | B1 | 0.6 | C1 | 1.8 | S1 | 39 | 16 | D2 | 5.5 | M1 M2 | 4.8 1.40 | F1 | 1 |
| Example 40 | Near infrared absorbing pigment 27 | Y | 18.2 | 2.4 | B2 | 0.6 | C2 | 1.8 | S1 | 39 | 16 | D2 | 5.5 | M1 M2 | 4.8 1.41 | F1 | 1 |

TABLE 5

| Name | Ultraviolet absorber Type | Part by mass | Surfactant Type | Part by mass | Polymerization inhibitor Type | Part by mass | Antioxidant Type | Part by mass | Solvent 2 Type | Part by mass | HSP-d | Solvent 3 Type | Part by mass | HSP-d | Average HSP-d | Δ HSP-d | D50 | D90 | D90-D50 |
|---|---|---|---|---|---|---|---|---|---|---|---|---|---|---|---|---|---|---|---|
| Example 21 | UV1 | 1.6 | W1 | 0.025 | H1 | 0.003 | I1 | 0.002 | S1 | 21.7 | 16 | S3 | 20 | 15.8 | 16.0 | 5.4 | 20.8 | 64.0 | 3.08 |
| Example 22 | UV1 | 1.6 | W1 | 0.025 | H1 | 0.003 | I1 | 0.002 | S1 | 21.7 | 16 | S3 | 20 | 15.8 | 16.0 | 3.1 | 19.0 | 59.0 | 3.10 |
| Example 23 | UV1 | 1.6 | W1 | 0.025 | H1 | 0.003 | I1 | 0.002 | S1 | 21.7 | 16 | S3 | 20 | 15.8 | 16.0 | 2.7 | 17.6 | 59.0 | 3.35 |
| Example 24 | UV1 | 1.6 | W1 | 0.025 | H1 | 0.003 | I1 | 0.002 | S1 | 21.7 | 16 | S3 | 20 | 15.8 | 16.0 | 2.5 | 19.6 | 60.5 | 3.09 |
| Example 25 | UV1 | 1.6 | W1 | 0.025 | H1 | 0.003 | I1 | 0.002 | S1 | 21.7 | 16 | S3 | 20 | 15.8 | 16.0 | 1.3 | 18.6 | 64.5 | 3.46 |
| Example 26 | UV1 | 1.6 | W1 | 0.025 | H1 | 0.003 | I1 | 0.002 | S1 | 21.7 | 16 | S3 | 20 | 15.8 | 16.0 | 1.9 | 20.1 | 54.0 | 2.68 |
| Example 27 | UV1 | 1.6 | W1 | 0.025 | H1 | 0.003 | I1 | 0.002 | S1 | 21.7 | 16 | S3 | 20 | 15.8 | 16.0 | 2.2 | 21.2 | 63.5 | 2.99 |
| Example 28 | UV1 | 1.6 | W1 | 0.025 | H1 | 0.003 | I1 | 0.002 | S1 | 21.7 | 16 | S2 | 20 | 17.9 | 16.5 | 1.7 | 22.9 | 57.5 | 2.51 |
| Example 29 | UV1 | 1.6 | W1 | 0.025 | H1 | 0.003 | I1 | 0.002 | S1 | 21.7 | 16 | S5 | 20 | 16.4 | 16.1 | 2.1 | 21.8 | 65.5 | 3.01 |
| Example 30 | UV1 | 1.6 | W1 | 0.025 | H1 | 0.003 | I1 | 0.002 | S2 | 21.7 | 17.9 | S5 | 20 | 16.4 | 16.6 | 1.6 | 22.8 | 61.5 | 2.69 |
| Example 31 | UV1 | 1.6 | W1 | 0.025 | H1 | 0.003 | I1 | 0.002 | S1 | 21.7 | 16 | S4 | 20 | 16.6 | 16.1 | 2.1 | 19.7 | 53.0 | 2.69 |
| Example 32 | UV1 | 1.6 | W1 | 0.025 | H1 | 0.003 | I1 | 0.002 | S4 | 21.7 | 16.6 | S3 | 20 | 15.8 | 16.1 | 2.1 | 18.0 | 61.5 | 3.42 |
| Example 33 | UV1 | 1.6 | W1 | 0.025 | H1 | 0.003 | I1 | 0.002 | S6 | 30 | 13.3 | S3 | 11.7 | 15.8 | 15.0 | 3.2 | 17.6 | 53.0 | 3.01 |
| Example 34 | UV1 | 1.6 | W1 | 0.025 | H1 | 0.003 | I1 | 0.002 | S6 | 52.7 | 13.3 | — | | | 14.2 | 4.0 | 21.9 | 67.5 | 3.08 |
| Example 35 | UV1 | 1.6 | W1 | 0.025 | H1 | 0.003 | I1 | 0.002 | S1 | 21.7 | 16 | S3 | 20 | 15.8 | 16.0 | 1.9 / 2.2 | 20.8 | 55.0 | 2.64 |
| Example 36 | UV1 | 1.6 | W1 | 0.025 | H1 | 0.003 | I1 | 0.002 | S1 | 21.7 | 16 | S3 | 20 | 15.8 | 16.0 | 2.2 / — | 19.0 | 62.0 | 3.26 |
| Example 37 | UV1 | 1.6 | W1 | 0.025 | H1 | 0.003 | I1 | 0.002 | S1 | 21.7 | 16 | S3 | 20 | 15.8 | 16.0 | 2.2 / — | 18.8 | 52.5 | 2.79 |
| Example 38 | UV1 | 1.6 | W1 | 0.025 | H1 | 0.003 | I1 | 0.002 | S1 | 21.7 | 16 | S3 | 20 | 15.8 | 16.0 | 2.2 / — | 18.5 | 66.0 | 3.56 |
| Example 39 | UV1 | 1.6 | W1 | 0.025 | H1 | 0.003 | I1 | 0.002 | S1 | 21.7 | 16 | S3 | 20 | 15.8 | 16.0 | 2.2 | 22.8 | 54.0 | 2.37 |
| Example 40 | UV1 | 1.6 | W1 | 0.025 | H1 | 0.003 | I1 | 0.002 | S1 | 21.7 | 16 | S3 | 20 | 15.8 | 16.0 | 2.2 | 17.5 | 56.5 | 3.22 |

TABLE 6

| | Dispersion Liquid | | | | | | | | | | | | | | |
|---|---|---|---|---|---|---|---|---|---|---|---|---|---|---|---|
| | Pigment | | | | | | Dispersant | | Solvent 1 | | | Resin | | Polymerizable monomer | | Radical polymerization initiator | |
| Name | Type | Whether or not performing kneading and polishing treatment | HSP-d | Part by mass | Pigment derivative Type | Part by mass | Type | Part by mass | Type | Part by mass | HSP-d | Type | Part by mass | Type | Part by mass | Type | Part by mass |
| Example 41 | Near infrared absorbing pigment 27 | Y | 18.2 | 3 | | | C2 | 1.8 | S1 | 39 | 16 | D2 | 5.5 | M1 / M2 | 4.8 / 1.42 | F1 | 1 |
| Example 42 | Near infrared absorbing pigment 27 | Y | 18.2 | 3 | | | C1 | 1.8 | S1 | 39 | 16 | D1 | 5.5 | M1 / M2 | 4.8 / 1.43 | F1 | 1 |
| Example 43 | Near infrared absorbing pigment 27 | Y | 18.2 | 3 | | | C1 | 1.8 | S1 | 39 | 16 | D3 | 5.5 | M1 / M2 | 4.8 / 1.44 | F1 | 1 |

TABLE 6-continued

| | Dispersion Liquid | | | | | | | | | | | | | | | |
|---|---|---|---|---|---|---|---|---|---|---|---|---|---|---|---|---|
| | Pigment | | | | | | | | | | | | | Polymerizable monomer | | Radical polymerization initiator |
| | | Whether or not performing kneading and polishing treatment | | | Pigment derivative | | Dispersant | | Solvent 1 | | | Resin | | | | |
| Name | Type | | HSP-d | Part by mass | Type | Part by mass | Type | Part by mass | Type | Part by mass | HSP-d | Type | Part by mass | Type | Part by mass | Type | Part by mass |
| Example 44 | Near infrared absorbing pigment 27 | Y | 18.2 | 3 | | | C1 | 1.8 | S1 | 39 | 16 | D1 D2 | 3 2.5 | M1 M2 | 4.8 1.45 | F1 | 1 |
| Example 45 | Near infrared absorbing pigment 27 | Y | 18.2 | 3 | | | C1 | 1.8 | S1 | 39 | 16 | D2 | 5.5 | M1 | 4.8 1.46 | F1 | 1 |
| Example 46 | Near infrared absorbing pigment 27 | Y | 18.2 | 3 | | | C1 | 1.8 | S1 | 39 | 16 | D2 | 5.5 | M2 | 4.8 1.47 | F1 | 1 |
| Example 47 | Near infrared absorbing pigment 27 | Y | 18.2 | 3 | | | C1 | 1.8 | S1 | 39 | 16 | D2 | 5.5 | M1 M3 | 4.8 1.48 | F1 | 1 |
| Example 48 | Near infrared absorbing pigment 27 | Y | 18.2 | 3 | | | C1 | 1.8 | S1 | 39 | 16 | D2 | 5.5 | M1 M2 | 4.8 1.49 | F2 | 1 |
| Example 49 | Near infrared absorbing pigment 27 | Y | 18.2 | 3 | | | C1 | 1.8 | S1 | 39 | 16 | D2 | 5.5 | M1 M2 | 4.8 1.50 | F3 | 1 |
| Example 50 | Near infrared absorbing pigment 27 | Y | 18.2 | 3 | | | C1 | 1.8 | S1 | 39 | 16 | D2 | 5.5 | M1 M2 | 4.8 1.51 | F1 F3 | 0.5 0.5 |
| Example 51 | Near infrared absorbing pigment 27 | Y | 18.2 | 3 | | | C1 | 1.8 | S1 | 39 | 16 | D2 | 5.5 | M1 M2 | 4.8 1.52 | F1 | 1 |
| Example 52 | Near infrared absorbing pigment 27 | Y | 18.2 | 3 | | | C1 | 1.8 | S1 | 39 | 16 | D2 | 5.5 | M1 M2 | 4.8 1.53 | F1 | 1 |
| Example 53 | Near infrared absorbing pigment 27 | Y | 18.2 | 3 | | | C1 | 1.8 | S1 | 39 | 16 | D2 | 5.5 | M1 M2 | 4.8 1.54 | F1 | 1 |
| Example 54 | Near infrared absorbing pigment 27 | Y | 18.2 | 6 | | | C1 | 3.6 | S1 | 39 | 16 | D2 | 3.1 | M1 M2 | 4.8 1.55 | F1 | 1 |
| Example 55 | Near infrared absorbing pigment 27 | Y | 18.2 | 9 | | | C1 | 5.4 | S1 | 39 | 16 | D2 | 0.7 | M1 M2 | 4.8 1.56 | F1 | 1 |
| Comparative Example 1 | Near infrared absorbing pigment R1 | Y | 19 | 3 | | | C1 | 1.8 | S1 | 39 | 16 | D2 | 5.5 | M1 M2 | 4.8 1.57 | F1 | 1 |
| Comparative Example 2 | Near infrared absorbing pigment 18 | Y | 17.9 | 3 | | | C1 | 1.8 | S2 | 39 | 17.9 | D2 | 5.5 | M1 M2 | 4.8 1.58 | F1 | 1 |
| Comparative Example 3 | Near infrared absorbing pigment 18 | N | 17.9 | 3 | | | C1 | 1.8 | S2 | 39 | 17.9 | D2 | 5.5 | M1 M2 | 4.8 1.58 | F1 | 1 |

TABLE 7

| Name | Ultraviolet absorber Type | Part by mass | Surfactant Type | Part by mass | Polymerization inhibitor Type | Part by mass | Antioxidant Type | Part by mass | Solvent 2 Type | Part by mass | HSP-d | Solvent 3 Type | Part by mass | HSP-d | Average HSP-d | Δ HSP-d | D50 | D90 | D90-D50 |
|---|---|---|---|---|---|---|---|---|---|---|---|---|---|---|---|---|---|---|---|
| Example 41 | UV1 | 1.6 | W1 | 0.025 | H1 | 0.003 | I1 | 0.002 | S1 | 21.7 | 16 | S3 | 20 | 15.8 | 16.0 | 2.2 | 18.9 | 57.5 | 3.05 |
| Example 42 | UV1 | 1.6 | W1 | 0.025 | H1 | 0.003 | I1 | 0.002 | S1 | 21.7 | 16 | S3 | 20 | 15.8 | 16.0 | 2.2 | 21.6 | 65.0 | 3.01 |
| Example 43 | UV1 | 1.6 | W1 | 0.025 | H1 | 0.003 | I1 | 0.002 | S1 | 21.7 | 16 | S3 | 20 | 15.8 | 16.0 | 2.2 | 18.7 | 65.0 | 3.48 |
| Example 44 | UV1 | 1.6 | W1 | 0025 | H1 | 0.003 | I1 | 0.002 | S1 | 21.7 | 16 | S3 | 20 | 15.8 | 16.0 | 2.2 | 21.5 | 61.0 | 2.83 |
| Example 45 | UV1 | 1.6 | W1 | 0.025 | H1 | 0.003 | I1 | 0.002 | S1 | 21.7 | 16 | S3 | 20 | 15.8 | 16.0 | 2.2 | 20.4 | 55.0 | 2.70 |
| Example 46 | UV1 | 1.6 | W1 | 0.025 | H1 | 0.003 | I1 | 0.002 | S1 | 21.7 | 16 | S3 | 20 | 15.8 | 16.0 | 2.2 | 20.9 | 56.0 | 2.69 |
| Example 47 | UV1 | 1.6 | W1 | 0.025 | H1 | 0.003 | I1 | 0.002 | S1 | 21.7 | 16 | S3 | 20 | 15.8 | 16.0 | 2.2 | 22.5 | 62.5 | 2.78 |
| Example 48 | UV1 | 1.6 | W1 | 0.025 | H1 | 0.003 | I1 | 0.002 | S1 | 21.7 | 16 | S3 | 20 | 15.8 | 16.0 | 2.2 | 20.7 | 56.5 | 2.73 |
| Example 49 | UV1 | 1.6 | W1 | 0.025 | H1 | 0.003 | I1 | 0.002 | S1 | 21.7 | 16 | S3 | 20 | 15.8 | 16.0 | 2.2 | 19.8 | 58.0 | 2.92 |
| Example 50 | UV1 | 1.6 | W1 | 0.025 | H1 | 0.003 | I1 | 0.002 | S1 | 21.7 | 16 | S3 | 20 | 15.8 | 16.0 | 2.2 | 19.2 | 57.5 | 2.99 |
| Example 51 | UV2 | 1.6 | W1 | 0.025 | H1 | 0.003 | I1 | 0.002 | S1 | 21.7 | 16 | S3 | 20 | 15.8 | 16.0 | 2.2 | 22.6 | 57.5 | 2.54 |
| Example 52 | UV1 UV2 | 0.8 0.8 | W1 | 0.025 | H1 | 0.003 | I1 | 0.002 | S1 | 21.7 | 16 | S3 | 20 | 15.8 | 16.0 | 2.2 | 19.0 | 52.5 | 2.76 |
| Example 53 | UV1 | 1.6 | W1 | 0.025 | H1 | 0.003 | I1 | 0.002 | S1 | 217 | 16 | S3 | 20 | 15.8 | 16.0 | 2.2 | 19.2 | 60.0 | 3.13 |
| Example 54 | UV1 | 1.6 | W1 | 0.025 | H1 | 0.003 | I1 | 0.002 | S1 | 21.7 | 16 | S3 | 20 | 15.8 | 16.0 | 2.2 | 18.5 | 58.5 | 3.17 |
| Example 55 | UV1 | 1.6 | W1 | 0.025 | H1 | 0.003 | I1 | 0.002 | S1 | 21.7 | 16 | S3 | 20 | 15.8 | 16.0 | 2.2 | 19.0 | 52.5 | 2.76 |
| Comparative Example 1 | UV1 | 1.6 | W1 | 0.025 | H1 | 0.003 | I1 | 0.002 | S1 | 21.7 | 16 | S3 | 20 | 15.8 | 16.0 | 3.0 | 22.8 | 59.0 | 2.59 |
| Comparative Example 2 | UV1 | 1.6 | W1 | 0.025 | H1 | 0.003 | I1 | 0.002 | S2 | 41.7 | 17.9 | | | | 17.9 | 0 | 18.2 | 59.5 | 3.27 |
| Comparative Example 3 | UV1 | 1.6 | W1 | 0.025 | H1 | 0.003 | I1 | 0.002 | S2 | 41.7 | 17.9 | | | | 17.9 | 0 | 108.0 | 455.6 | 4.22 |

TABLE 8

| | Dispersion Liquid | | | | | | | | | | | | | | | | |
|---|---|---|---|---|---|---|---|---|---|---|---|---|---|---|---|---|---|
| | Pigment | | | | | | | | | | | | | | | | |
| Name | Type | Compound | Whether or not performing kneading and polishing treatment | HSP-d | Part by mass | Pigment derivative Type | Part by mass | Dispersant Type | Part by mass | Solvent 1 Type | Part by mass | HSP-d | Resin Type | Part by mass | Polymerizable monomer Type | Part by mass | Radical polymerization initiator Type | Part by mass |
| Example 101 | Near infrared absorbing pigment 101 | Aa-1 | Y | 18.3 | 2.4 | Ba-9 | 0.6 | C8 | 1.8 | S1 | 38.97 | 16 | D2 | 5.5 | M1 M5 | 4.8 1.6 | F1 | 1 |
| Example 102 | Near infrared absorbing pigment 102 | Ab-1 | Y | 19.1 | 2.4 | Bb-4 | 0.6 | C8 | 1.8 | S1 | 38.97 | 16 | D2 | 5.5 | M1 M5 | 4.8 1.6 | F1 | 1 |

TABLE 8-continued

| | | | | | | Dispersion Liquid | | | | | | | | | | | |
|---|---|---|---|---|---|---|---|---|---|---|---|---|---|---|---|---|---|
| | | | Pigment | | | | | | | | | | | | | | |
| | | | | Whether or not performing kneading and polishing treatment | | | Pigment derivative | | Dispersant | | Solvent 1 | | Resin | | Polymerizable monomer | | Radical polymerization initiator |
| Name | Type | Compound | | HSP-d | Part by mass | Type | Part by mass | Type | Part by mass | Type | Part by mass | HSP-d | Type | Part by mass | Type | Part by mass | Type | Part by mass |
|---|---|---|---|---|---|---|---|---|---|---|---|---|---|---|---|---|---|---|
| Example 103 | Near infrared absorbing pigment 103 | Ab-9 | Y | 19.1 | 2.4 | Bb-18 | 0.6 | C8 | 1.8 | S1 | 38.97 | 16 | D2 | 5.5 | M1 M5 | 4.8 1.6 | F1 | 1 |
| Example 104 | Near infrared absorbing pigment 104 | Ab-10 | Y | 20.7 | 2.4 | Bb-15 | 0.6 | C8 | 1.8 | S1 | 38.97 | 16 | D2 | 5.5 | M1 M5 | 4.8 1.6 | F1 | 1 |
| Example 105 | Near infrared absorbing pigment 105 | Ab-12 | Y | 20 8 | 2.4 | Bb-8 | 0.6 | C8 | 1.8 | S1 | 38.97 | 16 | D2 | 5.5 | M1 M5 | 4.8 1.6 | F1 | 1 |
| Example 106 | Near infrared absorbing pigment 106 | Ab-14 | Y | 20.8 | 2.4 | Bb-10 | 0.6 | C9 | 1.8 | S1 | 38.97 | 16 | D2 | 5.5 | M1 M5 | 4.8 1.6 | F1 | 1 |
| Example 107 | Near infrared absorbing pigment 107 | Ac-1 | Y | 16.6 | 2.4 | Ba-2 | 0.6 | C9 | 1.8 | S1 | 38.97 | 16 | D2 | 5.5 | M1 M5 | 4.8 1.6 | F1 | 1 |
| Example 108 | Near infrared absorbing pigment 108 | Ac-2 | Y | 16.6 | 2.4 | Ba-5 | 0.6 | C8 | 1.8 | S1 | 38.97 | 16 | D2 | 5.5 | M1 M5 | 4.8 1.6 | F1 | 1 |
| Example 109 | Near infrared absorbing pigment 109 | Ac-3 | Y | 16.3 | 2.4 | Ba-8 | 0.6 | C9 | 1.8 | S1 | 38.97 | 16 | D2 | 5.5 | M1 M5 | 4.8 1.6 | F1 | 1 |
| Example 110 | Near infrared absorbing pigment 110 | Ac-5 | Y | 18.5 | 2.4 | Ba-7 | 0.6 | C8 | 1.8 | S1 | 38.97 | 16 | D2 | 5.5 | M1 M5 | 4.8 1.6 | F1 | 1 |
| Example 111 | Near infrared absorbing pigment 111 | Ac-6 | Y | 19.3 | 2.4 | Ba-6 | 0.6 | C8 | 1.8 | S1 | 38.97 | 16 | D2 | 5.5 | M1 M5 | 4.8 1.6 | F1 | 1 |
| Example 112 | Near infrared absorbing pigment 112 | Af-1 | Y | 19 | 2.4 | Bf-1 | 0.6 | C8 | 1.8 | S1 | 38.97 | 16 | D2 | 5.5 | M1 M5 | 4.8 1.6 | F1 | 1 |
| Example 113 | Near infrared absorbing pigment 113 | Af-3 | Y | 19.6 | 2.4 | Bf-2 | 0.6 | C8 | 1.8 | S1 | 38.97 | 16 | D2 | 5.5 | M1 M5 | 4.8 1.6 | F1 | 1 |
| Example 114 | Near infrared absorbing pigment 114 | Af-4 | Y | 19.2 | 2.4 | Bf-4 | 0.6 | C8 | 1.8 | S1 | 38.97 | 16 | D2 | 5.5 | M1 M5 | 4.8 1.6 | F1 | 1 |
| Example 115 | Near infrared absorbing pigment 115 | Af-6 | Y | 18.3 | 2.4 | Bf-2 | 0.6 | C8 | 1.8 | S1 | 38.97 | 16 | D2 | 5.5 | M1 M5 | 4.8 1.6 | F1 | 1 |

TABLE 8-continued

| | | Dispersion Liquid | | | | | | | | | | | | | | | |
|---|---|---|---|---|---|---|---|---|---|---|---|---|---|---|---|---|---|
| | | Pigment | | | | | | | | | | | | | | | |
| | | | Whether or not performing kneading and polishing treatment | | | Pigment derivative | | Dispersant | | Solvent 1 | | | Resin | | Polymerizable monomer | | Radical polymerization initiator |
| Name | Type | Compound | | HSP-d | Part by mass | Type | Part by mass | Type | Part by mass | Type | Part by mass | HSP-d | Type | Part by mass | Type | Part by mass | Type | Part by mass |
| Example 116 | Near infrared absorbing pigment 116 | Ag-1 | Y | 19.6 | 2.4 | Bf-2 | 0.6 | C8 | 1.8 | S1 | 38.97 | 16 | D2 | 5.5 | M1 M5 | 4.8 1.6 | F1 | 1 |
| Example 117 | Near infrared absorbing pigment 117 | Ag-2 | Y | 19.6 | 2.4 | Bf-2 | 0.6 | C8 | 1.8 | S1 | 38.97 | 16 | D2 | 5.5 | M1 M5 | 4.8 1.6 | F1 | 1 |
| Example 118 | Near infrared absorbing pigment 119 | Ag-4 | Y | 19.1 | 2.4 | Bf-1 | 0.6 | C8 | 1.8 | S1 | 38.97 | 16 | D2 | 5.5 | M1 M5 | 4.8 1.6 | F1 | 1 |
| Example 119 | Near infrared absorbing pigment 120 | Ah-1 | Y | 18.7 | 2.4 | Bh-1 | 0.6 | C9 | 1.8 | S1 | 38.97 | 16 | D2 | 5.5 | M1 M5 | 4.8 1.6 | F1 | 1 |
| Example 120 | Near infrared absorbing pigment 121 | Ah-2 | Y | 18.7 | 2.4 | Bh-2 | 0.6 | C8 | 1.8 | S1 | 38.97 | 16 | D2 | 5.5 | M1 M5 | 4.8 1.6 | F1 | 1 |

TABLE 9

| Name | Ultraviolet absorber Type | Part by mass | Surfactant Type | Part by mass | Polymerization inhibitor Type | Part by mass | Antioxidant Type | Part by mass | Solvent 2 Type | Part by mass | HSP-d | Solvent 3 Type | Part by mass | HSP-d | Average HSP-d | Δ HSP-d | D50 | D90 | D90-D50 |
|---|---|---|---|---|---|---|---|---|---|---|---|---|---|---|---|---|---|---|---|
| Example 101 | UV1 | 1.6 | W1 | 0.025 | H1 | 0.003 | I1 | 0.002 | S1 | 41.7 | 16 | — | | | 16.0 | 2.3 | 24.5 | 64.5 | 2.63 |
| Example 102 | UV1 | 1.6 | W1 | 0.025 | H1 | 0.003 | I1 | 0.002 | S1 | 41.7 | 16 | — | | | 16.0 | 3.1 | 24.6 | 67.5 | 2.74 |
| Example 103 | UV1 | 1.6 | W1 | 0.025 | H1 | 0.003 | I1 | 0.002 | S1 | 41.7 | 16 | — | | | 16.0 | 3.1 | 24.8 | 66.6 | 2.69 |
| Example 104 | UV1 | 1.6 | W1 | 0.025 | H1 | 0.003 | I1 | 0.002 | S1 | 41.7 | 16 | — | | | 16.0 | 4.7 | 21.9 | 52.5 | 2.40 |
| Example 105 | UV1 | 1.6 | W1 | 0.025 | H1 | 0.003 | I1 | 0.002 | S1 | 41.7 | 16 | — | | | 16.0 | 4.8 | 21.8 | 52.6 | 2.41 |
| Example 106 | UV1 | 1.6 | W1 | 0.025 | H1 | 0.003 | I1 | 0.002 | S1 | 41.7 | 16 | — | | | 16.0 | 4.8 | 22.0 | 52.8 | 2.40 |
| Example 107 | UV1 | 1.6 | W1 | 0.025 | H1 | 0.003 | I1 | 0.002 | S6 | 52.7 | 13.3 | — | | | 14.4 | 2.2 | 35.8 | 80.4 | 2.25 |
| Example 108 | UV1 | 1.6 | W1 | 0.025 | H1 | 0.003 | I1 | 0.002 | S6 | 52.7 | 13.3 | — | | | 14.4 | 2.2 | 35.3 | 79.4 | 2.25 |
| Example 109 | UV1 | 1.6 | W1 | 0.025 | H1 | 0.003 | I1 | 0.002 | S6 | 52.7 | 13.3 | — | | | 14.4 | 1.9 | 35.3 | 81.1 | 2.30 |
| Example 110 | UV1 | 1.6 | W1 | 0.025 | H1 | 0.003 | I1 | 0.002 | S6 | 52.7 | 13.3 | — | | | 14.4 | 4.1 | 22.2 | 55.2 | 2.49 |
| Example 111 | UV1 | 1.6 | W1 | 0.025 | H1 | 0.003 | I1 | 0.002 | S1 | 41.7 | 16 | — | | | 16.0 | 3.3 | 21.9 | 55.4 | 2.53 |
| Example 112 | UV1 | 1.6 | W1 | 0.025 | H1 | 0.003 | I1 | 0.002 | S1 | 41.7 | 16 | — | | | 16.0 | 3.0 | 22.4 | 58.3 | 2.60 |
| Example 113 | UV1 | 1.6 | W1 | 0.025 | H1 | 0.003 | I1 | 0.002 | S1 | 41.7 | 16 | — | | | 16.0 | 3.6 | 21.9 | 52.6 | 2.40 |

TABLE 9-continued

| | Ultra-violet absorber | | Surfactant | | Polmer-ization inhibitor | | Anti-oxidant | | Solvent | | | | | | Average HSP-d | Δ HSP-d | D50 | D90 | D90-D50 |
|---|---|---|---|---|---|---|---|---|---|---|---|---|---|---|---|---|---|---|---|
| | | | | | | | | | Solvent 2 | | | Solvent 3 | | | | | | | |
| Name | Type | Part by mass | Type | Part by mass | Type | Part by mass | Type | Part by mass | Type | Part by mass | HSP-d | Type | Part by mass | HSP-d | | | | | |
| Example 114 | UV1 | 1.6 | W1 | 0.025 | H1 | 0.003 | I1 | 0.002 | S1 | 41.7 | 16 | — | | | 16.0 | 3.2 | 21.6 | 65.1 | 3.01 |
| Example 115 | UV1 | 1.6 | W1 | 0.025 | H1 | 0.003 | I1 | 0.002 | S6 | 52.7 | 13.3 | — | | | 14.4 | 3.9 | 21.1 | 54.5 | 2.58 |
| Example 116 | UV1 | 1.6 | W1 | 0.025 | H1 | 0.003 | I1 | 0.002 | S1 | 41.7 | 16 | — | | | 16.0 | 3.6 | 21.9 | 55.4 | 2.53 |
| Example 117 | UV1 | 1.6 | W1 | 0.025 | H1 | 0.003 | I1 | 0.002 | S1 | 41.7 | 16 | — | | | 16.0 | 3.6 | 22.0 | 55.5 | 2.52 |
| Example 118 | UV1 | 1.6 | W1 | 0.025 | H1 | 0.003 | I1 | 0.002 | S1 | 41.7 | 16 | — | | | 16.0 | 3.1 | 22.5 | 59.4 | 2.64 |
| Example 119 | UV1 | 1.6 | W1 | 0.025 | H1 | 0.003 | I1 | 0.002 | S1 | 41.7 | 16 | — | | | 16.0 | 2.7 | 23.4 | 65.4 | 2.79 |
| Example 120 | UV1 | 1.6 | W1 | 0.025 | H1 | 0.003 | I1 | 0.002 | S1 | 41.7 | 16 | — | | | 16.0 | 2.7 | 23.4 | 65.3 | 2.79 |

TABLE 10

| | Dispersion Liquid | | | | | | | | | | | | | | | | |
|---|---|---|---|---|---|---|---|---|---|---|---|---|---|---|---|---|---|
| | Pigment | | | | | | | | | | | | | | | | |
| | | | Whether or not performing kneading and polishing treatment | | | Pigment derivative | | Dispersant | | Solvent 1 | | | Resin | | Polymerizable monomer | | Radical polymerization initiator |
| Name | Type | Compound | | HSP-d | Part by mass | Type | Part by mass | Type | Part by mass | Type | Part by mass | HSP-d | Type | Part by mass | Type | Part by mass | Type | Part by mass |
| Example 121 | Near infrared absorbing pigment 104 | Ab-10 | Y | 20.7 | 2.2 | Bb-15 | 0.8 | C8 | 1.8 | S1 | 38.97 | 16 | D2 | 5.5 | M1 M5 | 4.8 1.6 | F1 | 1 |
| Example 122 | Near infrared absorbing pigment 104 | Ab-10 | Y | 20.7 | 2.7 | Bb-15 | 0.3 | C8 | 1.8 | S1 | 38.97 | 16 | D2 | 5.5 | M1 M5 | 4.8 1.6 | F1 | 1 |
| Example 123 | Near infrared absorbing pigment 104 | Ab-10 | Y | 20.7 | 2.85 | Bb-15 | 0.15 | C8 | 1.8 | S1 | 38.97 | 16 | D2 | 5.5 | M1 M5 | 4.8 1.6 | F1 | 1 |
| Example 124 | Near infrared absorbing pigment 104 | Ab-10 | Y | 20.7 | 2.85 | Bb-10 | 0.15 | C3 | 1.8 | S1 S4 | 19.48 19.49 | 16 16.6 | D2 | 5.5 | M1 M5 | 4.8 1.6 | F4 | 1 |
| Example 125 | Near infrared absorbing pigment 104 | Ab-10 | Y | 20.7 | 2.85 | Bb-15 | 0.15 | C8 | 1.8 | S4 | 38.97 | 16.6 | D4 | 5.5 | M1 M5 | 4.8 1.6 | F1 | 1 |
| Example 126 | Near infrared absorbing pigment 104 | Ab-10 | Y | 20.7 | 2.85 | Bb-15 | 0.15 | C8 | 1.8 | S1 S5 | 19.48 19.49 | 16 164 | D5 | 5.5 | M1 M5 | 4.8 1.6 | F1 | 1 |
| Example 127 | Near infrared absorbing pigment 104 | Ab-10 | Y | 20.7 | 2.85 | Bb-15 | 0.15 | C8 | 1.8 | S5 | 38.97 | 16 | D2 | 5.5 | M4 | 6.4 | F1 | 1 |

TABLE 10-continued

| | | | | | | | | | | | | | | | | | | |
|---|---|---|---|---|---|---|---|---|---|---|---|---|---|---|---|---|---|---|
| | | | Dispersion Liquid | | | | | | | | | | | | | | | |
| | | | Pigment | | | | | | | | | | | | | | | |
| | | | Whether or not performing kneading and polishing treatment | | | Pigment derivative | | Dispersant | | Solvent 1 | | | Resin | | Polymerizable monomer | | Radical polymerization initiator | |
| Name | Type | Compound | | HSP-d | Part by mass | Type | Part by mass | Type | Part by mass | Type | Part by mass | HSP-d | Type | Part by mass | Type | Part by mass | Type | Part by mass |
| Example 128 | Near infrared absorbing pigment 104 | Ab-10 | Y | 20.7 | 2.4 | Bb-16 | 0.6 | C8 | 1.8 | S1 | 38.97 | 16 | D2 | 5.5 | M1 M5 | 4.8 1.6 | F1 | 1 |
| Example 129 | Near infrared absorbing pigment 104 | Ab-10 | Y | 20.7 | 2.4 | Bb-12 | 0.6 | C8 | 1.8 | S1 | 38.97 | 16 | D2 | 5.5 | M1 M5 | 4.8 1.6 | F1 | 1 |
| Example 130 | Near infrared absorbing pigment 116 | Ag-1 | Y | 19.6 | 2.4 | Bg-1 | 0.6 | C9 | 1.8 | S5 | 38.97 | 16.4 | D2 | 5.5 | M1 M5 | 4.8 1.6 | F1 | 1 |
| Example 131 | Near infrared absorbing pigment 104 | Ab-10 | Y | 20.7 | 2.4 | Bb-15 | 0.6 | C4 | 1.8 | S1 | 38.97 | 16 | D2 | 5.5 | M1 M5 | 4.8 1.6 | F1 | 1 |
| Example 132 | Near infrared absorbing pigment 104 | Ab-10 | Y | 20.7 | 2.4 | Bb-15 | 0.6 | C5 | 1.8 | S1 | 38.97 | 16 | D2 | 5.5 | M1 M5 | 4.8 1.6 | F1 | 1 |
| Example 133 | Near infrared absorbing pigment 104 | Ab-10 | Y | 20.7 | 2.4 | Bb-15 | 0.6 | C6 | 1.8 | S1 | 38.97 | 16 | D2 | 5.5 | M1 M5 | 4.8 1.6 | F1 | 1 |
| Example 134 | Near infrared absorbing pigment 104 | Ab-10 | Y | 20.7 | 2.4 | Bb-15 | 0.6 | Cl | 1.8 | S1 | 38.97 | 16 | D2 | 5.5 | M1 M5 | 4.8 1.6 | F1 | 1 |
| Example 201 | Near infrared absorbing pigment 122 | Ao-2 | Y | 18.1 | 2.4 | Be-7 | 0.6 | C8 | 1.8 | S1 | 38.97 | 16 | D2 | 5.5 | M1 M5 | 4.8 1.6 | F1 | 1 |

TABLE 11

| | Ultraviolet absorber | | Surfactant | | Polmerization inhibitor | | Antioxidant | | Solvent | | | | | | | | | |
|---|---|---|---|---|---|---|---|---|---|---|---|---|---|---|---|---|---|---|
| | | | | | | | | | Solvent 2 | | | Solvent 3 | | | | | | |
| Name | Type | Part by mass | Type | Part by mass | Type | Part by mass | Type | Part by mass | Type | Part by mass | HSP-d | Type | Part by mass | HSP-d | Average HSP-d | Δ HSP-d | D50 | D90 | D90-D50 |
| Example 121 | UV1 | 1.6 | W1 | 0.025 | H1 | 0.003 | I1 | 0.002 | S1 | 41.7 | 16 | — | | | 16.0 | 4.7 | 25.1 | 69.9 | 2.78 |
| Example 122 | UV1 | 1.6 | W1 | 0.025 | H1 | 0.003 | I1 | 0.002 | S1 | 41.7 | 16 | — | | | 16.0 | 4.7 | 22.5 | 56 | 2.49 |
| Example 123 | UV1 | 1.6 | W1 | 0.025 | H1 | 0.003 | I1 | 0.002 | S1 | 41.7 | 16 | — | | | 16.0 | 4.7 | 30.4 | 88.2 | 2.90 |
| Example 124 | UV1 | 1.6 | W1 | 0.025 | H1 | 0.003 | I1 | 0.002 | S1 | 41.7 | 16 | — | | | 16.1 | 4.5 | 22.0 | 52.3 | 2.38 |
| Example 125 | UV1 | 1.6 | W1 | 0.025 | H1 | 0.003 | I1 | 0.002 | S7 | 41.7 | 17.2 | — | | | 16.9 | 3.7 | 22.2 | 52.3 | 2.36 |
| Example 126 | UV1 | 1.6 | W1 | 0.025 | H1 | 0.003 | I1 | 0.002 | S1 | 21.7 | 16 | S5 | 20 | 16.4 | 16.2 | 4.5 | 22.0 | 52.5 | 2.39 |

TABLE 11-continued

| Name | Ultraviolet absorber Type | Part by mass | Surfactant Type | Part by mass | Polmerization inhibitor Type | Part by mass | Antioxidant Type | Part by mass | Solvent 2 Type | Part by mass | HSP-d | Solvent 3 Type | Part by mass | HSP-d | Average HSP-d | Δ HSP-d | D50 | D90 | D90-D50 |
|---|---|---|---|---|---|---|---|---|---|---|---|---|---|---|---|---|---|---|---|
| Example 127 | UV1 | 1.6 | W1 | 0.025 | H1 | 0.003 | I1 | 0.002 | S1 | 21.7 | 16 | S4 | 20 | 16.6 | 16.1 | 4.5 | 21.5 | 50.9 | 2.37 |
| Example 128 | UV1 | 1.6 | W1 | 0.025 | H1 | 0.003 | I1 | 0.002 | S1 | 41.7 | 16 | — | | | 16.0 | 4.7 | 25.4 | 78.4 | 3.09 |
| Example 129 | UV1 | 1.6 | W1 | 0.025 | H1 | 0.003 | I1 | 0.002 | S1 | 41.7 | 16 | — | | | 16.0 | 4.7 | 25.5 | 77.7 | 3.05 |
| Example 130 | UV1 | 1.6 | W1 | 0.025 | H1 | 0.003 | I1 | 0.002 | S1 | 41.7 | 16 | — | | | 16.2 | 3.4 | 22.4 | 61.4 | 2.74 |
| Example 131 | UV1 | 1.6 | W1 | 0.025 | H1 | 0.003 | I1 | 0.002 | S1 | 41.7 | 16 | — | | | 16.0 | 4.7 | 21.9 | 52.3 | 2.39 |
| Example 132 | UV1 | 1.6 | W1 | 0.025 | H1 | 0.003 | I1 | 0.002 | S1 | 41.7 | 16 | — | | | 16.0 | 4.7 | 19.9 | 45.5 | 2.29 |
| Example 133 | UV1 | 1.6 | W1 | 0.025 | H1 | 0.003 | I1 | 0.002 | S1 | 41.7 | 16 | — | | | 16.0 | 4.7 | 19.8 | 47.3 | 2.39 |
| Example 134 | UV1 | 1.6 | W1 | 0.025 | H1 | 0.003 | I1 | 0.002 | S1 | 41.7 | 16 | — | | | 16.0 | 4.7 | 18.0 | 45.5 | 2.53 |
| Example 201 | UV1 | 1.6 | W1 | 0.025 | H1 | 0.003 | I1 | 0.002 | S1 | 41.7 | 16 | — | | | 16.0 | 2.1 | 364 | 111 | 3.05 |

The raw materials described in the above tables are as follows. The numerical value described in "HSP-d" is the d value of the Hansen solubility parameter of the near infrared absorbing pigment or the solvent, and the unit is $MPa^{0.5}$. In addition, the numerical value described in "Average HSP-d" is a mass-average value of the d values of the Hansen solubility parameters of solvents 1 to 3 included in each composition, and the unit is $MPa^{0.5}$. In addition, the numerical value described in "ΔHSP-d" is the absolute value of the difference between the d value of the Hansen solubility parameter of the near infrared absorbing pigment included in each composition and the mass-average value (numerical value described in "Average HSP-d") of the d values of the Hansen solubility parameters of the solvents 1 to 3 included in each composition, and the unit is $MPa^{0.5}$. The numerical value described in "D50" is the D50 particle size (particle size in which a cumulative volume in the particle size distribution of the particle sizes of the pigment included in the composition is 50%; the unit is nm), and the numerical value described in "D90" is the D90 particle size (particle size in which a cumulative volume in the particle size distribution of the particle sizes of the pigment included in the composition is 90%; the unit is nm). The numerical value described in "D90/D50" is a ratio (D90 particle size/D50 particle size) of the D90 particle size to the D50 particle size.

(Pigment)

TABLE 12

| | Compound No | HSP-d | HSP-p | HSP-h |
|---|---|---|---|---|
| Near infrared absorbing pigment 1 | A-23 | 17.4 | 16.3 | 11.5 |
| Near infrared absorbing pigment 2 | A-24 | 19.4 | 10.8 | 11.1 |
| Near infrared absorbing pigment 3 | A-25 | 18.2 | 16 | 13.1 |
| Near infrared absorbing pigment 4 | A-26 | 20 | 20.1 | 14.8 |
| Near infrared absorbing pigment 5 | A-27 | 19.5 | 23.1 | 15.9 |
| Near infrared absorbing pigment 6 | A-28 | 17.8 | 8.9 | 8.7 |
| Near infrared absorbing pigment 7 | A-29 | 20.1 | 27 | 21 |
| Near infrared absorbing pigment 8 | A-30 | 16.3 | 16.5 | 11.1 |
| Near infrared absorbing pigment 9 | A-31 | 19.6 | 15.2 | 12.8 |
| Near infrared absorbing pigment 10 | A-32 | 19.8 | 7.1 | 11.1 |
| Near infrared absorbing pigment 11 | A-33 | 19.2 | 6.5 | 10.9 |
| Near infrared absorbing pigment 12 | A-34 | 17.5 | 12 | 10.3 |
| Near infrared absorbing pigment 13 | A-35 | 19.6 | 17.8 | 12.5 |

TABLE 12-continued

| | Compound No | HSP-d | HSP-p | HSP-h |
|---|---|---|---|---|
| Near infrared absorbing pigment 14 | A-36 | 19.1 | 12.2 | 9 |
| Near infrared absorbing pigment 15 | A-37 | 19.2 | 11.8 | 8.8 |
| Near infrared absorbing pigment 16 | A-38 | 20.2 | 13.9 | 11.7 |
| Near infrared absorbing pigment 17 | A-39 | 18 | 18.6 | 11.8 |
| Near infrared absorbing pigment 18 | A-40 | 17.9 | 5.8 | 7.3 |
| Near infrared absorbing pigment 19 | A-41 | 19.6 | 19.7 | 15.4 |
| Near infrared absorbing pigment 20 | A-42 | 16.4 | 17.4 | 11.2 |
| Near infrared absorbing pigment 21 | A-43 | 21.4 | 12.3 | 10.8 |
| Near infrared absorbing pigment 22 | A-44 | 19.1 | 8.9 | 11.1 |
| Near infrared absorbing pigment 23 | A-50 | 18.7 | 3.1 | 5.5 |
| Near infrared absorbing pigment 24 | A-51 | 18.5 | 5.1 | 7.9 |
| Near infrared absorbing pigment 25 | A-52 | 17.3 | 0 | 3.3 |
| Near infrared absorbing pigment 26 | A-53 | 17.9 | 4.5 | 6.6 |
| Near infrared absorbing pigment 27 | A-54 | 18.2 | 5.7 | 11.7 |
| Near infrared absorbing pigment R1 | AR-1 | 19 | 15.6 | 4.2 |

TABLE 13

| | Compound No | HSP-d |
|---|---|---|
| Near infrared absorbing pigment 101 | Aa-1 | 18.3 |
| Near infrared absorbing pigment 102 | Ab-1 | 19.1 |
| Near infrared absorbing pigment 103 | Ab-9 | 19.1 |
| Near infrared absorbing pigment 104 | Ab-10 | 20.7 |
| Near infrared absorbing pigment 105 | Ab-12 | 20.8 |
| Near infrared absorbing pigment 106 | Ab-14 | 20.8 |
| Near infrared absorbing pigment 107 | Ac-1 | 16.6 |
| Near infrared absorbing pigment 108 | Ac-2 | 16.6 |
| Near infrared absorbing pigment 109 | Ac-3 | 16.3 |
| Near infrared absorbing pigment 110 | Ac-5 | 18.5 |
| Near infrared absorbing pigment 111 | Ac-6 | 19.3 |
| Near infrared absorbing pigment 112 | Af-1 | 19.0 |
| Near infrared absorbing pigment 113 | Af-3 | 19.6 |
| Near infrared absorbing pigment 114 | Af-4 | 19.2 |
| Near infrared absorbing pigment 115 | Af-6 | 18.3 |
| Near infrared absorbing pigment 116 | Ag-1 | 19.6 |
| Near infrared absorbing pigment 117 | Ag-2 | 19.6 |
| Near infrared absorbing pigment 118 | Ag-4 | 19.1 |
| Near infrared absorbing pigment 119 | Ah-1 | 18.7 |
| Near infrared absorbing pigment 120 | Ah-2 | 18.7 |
| Near infrared absorbing pigment 121 | Ao-2 | 18.1 |
| Near infrared absorbing pigment 122 | | |

Compounds described in "Compound No" of the above tables are compounds having the following structures or compounds having structures shown in the section of the specific examples of the near infrared absorbing pigment. A-23 to A-44, A-53, A-54, Aa-1, Ab-1, Ab-9, Ab-10, Ab-12, Ab-14, Ac-1, Ac-2, Ac-3, Ac-5, Ac-6, Af-1, Af-3, Af-4, Af-6, Ag-1, Ag-2, Ag-4, Ah-1, Ah-2, and Ao-2 are colorant compounds having a cation and an anion in the same molecule or colorant compounds which are salts of a cationic chromophore and a counter anion, and A-50 to A-52 are colorant compounds consisting of a salt of a cationic chromophore and a counter anion. The numerical values described in "HSP-d", "HSP-p", "HSP-h" are respectively d values, p values, and h values of Hansen solubility parameter, and the unit is MPa$^{0.5}$. The near infrared absorbing pigments 1 to 27, 101 to 122, and R1 had a maximum absorption wavelength in a range of 700 to 1800 nm.

PR254: C.I. Pigment Red 254 (chromatic pigment)
PG36: C.I. Pigment Green 36 (chromatic pigment)
PB15:6: C.I. Pigment Blue 15:6 (chromatic pigment)

A-23

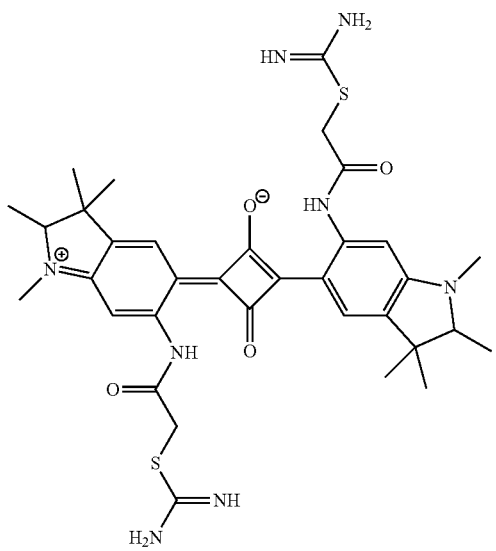

A-24

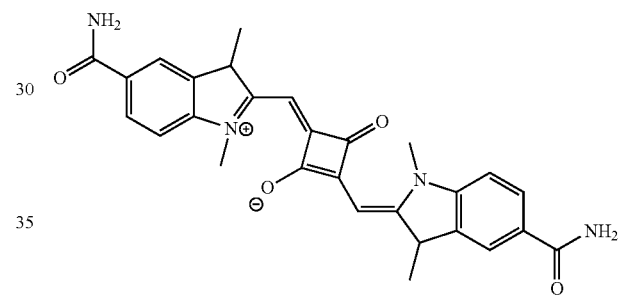

A-25

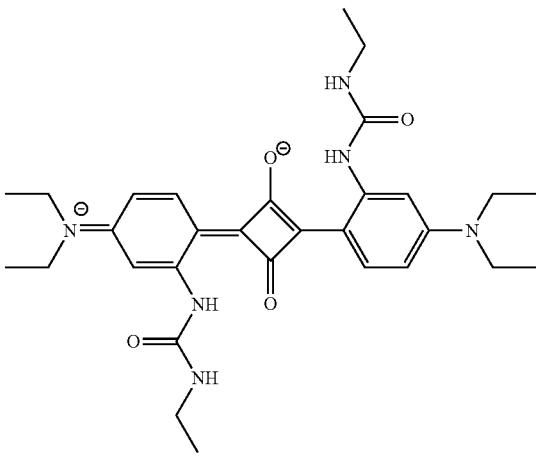

A-26

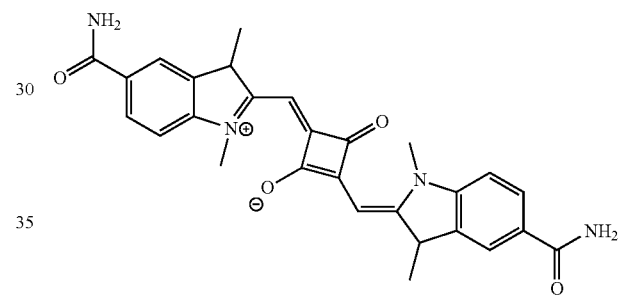

A-27

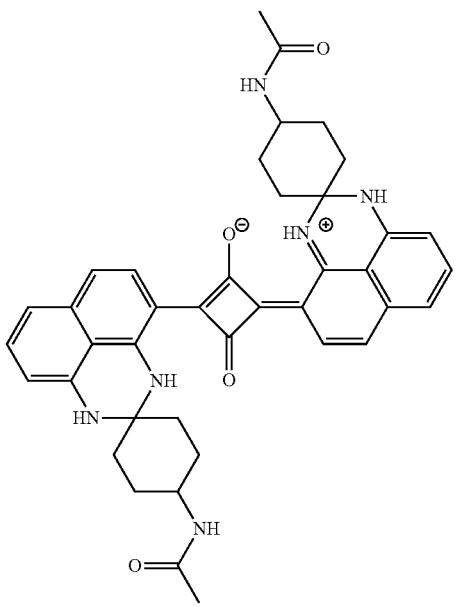

-continued
A-28
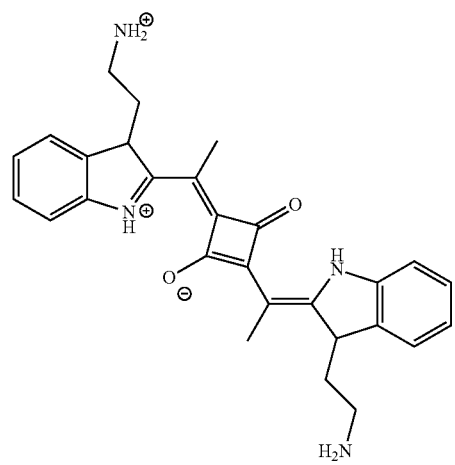
A-29
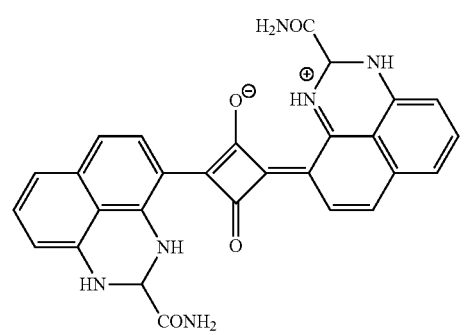
A-30
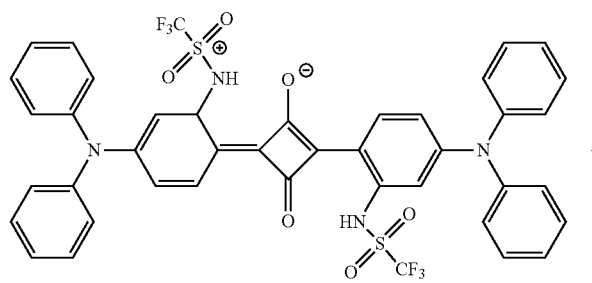
A-31
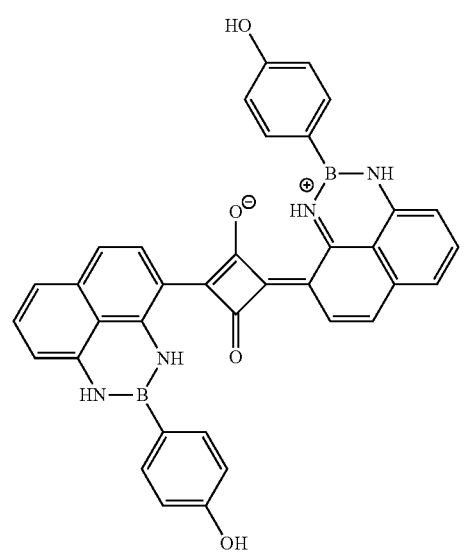
-continued
A-32
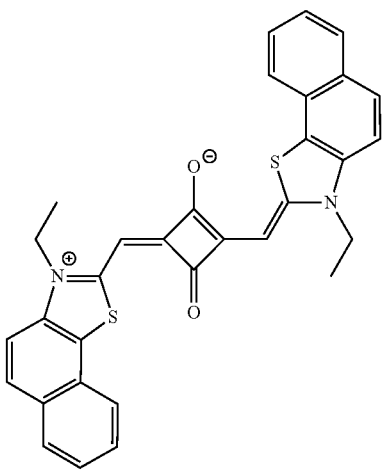
A-33
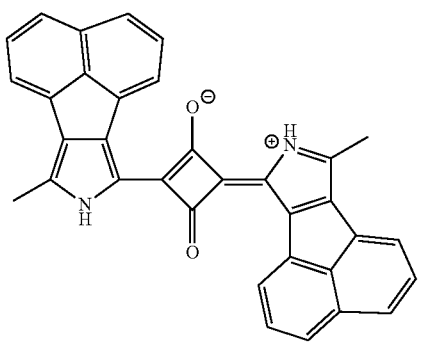
A-34
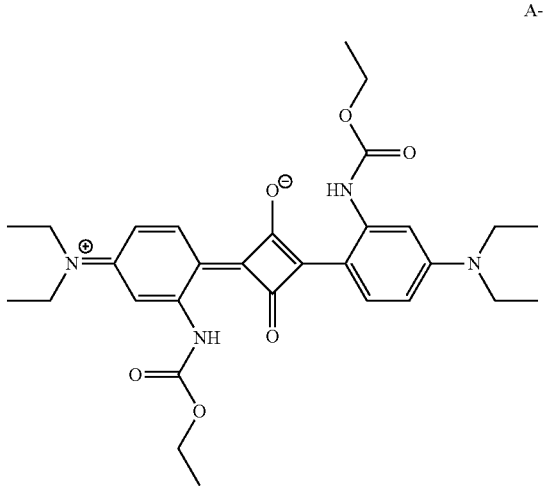
A-35
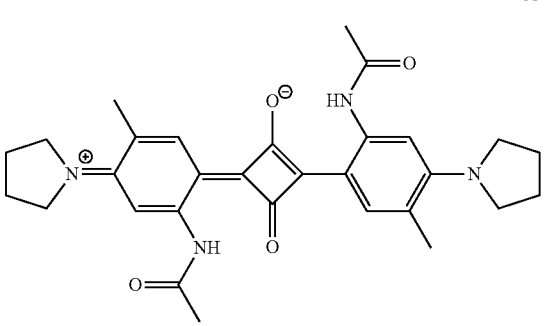

A-36
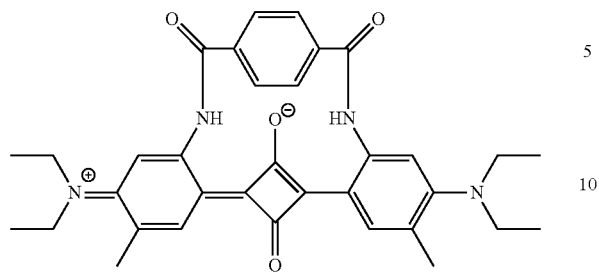
A-37
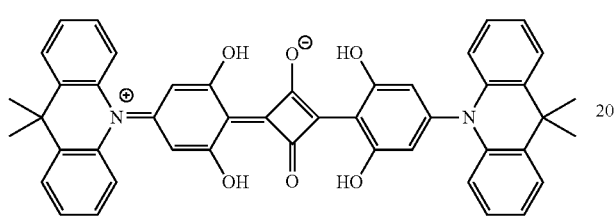
A-38
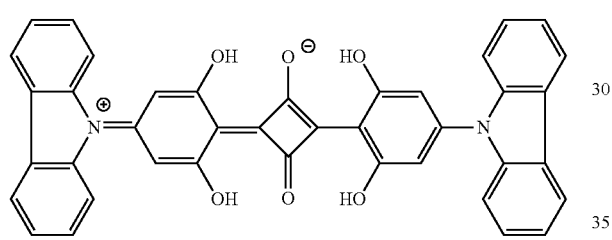
A-39
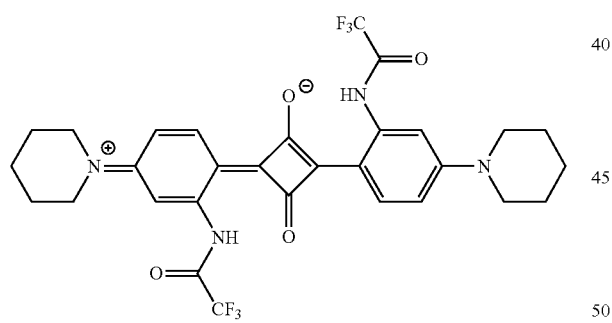
A-40
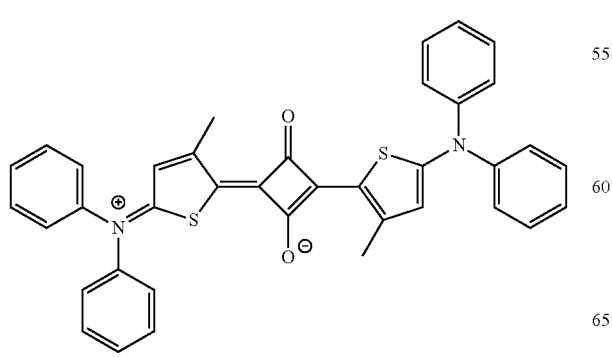
A-41
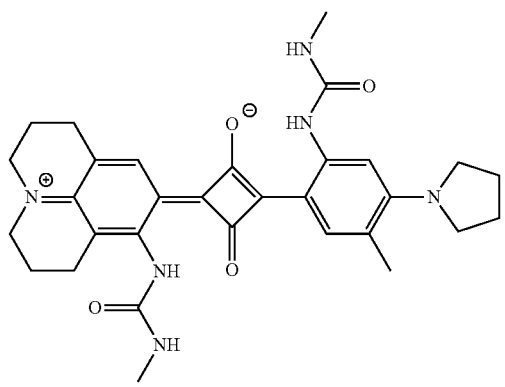
A-42
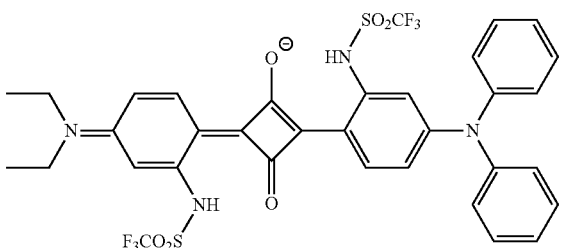
A-43
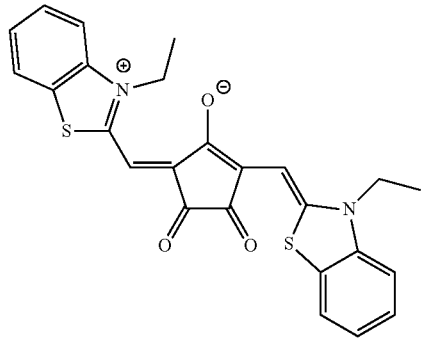
A-44
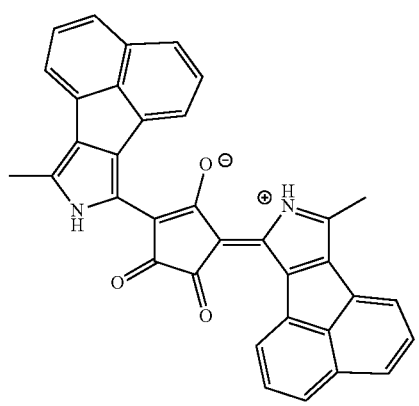

-continued
A-50
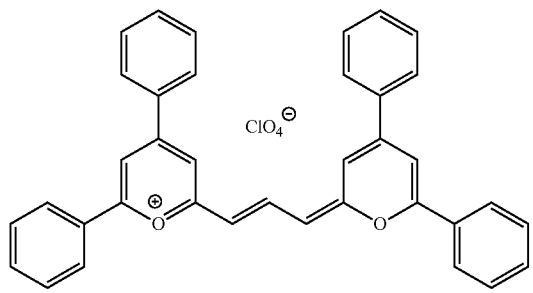
A-51
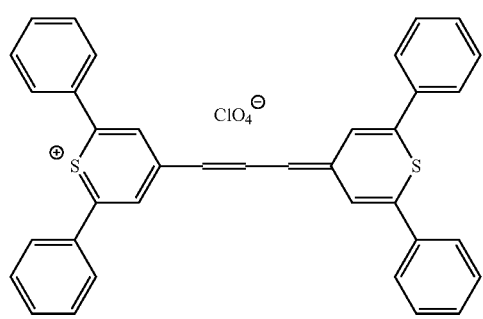
A-52
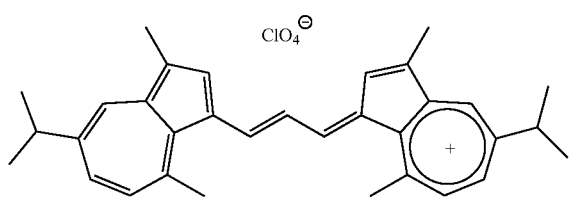
A-53
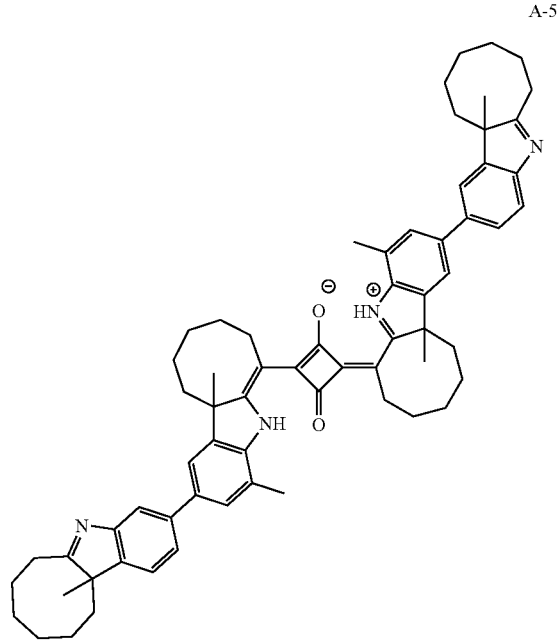
-continued
A-54
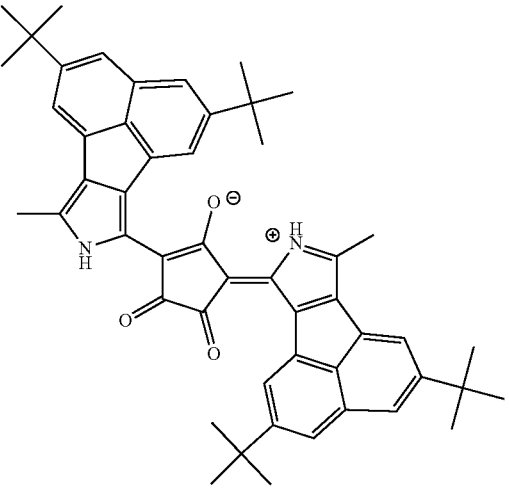
AR-1
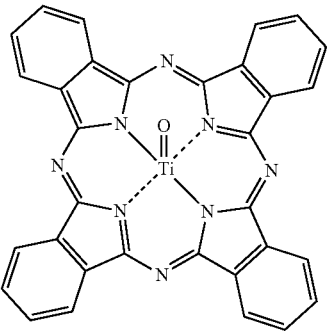
(Pigment Derivative)
B1 and B2: compounds having the following structures
(B1)
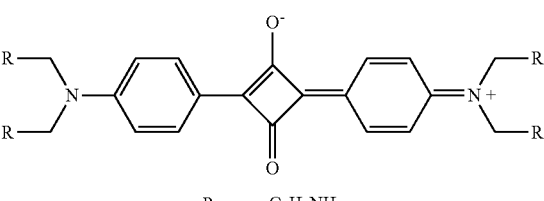
R: —C$_4$H$_8$NH$_2$
(B2)
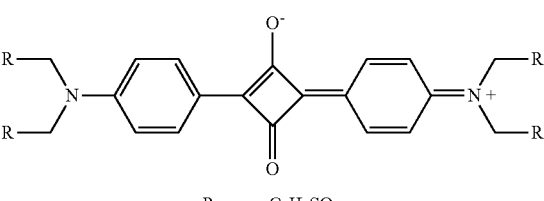
R: —C$_4$H$_8$SO$_3$
Ba-2, Ba-5, Ba-6, Ba-7, Ba-8, Ba-9, Bb-4, Bb-8, Bb-10, Bb-12, Bb-15, Bb-16, Bb-18, Be-7, Bf-1, Bf-2, Bf-4, Bh-1, Bh-2, and Bg-1: compounds Ba-2, Ba-6, Ba-5, Ba-7, Ba-8, Ba-9, Bb-4, Bb-8, Bb-10, Bb-12, Bb-15, Bb-16, Bb-18, Be-7, Bf-1, Bf-2, Bf-4, Bh-1, Bh-2, and Bg-1 having the structures shown in the above-described specific example of dispersion aid (Dispersant)

C1: a resin having the following structure (a numerical value added to a main chain represents a molar ratio, and a numerical value added to a side chain represents the number of repeating units; Mw=20000, acid value=30 mgKOH/g)

C2: a resin having the following structure (a numerical value added to a main chain represents a molar ratio, and a numerical value added to a side chain represents the number of repeating units; Mw=20000, acid value=105 mgKOH/g)

C3: a block resin having the following structure (amine value=90 mgKOH/g, quaternary ammonium salt value=30 mgKOH/g, weight-average molecular weight=9800) a numerical value added to a main chain represents a molar ratio of a repeating unit.

C4: a resin having the following structure (a numerical value added to a main chain represents a molar ratio, and a numerical value added to a side chain represents the number of repeating units; Mw=22,900, acid value=32.3 mgKOH/g, amine value-45.0 mgKOH/g)

C5: a resin having the following structure (acid value=87.0 mgKOH/g, weight-average molecular weight=18,000) a numerical value added to a main chain represents a molar ratio of a repeating unit and a numerical value added to a side chain represents the number of repeating units.

C6: a resin having the following structure (acid value=85.0 mgKOH/g, weight-average molecular weight=22,000) a numerical value added to a main chain represents a molar ratio of a repeating unit and a numerical value added to a side chain represents the number of repeating units.

C7: a resin having the following structure (acid value=43 mgKOH/g, weight-average molecular weight=9000) a numerical value added to a side chain represents a molar ratio of a repeating unit.

C8: a resin having the following structure (a numerical value added to a main chain represents a molar ratio, and a numerical value added to a side chain represents the number of repeating units; Mw=38,000, acid value=99.1 mgKOH/g)

C9: a resin having the following structure (a numerical value added to a main chain represents a molar ratio, and a numerical value added to a side chain represents the number of repeating units; Mw=21,000, acid value=36.0 mgKOH/g, amine value=47.0 mgKOH/g)

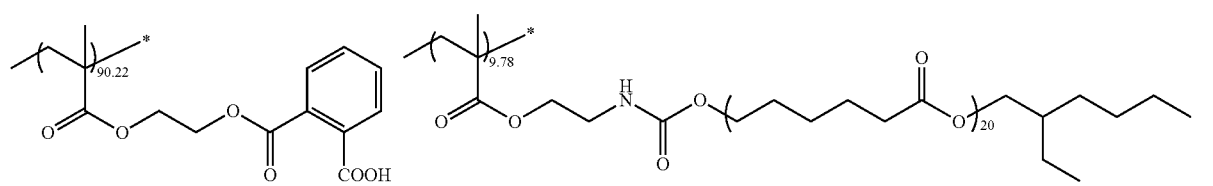

(C1)

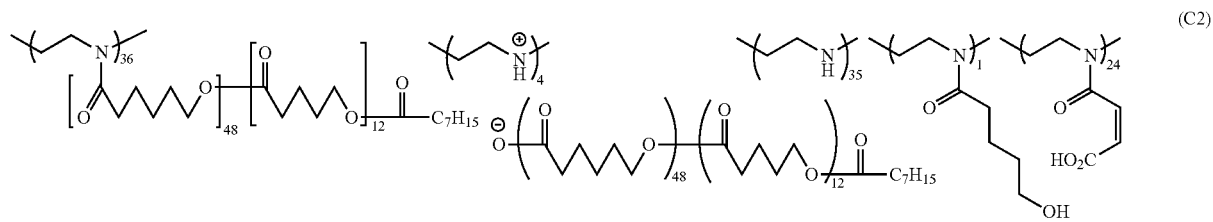

(C2)

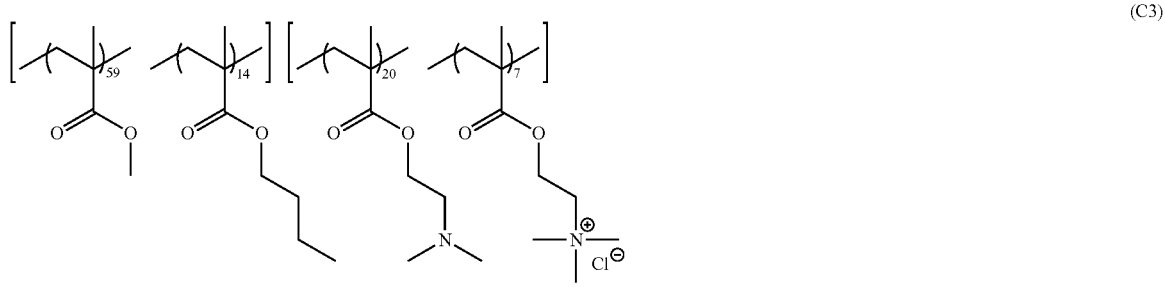

(C3)

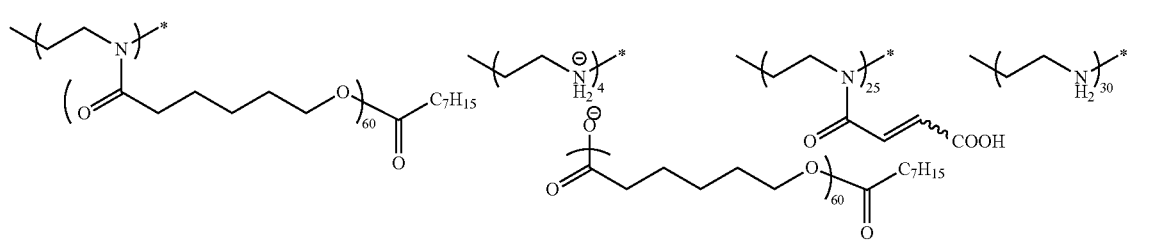

(C4)

-continued
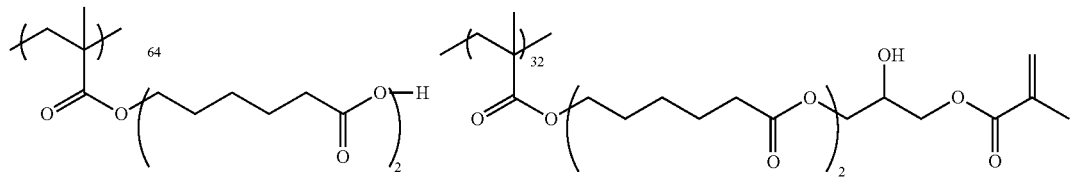
(C5)
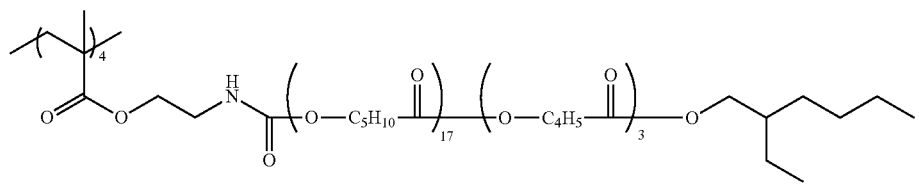
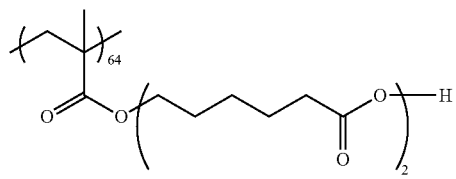
(C6)
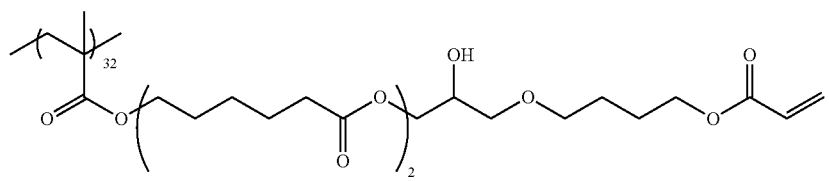
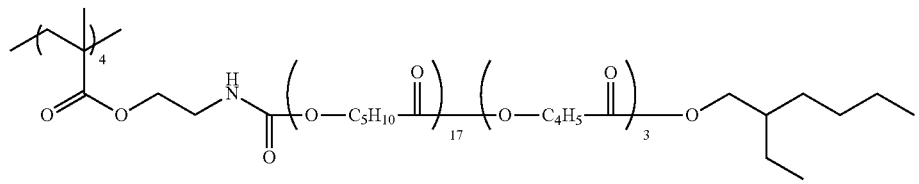
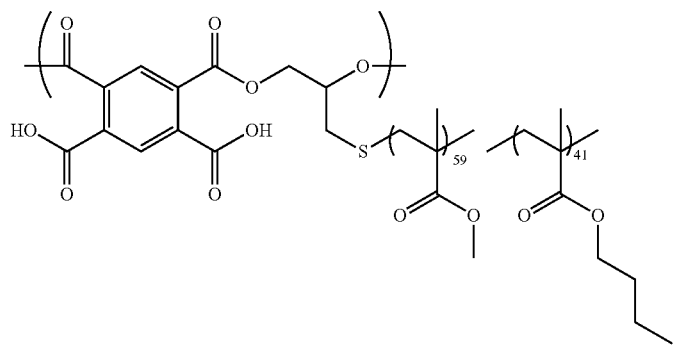
(C7)
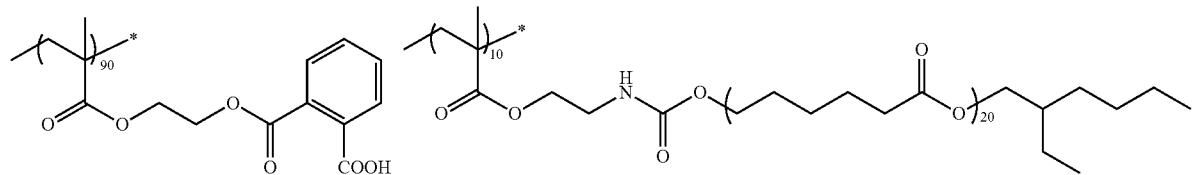
(C8)

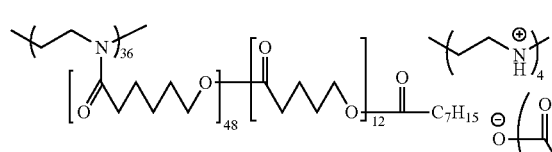
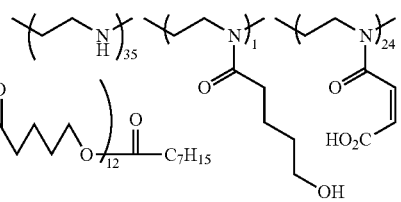

(C9)

D1: a resin having the following structure (a numerical value added to a main chain represents a molar ratio; Mw=40,000, acid value=100 mgKOH/g)

D2: a resin having the following structure (a numerical value added to a main chain represents a molar ratio; Mw=10,000, acid value=70 mgKOH/g)

D3: a resin having the following structure (a numerical value added to a main chain represents a molar ratio; Mw=10,000, acid value=70 mgKOH/g)

D4: a resin having the following structure (acid value=110 mgKOH/g, weight-average molecular weight=10,000) a numerical value added to a main chain represents a molar ratio of a repeating unit.

D5: a resin having the following structure (acid value=184 mgKOH/g, weight-average molecular weight=9700) a numerical value added to a main chain represents a molar ratio of a repeating unit.

(D1)
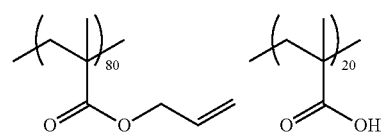

(D2)
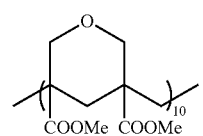
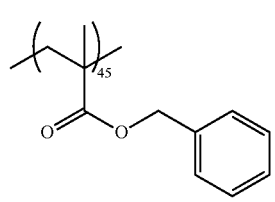

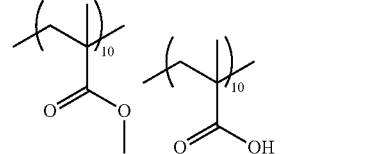

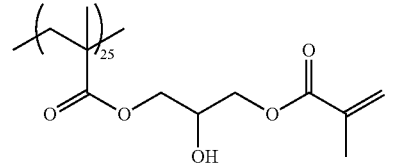

(D3)
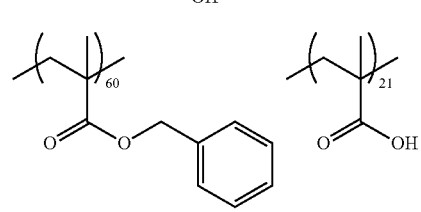

-continued

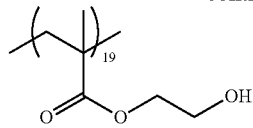

(D4)
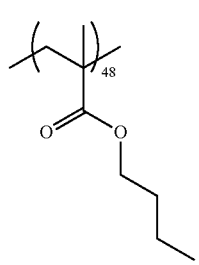
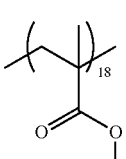
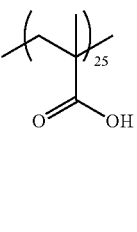

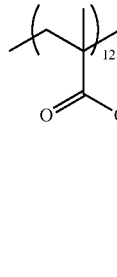

(D5)
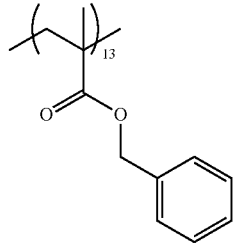
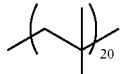

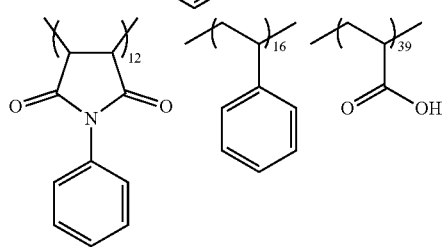

(Polymerizable Monomer)

M1: a compound having the following structure (C=C value: 11.4 mmol/g)

M2: a compound having the following structure (C=C value: 10.1 mmol/g, hydroxyl number: 3.4 mmol/g)

M3: a compound having the following structure (C=C value: 7.54 mmol/g, acid value: 2.5 mmol/g)

M4: a mixture of compounds having the following structures (a molar ratio between a left and a right compound is 7:3)

M5: a mixture of compounds having the following structures (containing 55 to 63 mol % of a left compound)

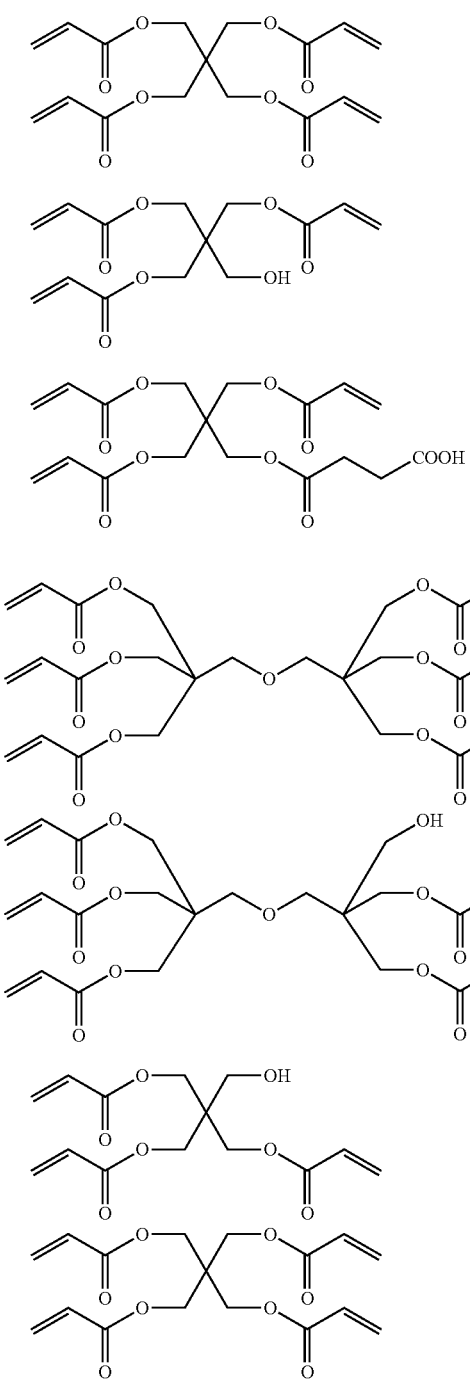

(Radical Polymerization Initiator)
F1: IRGACURE OXE01 (manufactured by BASF SE)
F2: IRGACURE 369 (manufactured by BASF SE)
F3: IRGACURE OXE03 (manufactured by BASF SE)
F4: IRGACURE OXE02 (manufactured by BASF SE)

(Ultraviolet Absorber)
UV1 and UV2: compounds having the following structures

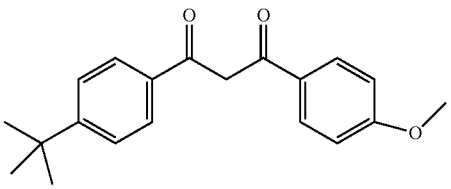

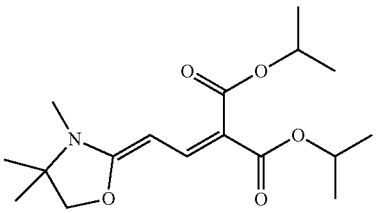

(Surfactant)
W1: the following mixture (Mw=14000, a fluorine surfactant; in the formula, "%" representing the proportion of a repeating unit is mass %)

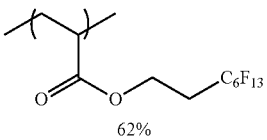

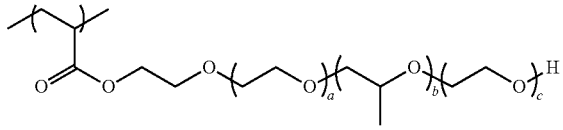

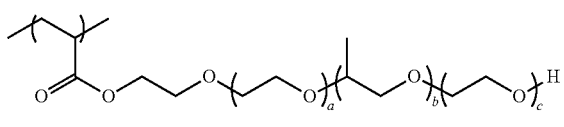

38%
a + c = 14
b = 17

(Polymerization Inhibitor)
H1: p-methoxyphenol
(Antioxidant)
I1: ADEKA STAB AO-80 (manufactured by Adeka Corporation)
(Solvent)
S1: propylene glycol monomethyl ether acetate (PG-MEA)
S2: cyclohexanone
S3: butyl acetate
S4: ethyl lactate (EL)
S5: propylene glycol monomethyl ether (PGME)
S6: methyl acetate
S7: cycloheptanone
<Evaluation>
[Evaluation of Dispersion Stability]
The viscosity of the composition immediately after formation was measured. The composition of which the viscosity was measured was stored in a constant-temperature tank at 45° C. for 72 hours, and then the viscosity thereof was measured. The viscosity was measured by adjusting the temperature of the composition to 23° C. The thickening rate was obtained based on the following equation to evaluate dispersion stability.

Thickening Rate (%)=((Viscosity of Composition stored in Constant-Temperature Tank at 45° C. for 72 hours/Viscosity of Composition immediately after Formation)−1)×100

5: the thickening rate of the composition was 5% or lower.
4: the thickening rate of the composition was higher than 5% and 7% or lower.
3: the thickening rate of the composition was higher than 7% and 10% or lower.
2: the thickening rate of the composition was higher than 10% and 15% or lower.
1: the thickening rate of the composition was 15% or higher.

[Evaluation of Defects]

Each of the compositions immediately after formation was applied to an 8-inch (20.32 cm) silicon wafer by CLEAN TRACK ACT-8 (manufactured by Tokyo Electron Limited), and then pre-baked at 100° C. for 120 seconds to forma film having a film thickness of 0.8 μm. The silicon wafer on which the film was formed is inspected by a defect inspection apparatus ComPLUS3 manufactured by Applied Materials, Inc. to detect a defective portion, and the number of defects having a size of 1 μm or more in 2462 cm$^2$ was extracted.

5: 5 or less
4: more than 5 and 20 or less
3: more than 20 and 50 or less
2: more than 50 and 100 or less
1: more than 100

[Evaluation of Visible Transparency]

Each of the compositions was applied to a glass substrate using a spin coater (manufactured by Mikasa Co., Ltd.) such that the film thickness after pre-baking was 0.8 μm. As a result, a coating film was formed. Next, the coating film was heated (pre-baked) using a hot plate at 100° C. for 120 seconds, the entire surface of the coating film was exposed using an i-ray stepper exposure device FPA-3000 i5+ (manufactured by Canon Corporation) at an exposure dose of 1000 mJ/cm$^2$, and then was heated (post-baked) again using a hot plate at 200° C. for 300 seconds. As a result, a film was obtained. Regarding the obtained film, the absorbance of light in a wavelength range of 400 to 1300 nm was measured, a ratio $A_1/A_2$ of a maximum value $A_1$ of an absorbance in a wavelength range of 400 to 600 nm to an absorbance $A_2$ at an maximum absorption wavelength in a range of 700 to 1300 nm was calculated, and then the spectral performance was evaluated based on the following standards.

A: $A_1/A_2$ was 0.3 or lower
B: $A_1/A_2$ was higher than 0.3

TABLE 14

| Name | Evaluation result | | |
|---|---|---|---|
| | Dispersion stability | Defects | Visible transparency |
| Example 1 | 3 | 3 | A |
| Example 2 | 5 | 4 | A |
| Example 3 | 4 | 3 | A |
| Example 4 | 5 | 5 | A |
| Example 5 | 5 | 4 | A |
| Example 6 | 4 | 3 | A |
| Example 7 | 5 | 5 | A |
| Example 8 | 3 | 3 | A |
| Example 9 | 5 | 4 | A |
| Example 10 | 5 | 4 | A |
| Example 11 | 5 | 4 | A |
| Example 12 | 3 | 3 | A |
| Example 13 | 5 | 4 | A |
| Example 14 | 5 | 4 | A |
| Example 15 | 5 | 4 | A |
| Example 16 | 5 | 5 | A |
| Example 17 | 4 | 3 | A |
| Example 18 | 4 | 3 | A |
| Example 19 | 5 | 4 | A |
| Example 20 | 3 | 3 | A |
| Example 21 | 5 | 5 | A |
| Example 22 | 5 | 4 | A |
| Example 23 | 4 | 3 | A |
| Example 24 | 4 | 3 | A |
| Example 25 | 3 | 3 | A |
| Example 26 | 3 | 3 | A |
| Example 27 | 4 | 3 | A |
| Example 28 | 3 | 3 | A |
| Example 29 | 4 | 3 | A |
| Example 30 | 3 | 3 | A |
| Example 31 | 4 | 3 | A |
| Example 32 | 4 | 3 | A |
| Example 33 | 5 | 4 | A |
| Example 34 | 5 | 5 | A |
| Example 35 | 3 | 3 | A |
| Example 36 | 4 | 3 | A |
| Example 37 | 4 | 3 | A |
| Example 38 | 4 | 3 | A |
| Example 39 | 5 | 3 | A |
| Example 40 | 5 | 3 | A |
| Example 41 | 4 | 3 | A |
| Example 42 | 4 | 3 | A |
| Example 43 | 4 | 3 | A |
| Example 44 | 4 | 3 | A |
| Example 45 | 4 | 3 | A |
| Example 46 | 4 | 3 | A |
| Example 47 | 4 | 3 | A |
| Example 48 | 4 | 3 | A |
| Example 49 | 4 | 3 | A |
| Example 50 | 4 | 3 | A |
| Example 51 | 4 | 3 | A |
| Example 52 | 4 | 3 | A |
| Example 53 | 4 | 3 | A |
| Example 54 | 4 | 3 | A |
| Example 55 | 4 | 3 | A |
| Comparative Example 1 | 2 | 4 | B |
| Comparative Example 2 | 1 | 1 | A |
| Comparative Example 3 | 1 | 3 | B |

TABLE 15

| Name | Evaluation result | | |
|---|---|---|---|
| | Dispersion stability | Defects | Visible transparency |
| Example 101 | 4 | 4 | B |
| Example 102 | 4 | 5 | A |
| Example 103 | 4 | 5 | A |
| Example 104 | 5 | 5 | A |
| Example 105 | 5 | 5 | A |
| Example 106 | 5 | 5 | A |
| Example 107 | 4 | 5 | B |

TABLE 15-continued

| Name | Evaluation result | | |
|---|---|---|---|
| | Dispersion stability | Defects | Visible transparency |
| Example 108 | 4 | 5 | B |
| Example 109 | 4 | 5 | B |
| Example 110 | 5 | 5 | A |
| Example 111 | 4 | 4 | A |
| Example 112 | 4 | 4 | B |
| Example 113 | 4 | 4 | A |
| Example 114 | 5 | 4 | A |
| Example 115 | 5 | 5 | A |
| Example 116 | 4 | 4 | A |
| Example 117 | 4 | 4 | A |
| Example 118 | 4 | 4 | B |
| Example 119 | 4 | 4 | B |
| Example 120 | 4 | 4 | A |
| Example 121 | 5 | 5 | B |
| Example 122 | 5 | 5 | A |
| Example 123 | 4 | 4 | A |
| Example 124 | 5 | 5 | A |
| Example 125 | 5 | 5 | A |
| Example 126 | 5 | 5 | A |
| Example 127 | 5 | 5 | A |
| Example 128 | 4 | 4 | A |
| Example 129 | 4 | 4 | A |
| Example 130 | 4 | 4 | A |
| Example 131 | 5 | 5 | A |
| Example 132 | 5 | 5 | A |
| Example 133 | 5 | 5 | A |
| Example 134 | 5 | 5 | A |
| Example 201 | 4 | 4 | A |

As shown in the above tables, the compositions of the examples had good dispersion stability and could form a film in which defects are suppressed. In addition, the films formed using the compositions of Examples 1 to 55, 101 to 134, and 201 had excellent visible transparency.

Test Example 2

Compositions of Examples 1 to 55, 101 to 134, and 201 were applied to a silicon wafer using a spin coating method such that the thickness of the formed film was 1.0 μm. Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm$^2$.

Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, a 2 μm×2 μm Bayer pattern (near infrared cut filter) was formed.

Next, a Red composition was applied to the Bayer pattern of the near infrared cut filter using a spin coating method such that the thickness of the formed film was 1.0 sm. Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm$^2$. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the near infrared cut filter. Likewise, a Green composition and a Blue composition were sequentially patterned to form red, green, and blue color patterns.

Next, the composition for forming an infrared transmitting filter was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm$^2$. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the infrared transmitting filter was patterned on a portion where the Bayer pattern of the near infrared cut filter was not formed. This filter was incorporated into a solid-state imaging element using a known method.

The obtained solid-state imaging element was irradiated with light emitted from an infrared light emitting diode (infrared LED) as a light source in a low-illuminance environment (0.001 Lux) to acquire images. Next, the imaging performance of the solid-state imaging element was evaluated. The subject was able to be clearly recognized on the image. In addition, incidence angle dependence was good.

The Red composition, the Green composition, the Blue composition, and the composition for forming an infrared transmitting filter used in Test Example 2 are as follows.

(Red Composition)

The following components were mixed and stirred, and the obtained mixture was filtered through a nylon filter (manufactured by Pall Corporation) having a pore size of 0.45 μm to prepare a Red composition.

| | |
|---|---|
| Red Pigment Dispersion Liquid | 51.7 parts by mass |
| Resin 4 | 0.6 parts by mass |
| Polymerizable Monomer 4 | 0.6 parts by mass |
| Radical Polymerization Initiator 1 | 0.4 parts by mass |
| Surfactant 1 | 4.2 parts by mass |
| Ultraviolet absorber (UV-503, manufactured by Daito Chemical Co., Ltd.) | 0.3 parts by mass |
| Propylene glycol monomethyl ether acetate (PGMEA) | 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion Liquid | 73.7 parts by mass |
| Resin 4 | 0.3 parts by mass |
| Polymerizable Monomer 1 | 1.2 parts by mass |
| Radical Polymerization Initiator 1 | 0.6 parts by mass |
| Surfactant 1 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion Liquid | 44.9 parts by mass |
| Resin 4 | 2.1 parts by mass |
| Polymerizable Monomer 1 | 1.5 parts by mass |
| Polymerizable Monomer 4 | 0.7 parts by mass |
| Radical Polymerization Initiator 1 | 0.8 parts by mass |
| Surfactant 1 | 4.2 parts by mass |
| Ultraviolet absorber (UV-503, manufactured by Daito Chemical Co., Ltd.) | 0.3 parts by mass |
| PGMEA | 45.8 parts by mass |

(Composition for Forming Infrared Transmitting Filter)

The following components were mixed and stirred, and the obtained mixture was filtered through a nylon filter (manufactured by Pall Corporation) having a pore size of 0.45 μm to prepare a composition for forming an infrared transmitting filter.

| | |
|---|---|
| Pigment Dispersion Liquid 1-1 | 46.5 parts by mass |
| Pigment Dispersion Liquid 1-2 | 37.1 parts by mass |
| Polymerizable Monomer 5 | 1.8 parts by mass |
| Resin 4 | 1.1 parts by mass |
| Radical Polymerization Initiator 2 | 0.9 parts by mass |
| Surfactant 1 | 4.2 parts by mass |
| Polymerization Inhibitor (p-methoxyphenol) | 0.001 parts by mass |
| Silane Coupling Agent | 0.6 parts by mass |
| PGMEA | 7.8 parts by mass |

Raw materials used in the Red composition, the Green composition, the Blue composition, and the composition for forming an infrared transmitting filter are as follows.

Red Pigment Dispersion Liquid

A mixed solution consisting of 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours. As a result, a pigment dispersion liquid was prepared.

Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersing treatment was repeated 10 times. As a result, a Red pigment dispersion liquid was obtained.

Green Pigment Dispersion Liquid

A mixed solution consisting of 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads; diameter: 0.3 mm) for 3 hours. As a result, a pigment dispersion liquid was prepared.

Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersing treatment was repeated 10 times. As a result, a Green pigment dispersion liquid was obtained.

Blue Pigment Dispersion Liquid

A mixed solution consisting of 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA was mixed and dispersed using a beads mill (zirconia beads; diameter: 0.3 mm) for 3 hours. As a result, a pigment dispersion liquid was prepared.

Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersing treatment was repeated 10 times. As a result, a Blue pigment dispersion liquid was obtained.

Pigment Dispersion Liquid 1-1

A mixed solution having the composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion liquid 1-1 was prepared.

| | |
|---|---|
| Mixed pigment consisting of a red pigment (C.I. Pigment Red 254) and a yellow pigment (C.I. Pigment Yellow 139) | 11.8 parts by mass |
| Resin (Disperbyk-111, manufactured by BYK Chemie) | 9.1 parts by mass |
| PGMEA | 79.1 parts by mass |

Pigment Dispersion Liquid 1-2

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion liquid 1-2 was prepared.

| | |
|---|---|
| Mixed pigment consisting of a blue pigment (C.I. Pigment Blue 15:6) and a violet pigment (C.I. Pigment Violet 23) | 12.6 parts by mass |
| Resin (Disperbyk-111, manufactured by BYK Chemie) | 2.0 parts by mass |
| Resin D3 described above | 3.3 parts by mass |
| Cyclohexanone | 31.2 parts by mass |
| PGMEA | 50.9 parts by mass |

Polymerizable Monomer 1: KAYARAD DPHA (manufactured by Nippon Kayaku Co., Ltd.)

Polymerizable Monomer 4: a compound having the following structure

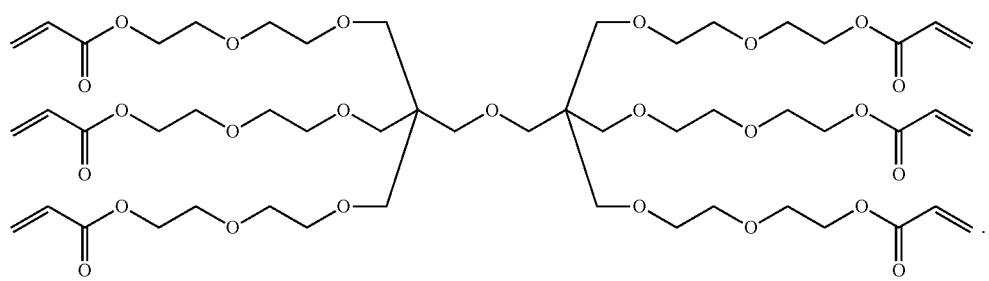 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable Monomer 5: a compound having the following structure (a mixture in which a molar ratio between a left compound and a right compound is 7:3)

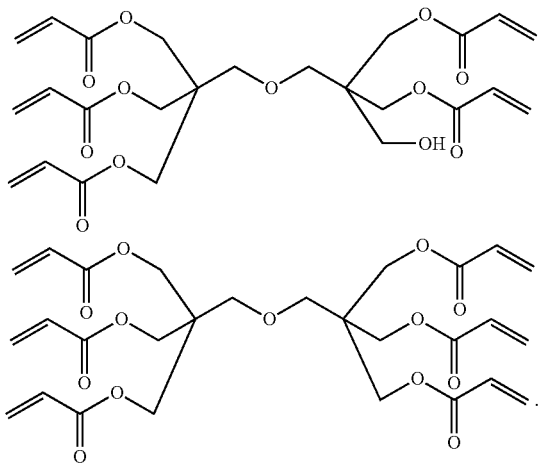

Resin 4: resin D2 described above
Radical Polymerization Initiator 1: IRGACURE-OXE 01 (manufactured by BASF SE)
Radical Polymerization Initiator 2: a compound having the following structure

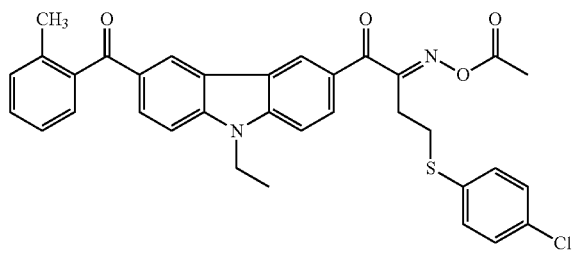 [SMILES: CCn1c2ccc(C(=O)/C(CCSc3ccc(Cl)cc3)=N/OC(C)=O)cc2c2cc(C(=O)c3ccccc3C)ccc21]

Surfactant 1: a 1 mass % PGMEA solution of the following mixture (Mw: 14000; in the following formula, "%" representing the proportion of a repeating unit is mass %)

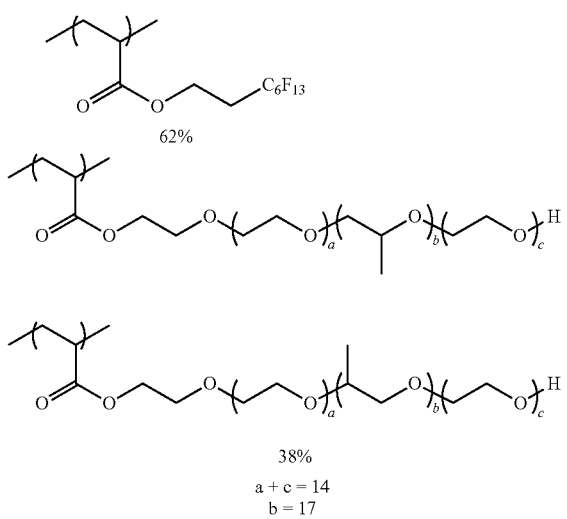

Silane coupling agent: a compound having the following structure; in the following structural formula, Et represents an ethyl group.

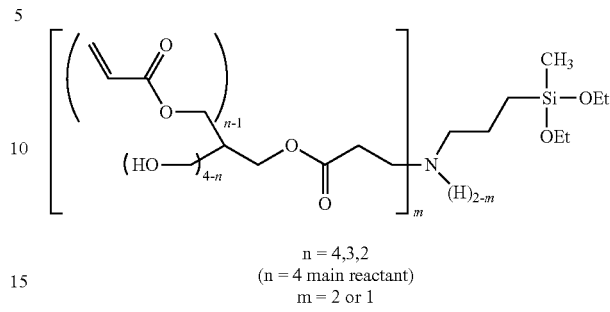

n = 4,3,2
(n = 4 main reactant)
m = 2 or 1
(m = 2 main product)

EXPLANATION OF REFERENCES

110: solid-state imaging element
111: near infrared cut filter
112: color filter
114: infrared transmitting filter
115: microlens
116: planarizing layer

What is claimed is:
1. A composition comprising:
a near infrared absorbing pigment; and
a solvent,
wherein the near infrared absorbing pigment is at least one selected from a colorant compound which has a cation and an anion in the same molecule, a colorant compound which is a salt of a cationic chromophore and a counter anion, and a colorant compound which is a salt of an anionic chromophore and a counter cation,
a D50 particle size in which a cumulative volume in a particle size distribution of particle sizes of the near infrared absorbing pigment is 50% is 100 nm or lower,
the near infrared absorbing pigment and the solvent satisfy the following expression (1),

$$|d1-d2| \geq 0.3 \text{ MPa}^{0.5} \tag{1}$$

d1 is a d value of a Hansen solubility parameter of the near infrared absorbing pigment,
d2 is a d value of a Hansen solubility parameter of the solvent included in the composition, and
in a case where the composition includes two or more kinds of solvents, d2 is a mass-average value of d values of Hansen solubility parameters of the two or more kinds of solvents.
2. The composition according to claim 1,
wherein the near infrared absorbing pigment is at least one selected from a squarylium compound, a cyanine compound, a croconium compound, and an iminium compound.
3. The composition according to claim 1,
wherein the near infrared absorbing pigment satisfies the following expression (D1), $$D90 \text{ particle size}/D50 \text{ particle size} \leq 4.0 \tag{D1}$$

a D90 particle size is a particle size in which a cumulative volume in the particle size distribution of the particle sizes of the near infrared absorbing pigment is 90%, and the D50 particle size is a particle size in which a cumulative volume in the particle size distribution of the particle sizes of the near infrared absorbing pigment is 50%.

4. The composition according to claim 1,
wherein the near infrared absorbing pigment has a maximum absorption wavelength in a range of 700 to 1800 nm.

5. The composition according to claim 1, further comprising:
a resin.

6. The composition according to claim 5, further comprising:
a dispersion aid.

7. The composition according to claim 6,
wherein the near infrared absorbing pigment includes an aromatic ring, and
the dispersion aid has an aromatic ring of the same structure as the aromatic ring included in the near infrared absorbing pigment.

8. The composition according to claim 6,
wherein an absolute value of a difference between a maximum absorption wavelength of the dispersion aid and a maximum absorption wavelength of the near infrared absorbing pigment is greater than 200 nm.

9. The composition according to claim 6,
wherein the near infrared absorbing pigment is a squarylium compound having a partial structure represented by Formula (S1), and the dispersion aid is a compound including a structural moiety which is included in a group bonding to *1 position of Formula (S1) or a group bonding to *2 position of Formula (S1) and which is conjugated with the partial structure represented by Formula (S1) of the squarylium compound as the near infrared absorbing pigment, or
the near infrared absorbing pigment is a croconium compound having a partial structure represented by Formula (C1), and the dispersion aid is a compound including a structural moiety which is included in a group bonding to *3 position of Formula (C1) or a group bonding to *4 position of Formula (C1) and which is conjugated with the partial structure represented by Formula (C1) of the croconium compound as the near infrared absorbing pigment,

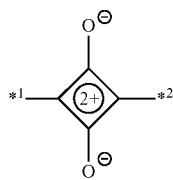
(S1)

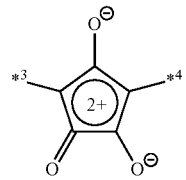
(C1)

in the formulae, *1 to *4 respectively represent a direct bond.

10. The composition according to claim 9,
wherein the near infrared absorbing pigment is the squarylium compound having the partial structure represented by Formula (S1), at least one of the group bonding to *1 position of Formula (S1) or the group bonding to *2 position of Formula (S1) includes a structure in which two or more rings are fused, and the dispersion aid is a compound including the structure of the near infrared absorbing pigment in which two or more rings are fused, or
the near infrared absorbing pigment is the croconium compound having the partial structure represented by Formula (C1), at least one of the group bonding to *3 position of Formula (C1) or the group bonding to *4 position of Formula (C1) includes a structure in which two or more rings are fused, and the dispersion aid is a compound including the structure of the near infrared absorbing pigment in which two or more rings are fused.

11. The composition according to claim 10,
wherein the structure in which two or more rings are fused is a fused ring including one or more of at least one ring selected from a benzene ring, an imidazole ring, an oxazole ring, a thiazole ring, a pyridine ring, and a pyrazine ring.

12. The composition according to claim 10,
wherein the structure in which two or more rings are fused is a fused ring including an indolenine ring, a fluorene ring, or a carbazole ring.

13. The composition according to claim 1, further comprising:
a polymerizable monomer.

14. The composition according to claim 13,
wherein the polymerizable monomer includes a compound which has three or more groups having an ethylenically unsaturated bond.

15. A film obtained from the composition according to claim 1.

16. A near infrared cut filter comprising:
the film according to claim 15.

17. A solid-state imaging element comprising:
the film according to claim 15.

18. An image display device comprising:
the film according to claim 15.

19. An infrared sensor comprising:
the film according to claim 15.

* * * * *